United States Patent
Suzaki

(10) Patent No.: US 11,839,150 B2
(45) Date of Patent: Dec. 5, 2023

(54) ORGANIC ELECTROLUMINESCENCE DEVICE AND CONDENSED CYCLIC COMPOUND FOR ORGANIC ELECTROLUMINESCENCE DEVICE

(71) Applicant: Samsung Display Co., Ltd., Yongin-si (KR)

(72) Inventor: Yuji Suzaki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 564 days.

(21) Appl. No.: 17/029,987

(22) Filed: Sep. 23, 2020

(65) Prior Publication Data

US 2021/0305512 A1   Sep. 30, 2021

(30) Foreign Application Priority Data

Mar. 19, 2020   (KR) .................. 10-2020-0034066

(51) Int. Cl.
*H01L 51/00*   (2006.01)
*C09K 11/06*   (2006.01)
(Continued)

(52) U.S. Cl.
CPC ........... *H10K 85/631* (2023.02); *C07F 5/027* (2013.01); *C09K 11/06* (2013.01); *H10K 85/636* (2023.02);
(Continued)

(58) Field of Classification Search
None
See application file for complete search history.

(56) References Cited

U.S. PATENT DOCUMENTS

| | | | |
|---|---|---|---|
| 2019/0181350 | A1 | 6/2019 | Hatakeyama et al. |
| 2019/0207112 | A1 | 7/2019 | Hatakeyama et al. |

(Continued)

FOREIGN PATENT DOCUMENTS

| | | |
|---|---|---|
| CA | 3 017 010 A1 | 3/2019 |
| JP | 2012-507507 A | 3/2012 |

(Continued)

OTHER PUBLICATIONS

Matsui, Kohei et al., "One-Shot Multiple Borylation toward BN-Doped Nanographenes", *J. Am. Chem. Soc.* 2018, 140, pp. 1195-1198.

(Continued)

*Primary Examiner* — Jay Yang
(74) *Attorney, Agent, or Firm* — Lewis Roca Rothgerber Christie LLP

(57) ABSTRACT

An organic electroluminescence device includes a first electrode, a second electrode, and an emission layer disposed between the first electrode and the second electrode, wherein the emission layer includes a condensed cyclic compound represented by Formula 1, and the organic electroluminescence device exhibits high efficiency characteristics.

(Continued)

Formula 1

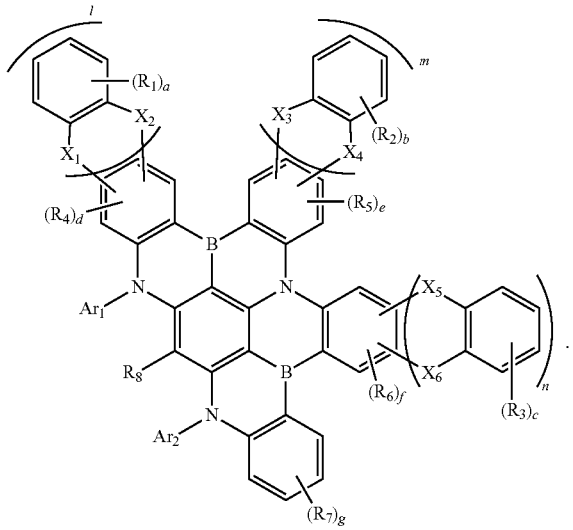

18 Claims, 2 Drawing Sheets

(51) Int. Cl.
  *C07F 5/02* (2006.01)
  *H10K 85/60* (2023.01)
  *H10K 50/11* (2023.01)
  *H10K 101/10* (2023.01)
(52) U.S. Cl.
  CPC .......... *C09K 2211/1007* (2013.01); *C09K 2211/1018* (2013.01); *H10K 50/11* (2023.02); *H10K 85/657* (2023.02); *H10K 85/6572* (2023.02); *H10K 85/6574* (2023.02); *H10K 2101/10* (2023.02)

(56) References Cited

U.S. PATENT DOCUMENTS

| | | |
|---|---|---|
| 2019/0256538 A1 | 8/2019 | Hatakeyama et al. |
| 2020/0058885 A1 | 2/2020 | Hong et al. |
| 2020/0091431 A1 | 3/2020 | Hatakeyama et al. |

FOREIGN PATENT DOCUMENTS

| | | | |
|---|---|---|---|
| KR | 10-1955648 B1 | | 3/2019 |
| KR | 10-2019-0069295 A | | 6/2019 |
| WO | WO 2015/102118 A1 | | 7/2015 |
| WO | WO 2016/152544 A1 | | 9/2016 |
| WO | WO 2017/188111 A1 | | 11/2017 |
| WO | WO 2018/047639 A1 | | 3/2018 |
| WO | WO 2018/203666 A1 | | 11/2018 |
| WO | WO-2020/080872 A1 | * | 4/2023 |

OTHER PUBLICATIONS

Numata, Masaki et al., "High efficiency pure blue thermally activated delayed fluorescence molecules having 10H-phenoxaborin and acridan units", *Chem. Commun.*, 2015, 51, pp. 9443-9446.
Numata, Masaki et al., "Supporting Information—High efficiency pure blue thermally activated delayed fluorescence molecules having 10H-phenoxaborin and acridan units", *Chem. Commun.*, 2015, 51, pp. 1-37.
Park, In Seob et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", *Adv. Funct. Mater.* 2018, 28, 1802031, 12pp.
Park, Im Seob et al., "Supporting Information—High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", *Adv. Funct. Mater.* 2018, 28, 1802031, S1-S16, 17pp.

* cited by examiner

ORGANIC ELECTROLUMINESCENCE DEVICE AND CONDENSED CYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0034066, filed on Mar. 19, 2020, the entire content of which is hereby incorporated by reference.

BACKGROUND

One or more aspects of embodiments of the present disclosure relate to an organic electroluminescence device and a condensed cyclic compound used therein, and for example, to a condensed cyclic compound used as a luminescent material and an organic electroluminescence device including the same.

Organic electroluminescence displays are being developed as image display devices. Unlike liquid crystal display devices and/or the like, an organic electroluminescence display is a so-called self-luminescent display device, in which holes and electrons respectively injected from a first electrode and a second electrode recombine in an emission layer, so that a luminescent organic material in the emission layer can emit light to implement display.

In the application of an organic electroluminescence device to display devices, there is a desire for an organic electroluminescence device having a low driving voltage, high luminous efficiency, and/or a long service life, which demands the continuous development of materials capable of stably attaining such characteristics for an organic electroluminescence device.

Recently, in order to implement a highly efficient organic electroluminescence device, materials utilizing phosphorescence emission (utilizing triplet state energy), delayed fluorescence (utilizing triplet-triplet annihilation (TTA), in which singlet excitons are generated by collision of triplet excitons), and/or thermally activated delayed fluorescence (TADF) are being developed.

SUMMARY

One or more aspects of embodiments of the present disclosure are directed toward an organic electroluminescence device exhibiting excellent luminous efficiency.

One or more aspects of embodiments of the present disclosure are directed toward a condensed cyclic compound as a material for an organic electroluminescence device having high efficiency characteristics.

One or more example embodiments of the present disclosure provide a condensed cyclic compound represented by Formula 1:

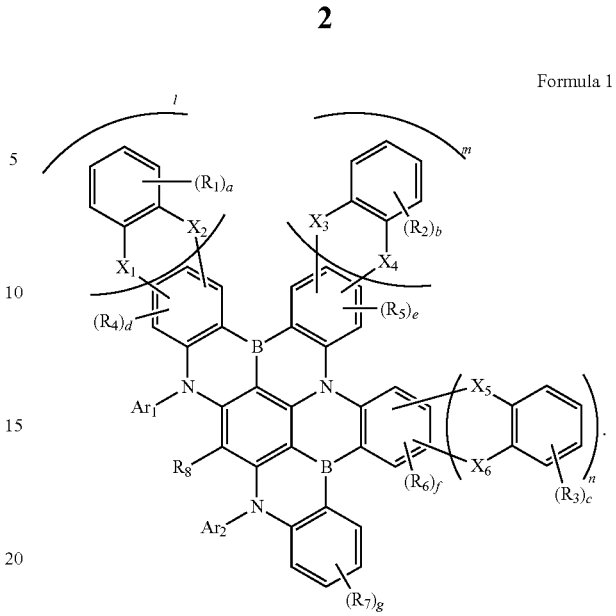

Formula 1

In Formula 1, $X_1$ to $X_6$ may each independently be a direct linkage, $BAr_3$, $NAr_4$, O, S; and $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms. l, m, and n may each independently be 0 or 1, at least one of l, m, or n may be 1; and a to g may each independently be an integer of 0 to 4 (which in some embodiments may be constrained to e.g., 0 to 2, depending on the value of l, m, and/or n). $R_1$ to $R_8$ may each independently be a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In an embodiment, Formula 1 may be represented by any one among Formula 1-1 to Formula 1-3. In Formula 1-1 to Formula 1-3, $X_1$ to $X_6$, $Ar_1$, $Ar_2$, l, m, n, a to g, and $R_1$ to $R_8$ may each independently be the same as defined in Formula 1:

Formula 1-1

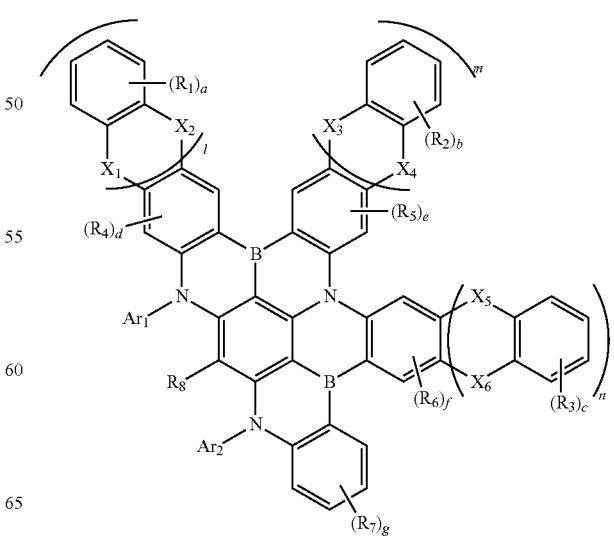

Formula 1-2
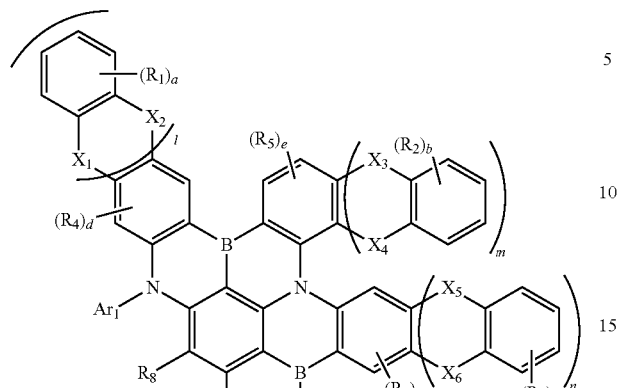
Formula 1-3
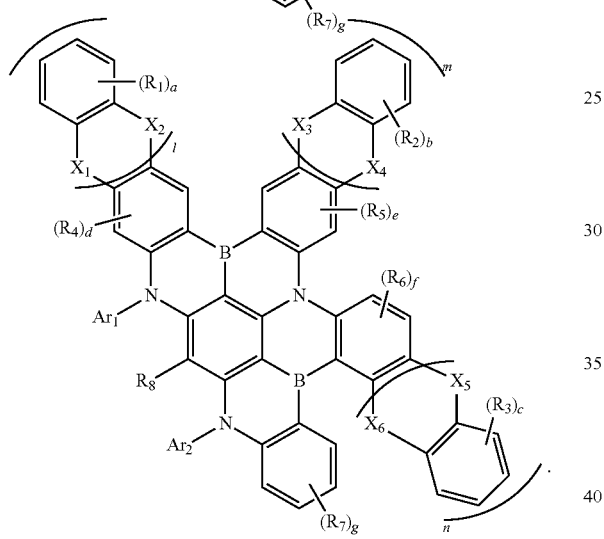
In an embodiment, Formula 1 may be represented by any one among Formula 1-A to Formula 1-E. In Formula 1-A to Formula 1-E, $X_1$ to $X_6$, $Ar_1$, $Ar_2$, a to g, and $R_1$ to $R_8$ may each independently be the same as defined in Formula 1:
Formula 1-A
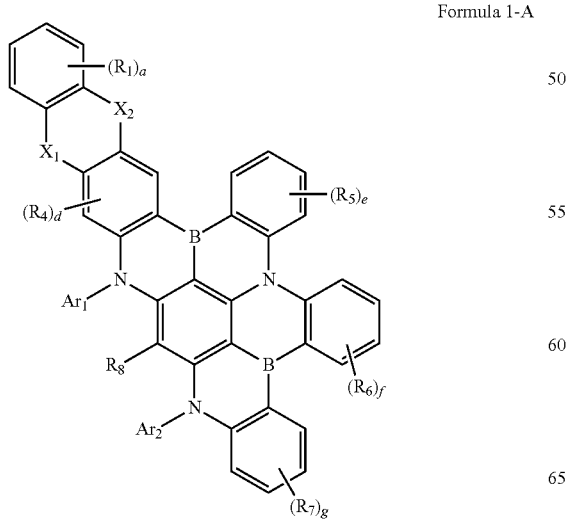
Formula 1-B
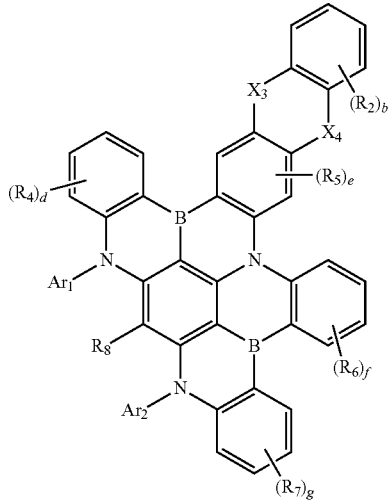
Formula 1-C
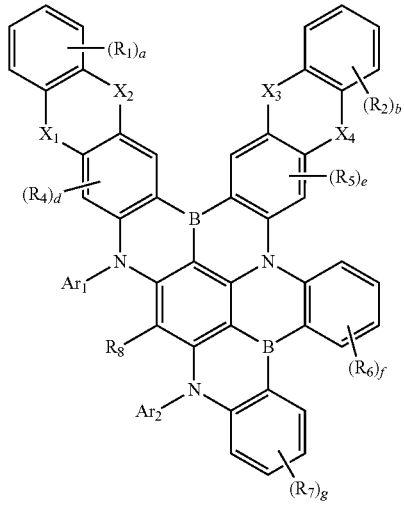
Formula 1-D
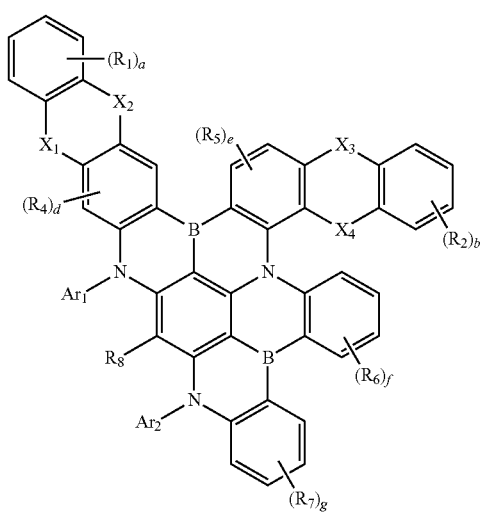

Formula 1-E

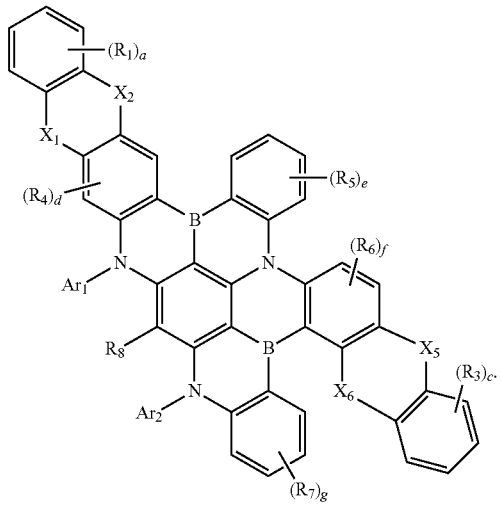

In an embodiment, $Ar_1$ to $Ar_4$ may each independently be an unsubstituted phenyl group, a phenyl group substituted with a substituted or unsubstituted alkyl group having 1 to 10 carbon atoms, or a phenyl group substituted with a deuterium atom.

In some embodiments, for example, all of $R_1$ to $R_8$ may be (e.g., simultaneously) deuterium atoms.

One or more example embodiments of the present disclosure provide a condensed cyclic compound represented by Formula 1A:

Formula 1A

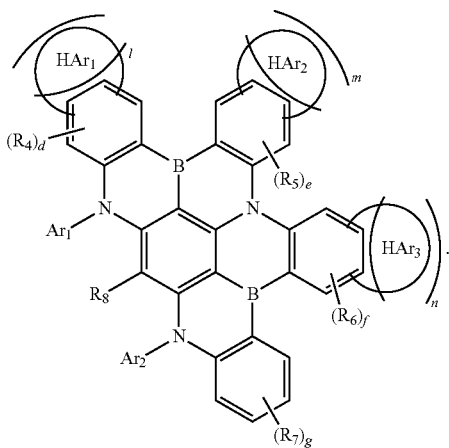

In Formula 1A, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. l, m, and n may each independently be 0 or 1, at least one of l, m, or n may be 1, and d to g may each independently be an integer of 0 to 4. $R_4$ to $R_8$ may each independently be a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, and $HAr_1$ to $HAr_3$ may each independently be represented by Formula 2:

Formula 2

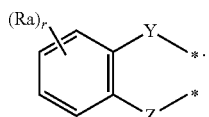

In Formula 2, Y and Z may each independently be a direct linkage, $BAr_3$, $NAr_4$, O, or S. Ara and Ara may each independently be a substituted or unsubstituted aryl group having 6 to 30 ring-forming carbon atoms, or a substituted or unsubstituted heteroaryl group having 2 to 30 ring-forming carbon atoms; r may be an integer of 0 to 4; $R_a$ may be a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. "—*" indicates a point of connection to Formula 1.

In an embodiment, Formula 1A may be represented by any one among Formula 1A-1 to Formula 1A-5. In Formulae 1A-1 to 1A-5, $Ar_1$, $Ar_2$, d to g, and $R_4$ to $R_8$ may each independently be the same as defined in Formula 1A, and $HAr_1$ to $HAr_3$ may each independently be the same as defined in Formula 2.

Formula 1A-1

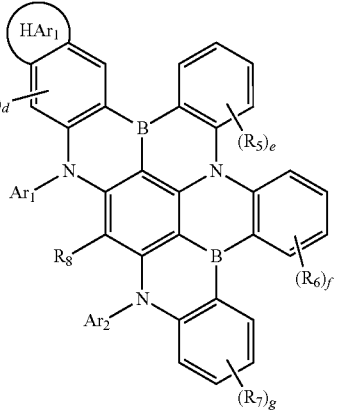

Formula 1A-2
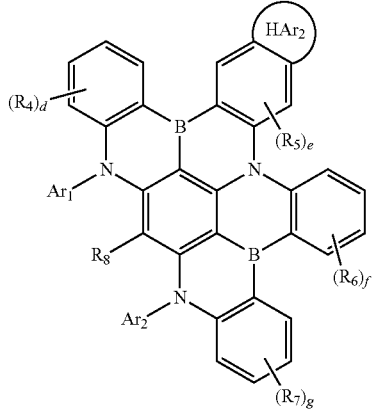
Formula 1A-3
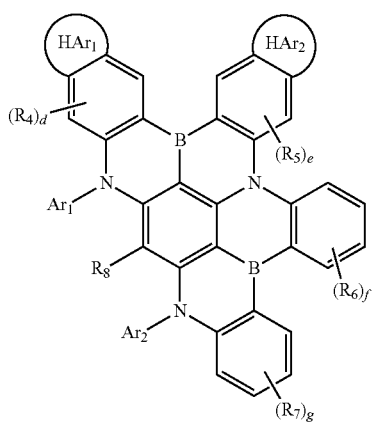
Formula 1A-4
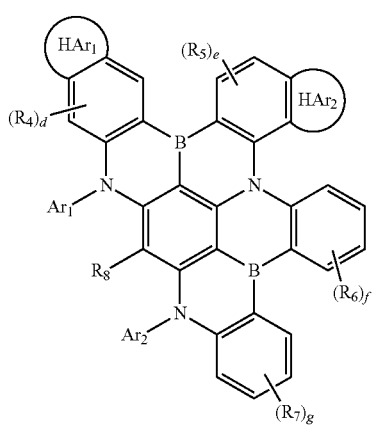
Formula 1A-5
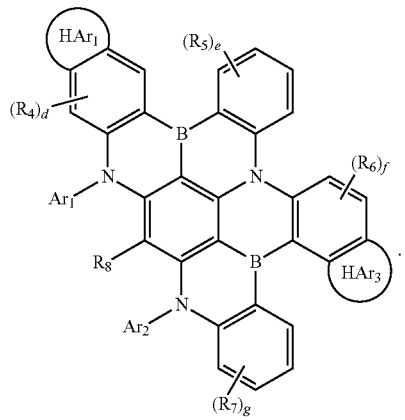
In an embodiment, Formula 2 may be represented by any one among 2-A to 2-J. In 2-A to 2-J, $Ar_3$, $Ar_4$, Ra, and r may each independently be the same as defined in Formula 2.
2-A
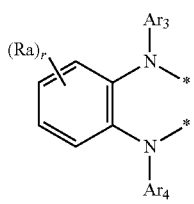
2-B
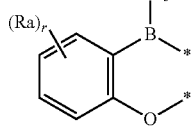
2-C
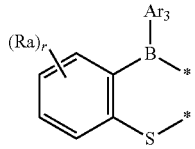
2-D
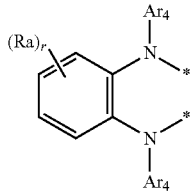
2-E
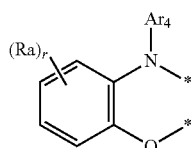
2-F
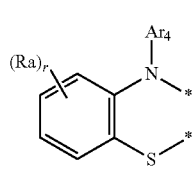

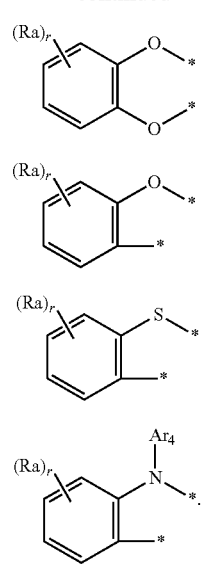

In an embodiment, $Ar_1$ to $Ar_4$ may each independently be an unsubstituted phenyl group, a phenyl group substituted with a substituted or unsubstituted alkyl group having 1 to 10 carbon atoms, or a phenyl group substituted with a deuterium atom.

One or more example embodiments of the present disclosure provide an organic electroluminescence device including: a first electrode; a second electrode disposed on the first electrode; and an emission layer between the first electrode and the second electrode and including the above-described condensed cyclic compound of an embodiment. The first electrode and the second electrode may each independently include any one selected from Ag, Mg, Cu, Al, Pt, Pd, Au, Ni, Nd, Ir, Cr, Li, Ca, LiF/Ca, LiF/Al, Mo, Ti, In, Zn, Sn, and Yb, a compound of two or more thereof, a mixture of two or more thereof, or an oxide thereof.

The emission layer may be to emit delayed fluorescence.

The emission layer may include a host and a dopant, and the dopant may include the condensed cyclic compound.

The emission layer may be to emit light having a center wavelength of 460 nm to 490 nm.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure.

In the drawings.

DETAILED DESCRIPTION

Figure 1:
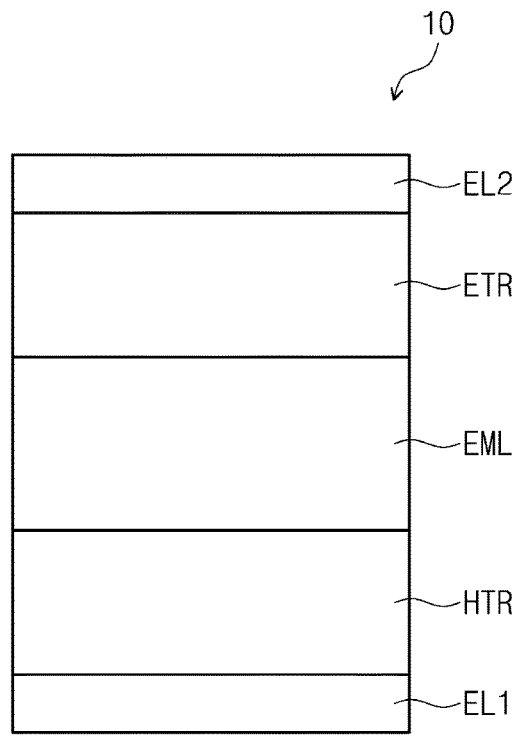
FIG. 1 is a cross-sectional view schematically illustrating an organic electroluminescence device according to an embodiment of the present disclosure.

The present disclosure may include various modifications and may be embodied in different forms, and example embodiments will be explained in more detail with reference to the accompanying drawings. The present disclosure may, however, be embodied in different forms and should not be construed as being limited to the embodiments set forth herein. Rather, all modifications, equivalents, and substitutions are understood to be included in the spirit and technical scope of the present disclosure.

In the description, it will be understood that when an element (a region, a layer, a section, and/or the like) is referred to as being "on", "connected to" or "coupled to" another element, it can be directly on, connected or coupled to the other element, or an intervening third element may be disposed therebetween. In contrast, when an element is referred to as being "directly on," "directly connected to," or "directly coupled to" another element, there are no intervening elements present.

Like numbers refer to like elements throughout, and duplicative descriptions thereof may not be provided. Also, in the drawings, thicknesses, ratios, and dimensions of elements may be exaggerated for an effective description of technical contents.

As used herein, the term "and/or" includes any and all combinations of one or more of the associated listed items.

It will be understood that, although the terms "first", "second", etc. may be used herein to describe various elements, the elements are not limited by these terms. These terms are only used to distinguish one element from another. For example, a first element could be alternatively termed a second element, and similarly, a second element could be alternatively termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are not to be interpreted in an ideal or overly formal sense unless expressly defined as such herein.

It should be understood that the terms "includes," "including," "comprises," and/or "comprising," are intended to specify the presence of stated features, integers, steps, operations, elements, components, or combinations thereof in the disclosure, but do not preclude the presence or addition of one or more other features, integers, steps, operations, elements, components, or combinations thereof.

As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

Hereinafter, an organic electroluminescence device according to an embodiment of the present disclosure and a condensed cyclic compound of an embodiment included therein will be described with reference to the accompanying drawings.

FIGS. 1 to 4 are cross-sectional views schematically illustrating organic electroluminescence devices according to embodiments of the present disclosure.

Referring to FIGS. 1 to 4, in each of organic electroluminescence devices 10, a first electrode EL1 and a second electrode EL2 are disposed to face each other, and an emission layer EML is disposed between the first electrode EL1 and the second electrode EL2.

Each of the organic electroluminescence devices 10 in FIGS. 1 to 4 may further include a plurality of functional layers between the first electrode EL1 and the second electrode EL2 in addition to the emission layer EML. The plurality of functional layers may include a hole transport region HTR and an electron transport region ETR.

For example, each of the organic electroluminescence devices 10 according to embodiments may include the first electrode EL1, the hole transport region HTR, the emission layer EML, the electron transport region ETR, and the second electrode EL2 sequentially stacked. In some embodiments, the organic electroluminescence device 10 of an embodiment may include a capping layer CPL disposed on the second electrode EL2.

The organic electroluminescence device 10 of an embodiment may include a condensed cyclic compound according to an embodiment (described below) in the emission layer EML disposed between the first electrode EL1 and the second electrode EL2. In some embodiments, the organic electroluminescence device 10 of an embodiment may include a condensed cyclic compound in the hole transport region HTR and/or the electron transport region ETR (which are among the plurality of functional layers disposed between the first electrode EU and the second electrode EL2), as well as in the emission layer EML.

Figure 2:
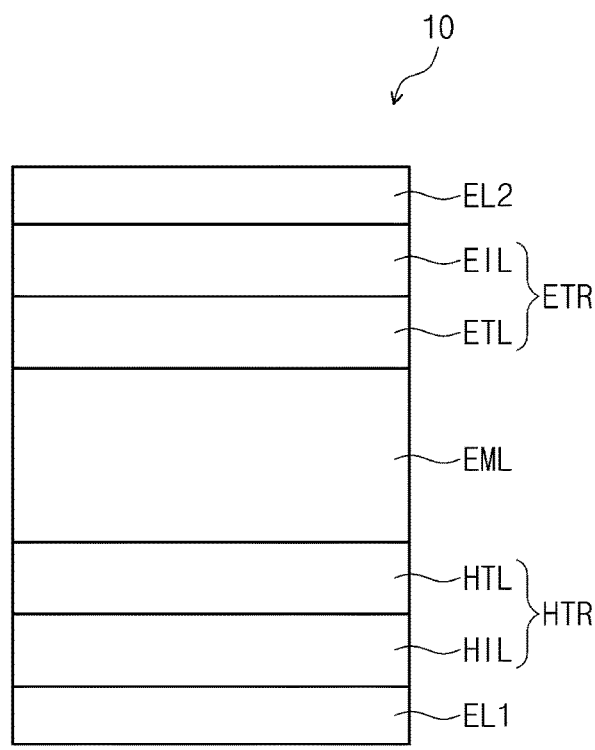
FIG. 2 is a cross-sectional view schematically illustrating an organic electroluminescence device according to an embodiment of the present disclosure.
Figure 3:
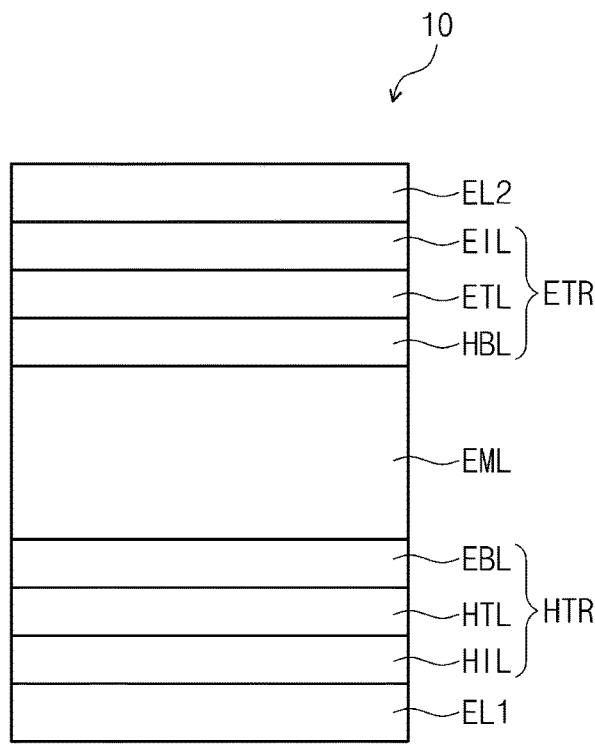
FIG. 3 is a cross-sectional view schematically illustrating an organic electroluminescence device according to an embodiment of the present disclosure.
Figure 4:
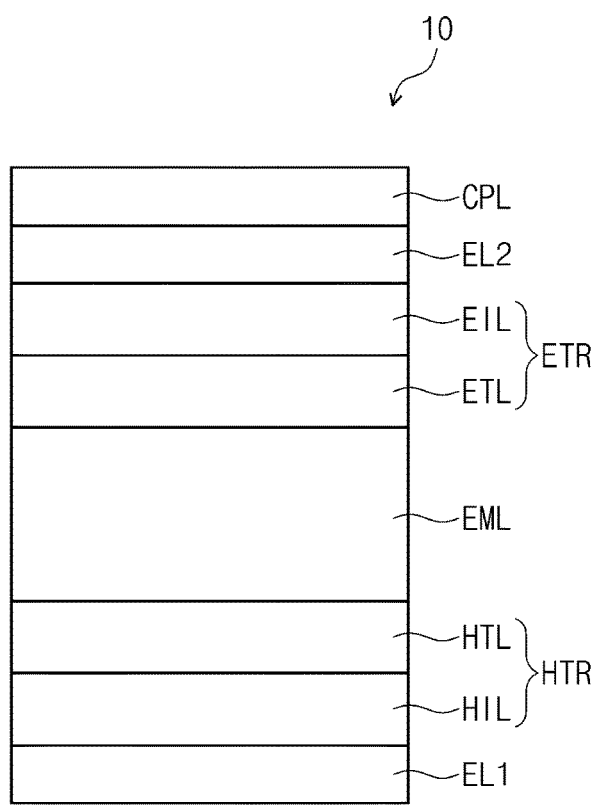
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment further including a capping layer CPL disposed on the second electrode EL2.

The first electrode EL1 may be conductive. The first electrode EL1 may be formed of a metal alloy and/or a conductive compound. The first electrode EU may be an anode. In addition, the first electrode EU may be a pixel electrode. The first electrode EL1 may be a transmissive (e.g., transparent) electrode, a transflective electrode, or a reflective electrode. When the first electrode EU is a transmissive electrode, the first electrode EL1 may include a transparent metal oxide (such as, indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EU may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), zinc (Zn), tin (Sn), ytterbium (Yb), a compound thereof (e.g., AgMg, AgYb, or MgAg), or a mixture thereof. In some embodiments, the first electrode EL1 may have a multilayer structure including a reflective layer or a transflective layer formed of the above-described materials, and a transmissive (transparent) conductive layer formed of ITO, IZO, ZnO, ITZO, etc. For example, the first electrode EL1 may have a three-layer structure of ITO/Ag/ITO, but is not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer. The thickness of the hole transport region HTR may be, for example, about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but an embodiment is not limited thereto.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine] (m-MTDATA), 4,4',4''-tris(N,N-diphenylamino)triphenylamine (TDATA), 4,4',4''-tris{N,-(2-naphthyl) N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANT/CSA), polyaniline/poly(4-styrene sulfonate) (PANT/PSS), N,N'-di(naphthalene-l-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorene derivatives, N,N'-bis (3-methylphenyl)-N,N'-diphenyl-[1,1-biphenyl]-4,4'-diamine (TPD), triphenylamine derivatives (such as 4,4',4''-tris(N-carbazolyl)triphenylamine (TCTA)), N,N'-di (naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-Bis(N-carbazolyl)benzene (mCP), etc.

The thickness of the hole transport region HTR may be about 50 Å to about 10,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be a quinone derivative, a metal oxide, or a cyano group-containing compound, but is not limited thereto. For example, non-limiting examples of the p-dopant include quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), etc., but is not limited thereto.

As described above, the hole transport region HTR may further include at least one of a hole buffer layer or an electron blocking layer EBL in addition to the hole injection layer HIL and the hole transport layer HTL. The hole buffer layer may compensate for the resonance distance of the wavelength of light emitted from an emission layer EML, and may increase the light emission efficiency of the device. The materials that may be included in the hole transport region HTR may be included in the hole buffer layer. The electron blocking layer EBL may prevent or reduce electrons from being injected from the electron transport region ETR to the hole transport region HTR.

The emission layer EML is provided on the hole transport region HTR. The thickness of the emission layer EML may be, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML in the organic electroluminescence device 10 of an embodiment may include a condensed cyclic compound of an embodiment.

The condensed cyclic compound of an embodiment may be classified as a 1,3,5-triamino-2,4-dibora-benzene derivative condensed with a heterocycle (e.g., one or more heterocycles). In addition, the condensed cyclic compound of an embodiment may be classified as a fused ring of benzoazaborine

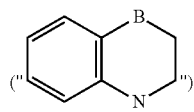

and/or dibenzoazaborine

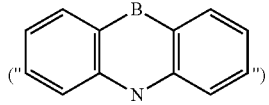

as represented by Formula X, which is further condensed with a heterocycle. In some embodiments, the heterocycle further bonded to the condensed ring represented by Formula X may include at least one of B, N, O, or S as a hetero atom.

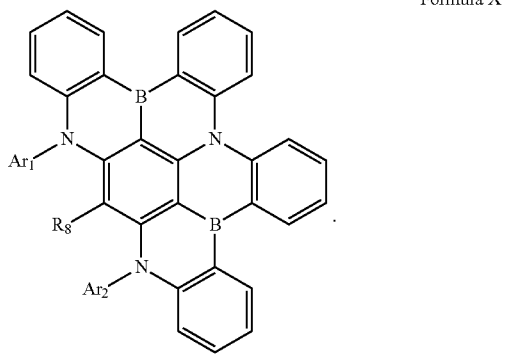

Formula X

In the description, the term "substituted or unsubstituted" may indicate a state of being unsubstituted (e.g., bearing only hydrogens), or of being substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents exemplified above may be further substituted or unsubstituted. For example, a biphenyl group may be interpreted as an aryl group or a phenyl group, substituted with a phenyl group.

In the description, the term "bonded to an adjacent group to form a ring" may indicate a state of being bonded to an adjacent group to form a substituted or unsubstituted hydrocarbon ring, or a substituted or unsubstituted heterocycle. The term "hydrocarbon ring" includes an aliphatic hydrocarbon ring and an aromatic hydrocarbon ring. The term "heterocycle" includes an aliphatic heterocycle and an aromatic heterocycle. The rings formed by being bonded to an adjacent group may be monocyclic or polycyclic. In addition, the rings formed by being bonded to each other may be connected to another ring to form a spiro structure.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as being "adjacent groups" to each other, and two ethyl groups in 1,1-diethylcyclopentane may be interpreted as being "adjacent groups" to each other.

In the description, non-limiting examples of the halogen atom include a fluorine atom, a chlorine atom, a bromine atom, and an iodine atom.

In the description, the alkyl group may be a linear, branched or cyclic alkyl group. The number of carbons in the alkyl group may be 1 to 50, 1 to 30, 1 to 20, 1 to 10, or 1 to 6. Non-limiting examples of the alkyl group include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-heneicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the term "aryl group" refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the heterocyclic group may include at least one of boron (B), oxygen (O), nitrogen (N), phosphorus (P), silicon (Si) or sulfur (S) as a heteroatom. When the heterocyclic group contains two or more heteroatoms, the two or more heteroatoms may be the same as or different from each other. The heterocyclic group may be a monocyclic heterocyclic group or a polycyclic heterocyclic group, or may be a heteroaryl group. The number of ring-forming carbon atoms in the heterocyclic group may be 2 to 30, 2 to 20, or 2 to 10.

In the description, the heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidyl, pyrido pyrazinyl, pyrazino pyrazinyl, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophenyl, thienothiophene, benzofuranyl, phenanthroline, thiazolyl, isoxazolyl, oxadiazolyl, thiadiazolyl, phenothiazolyl, phenothiazinyl, dibenzosilole, dibenzofuranyl, etc., but are not limited thereto.

In the description, the term "oxy group" may refer to an alkoxy group or an aryloxy group. The alkoxy group may include a linear, branched or cyclic chain. The number of carbon atoms in the alkoxy group is not particularly limited, but for example, may be 1 to 20 or 1 to 10. The number of ring-forming carbon atoms in the aryloxy group may be, for example, 6 to 30, 6 to 20, or 6 to 15. Non-limiting examples of an oxy group include methoxy, ethoxy, n-propoxy, isopropoxy, butoxy, pentyloxy, hexyloxy, octyloxy, nonyloxy, decyloxy, benzyloxy, etc.

In the description, the term "thio group" may refer to an alkylthio group or an arylthio group. In the description, the alkyl group in the alkylthio group may be the same as the alkyl group described above.

In the description, the aryl group in the aryloxy group and the arylthio group may be the same as the aryl group described above.

In the description, the number of carbon atoms in an amino group is not limited, but may be 1 to 30. The amino group may include an alkyl amino group, an aryl amino group, or a heteroaryl amino group. Non-limiting examples of the amino group include a methylamino group, a dimethylamino group, a phenylamino group, a diphenylamino group, a naphthylamino group, a 9-methyl-anthracenylamino group, a triphenylamino group, etc.

In the description, the term "direct linkage" may refer to a single bond. The direct linkage may refer to directly connecting two positions which are bonded without any additional linking atoms or groups.

In the description, "—*" refers to a position to be connected.

The emission layer EML in the organic electroluminescence device 10 of an embodiment may include a condensed cyclic compound represented by Formula 1 of an embodiment:

Formula 1

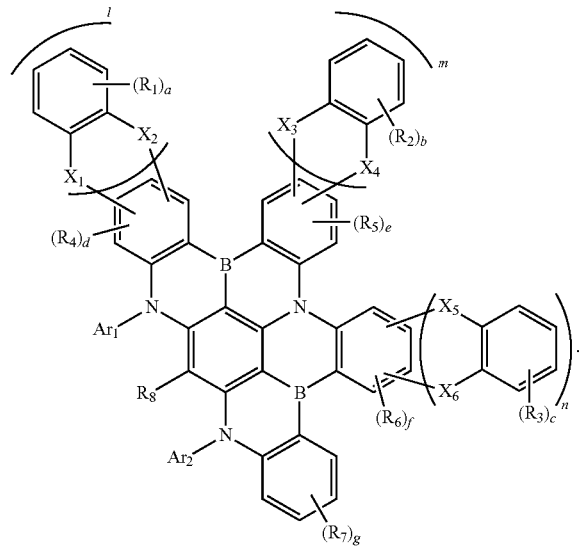

In Formula 1, $X_1$ to $X_6$ may each independently be a direct linkage, $BAr_3$, $NAr_4$, O, or S. As stated above, "direct linkage" may refer to a single bond (e.g., so that the resulting ring is five-membered). The two hetero atoms ($X_1$ and $X_2$, $X_3$ and $X_4$, and/or $X_5$ and $X_6$) contained in one heterocycle (as contained in the parentheses with l, m, or n) may each independently be the same as or different from each other.

In Formula 1, $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms. For example, $Ar_1$ to $Ar_4$ may each independently be an unsubstituted phenyl group, a phenyl group substituted with a substituted or unsubstituted alkyl group having 1 to 10 carbon atoms, or a phenyl group substituted with a deuterium atom. In addition, when $Ar_1$ to $Ar_4$ are each a phenyl group substituted with a substituted or unsubstituted alkyl group having 1 to 10 carbon atoms, $Ar_1$ to $Ar_4$ may each be a phenyl group substituted with at least one isopropyl group.

In Formula 1, l, m, and n may each independently be 0 or 1, and at least one of l, m, or n may be 1. For example, in the condensed cyclic compound of an embodiment, the case where l, m, and n are each (all) 0 is excluded. For example, the condensed cyclic compound of an embodiment may have a condensed ring that is represented by Formula X, and may be further condensed with a heterocycle as described above. For example, the condensed heterocycle may include at least one of B, N, O, or S as a heteroatom.

In Formula 1, a to g may each independently be an integer of 0 to 4. In some embodiments, when a to g are each independently an integer of 2 or more, a plurality of $R_1$'s to $R_7$'s may each independently be the same, at least one may be different from the others, or each may be different. Further, when a is an integer of 2 or more, a plurality of $R_1$'s may be all the same, or at least one may be different from the others. This is described as an example; when each of b to g is an integer of 2 or more, this may be equally applied to $R_2$ to $R_7$. Meanwhile, when l is 1, d may be an integer of 0 to 2, when m is 1, e may be an integer of 0 to 2, and when n is 1, f may be an integer of 0 to 2.

In Formula 1, $R_1$ to $R_8$ may each independently be a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, $R_1$ to $R_8$ may each independently be a hydrogen atom, a deuterium atom, a methyl group, an unsubstituted oxy group, an alkyloxy group, an unsubstituted thio group, an aryloxy group, or a phenyl group. However, embodiments are not limited thereto. $R_1$ to $R_8$ may each (all) be hydrogen atoms, or $R_1$ to $R_8$ may each (all) be deuterium atoms.

When $R_1$ to $R_8$ are bonded to an adjacent group to form a ring, the formed ring may be a heterocycle including a hetero atom such as N, O, and S as a ring-forming atom. For example, $R_7$ may be bonded to a nitrogen atom of the neighboring benzoazaborine ring to form an indoline ring, a benzoxazine ring, or a benzothiazine ring.

The condensed cyclic compound represented by Formula 1 may be represented by any one among Formula 1-1 to Formula 1-3. Formula 1-1 to Formula 1-3 each represent example structures including the condensed heterocycle at different bonding positions.

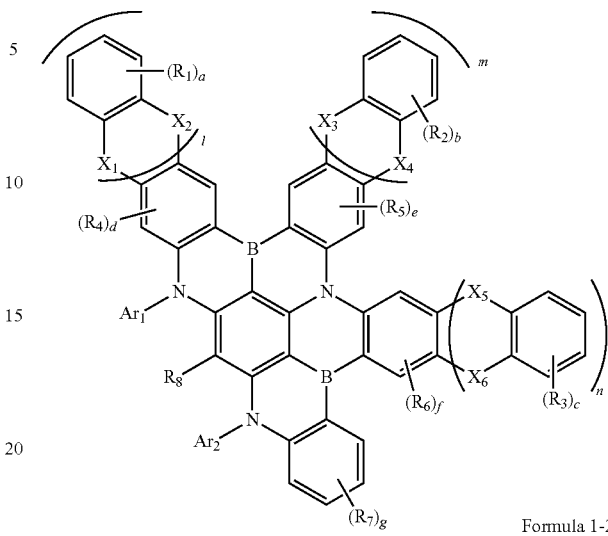

Formula 1-1

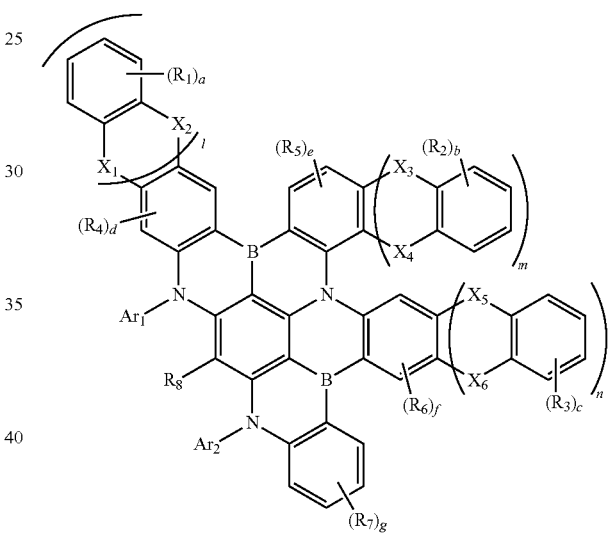

Formula 1-2

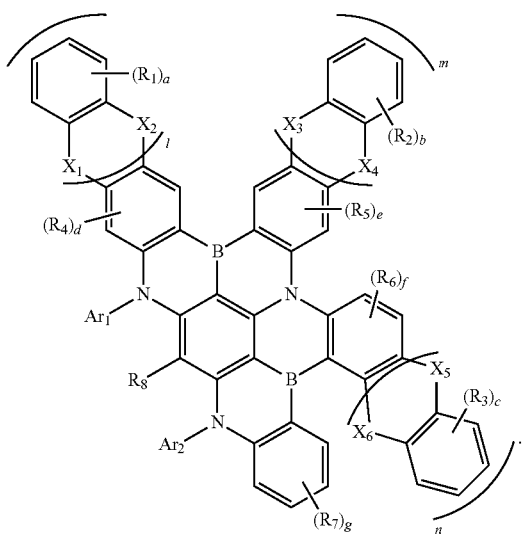

Formula 1-3

In Formula 1-1 to Formula 1-3, $X_1$ to $X_6$, $Ar_1$, $Ar_2$, l, m, n, a to g, and $R_1$ to $R_8$ may each independently be the same as described in Formula 1.

The condensed cyclic compound represented by Formula 1 of an embodiment has at least one heterocycle further bonded (fused) to the condensed ring of a core represented by Formula X. For example, the condensed cyclic compound of an embodiment may have one or two heterocycles further bonded to the core represented by Formula X, and at least two heterocycles may be bonded to different positions (e.g., different rings).

For example, the condensed cyclic compound of an embodiment may be represented by any one among Formula 1-A to Formula 1-E. Formula 1-A and Formula 1-B each represent a case in which one heterocycle is further condensed, and Formulae 1-C to 1-E each represent a case in which two heterocycles are condensed to different positions (rings).

Formula 1-A

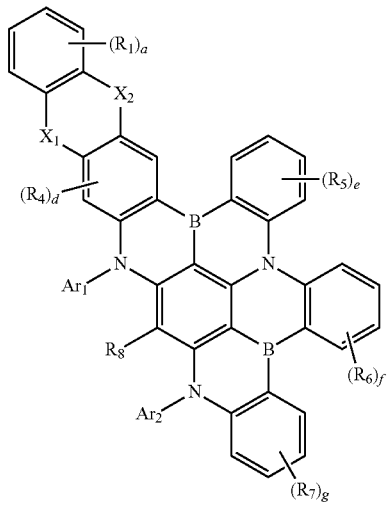

Formula 1-B

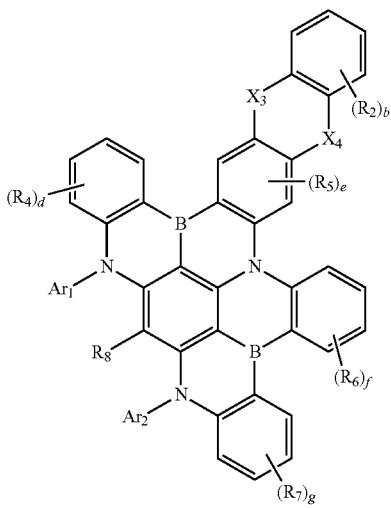

Formula 1-C

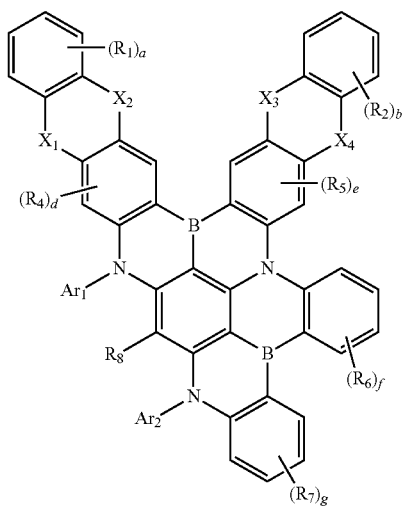

Formula 1-D

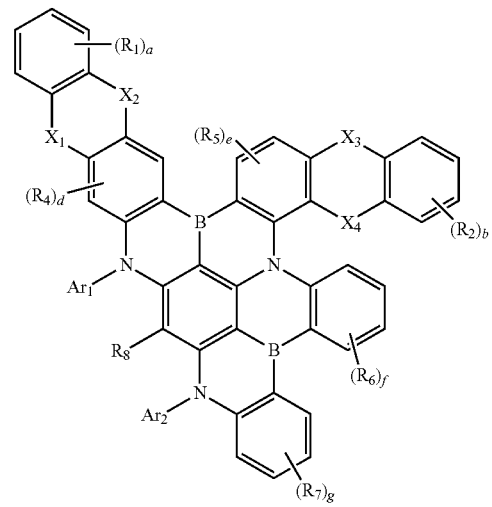

[Formula 1-E]

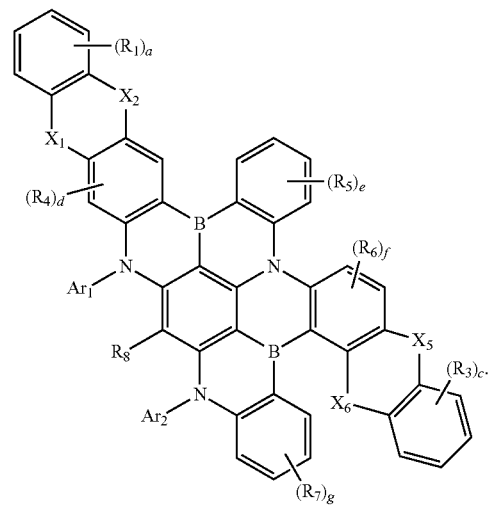

In Formula 1-A to Formula 1-E, $X_1$ to $X_6$, $Ar_1$, $Ar_2$, a to g, and $R_1$ to $R_8$ may each independently be the same as described in Formula 1.

In some embodiments, the condensed cyclic compound of an embodiment may be represented by Formula 1A:

Formula 1A

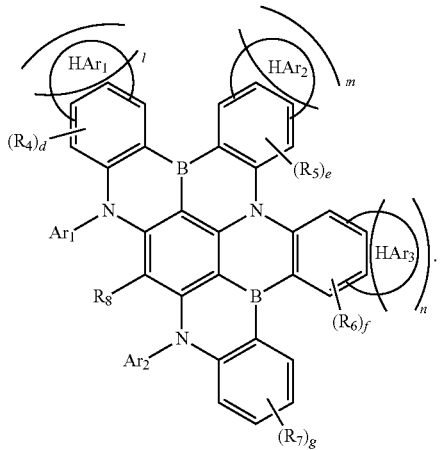

The substituents and variables in Formula 1A may each independently be the same as described in Formula 1.

In Formula 1A, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, $Ar_1$ and $Ar_2$ may each independently be an unsubstituted phenyl group, a phenyl group substituted with a substituted or unsubstituted alkyl group having 1 to 10 carbon atoms, or a phenyl group substituted with a deuterium atom. In addition, when $Ar_1$ and $Ar_2$ are each a phenyl group substituted with a substituted or unsubstituted alkyl group having 1 to 10 carbon atoms, $Ar_1$ and $Ar_2$ may each be a phenyl group substituted with at least one isopropyl group.

In Formula 1A, l, m, and n may each independently be 0 or 1, and at least one of l, m, and n may be 1. For example, the case where all of l, m, and n are 0 is excluded.

In Formula 1A, d to g may each independently be an integer of 0 to 4. $R_4$ to $R_8$ may each independently be a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In some embodiments, in Formula 1A, $HAr_1$ to $HAr_3$ may each independently be represented by Formula 2:

Formula 2

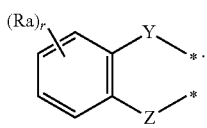

In Formula 2, Y and Z may each independently be a direct linkage, $BAr_3$, $NAr_4$, O, or S. Ara and Ara may each independently be a substituted or unsubstituted aryl group having 6 to 30 ring-forming carbon atoms, or a substituted or unsubstituted heteroaryl group having 2 to 30 ring-forming carbon atoms. For example, An and Are may each independently be an unsubstituted phenyl group, a phenyl group substituted with a substituted or unsubstituted alkyl group having 1 to 10 carbon atoms, or a phenyl group substituted with a deuterium atom.

In Formula 2, r may be an integer of 0 to 4. When r is an integer of 2 or more, a plurality of $R_a$'s may be the same, or at least one may be different from the others.

$R_a$ may be a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In Formula 2, "—*" is a part bonded to Formula 1.

The heterocycle represented by Formula 2 may be represented by any one among 2-A to 2-J.

2-A

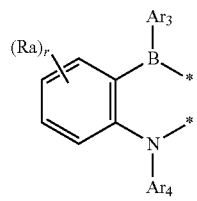

2-B

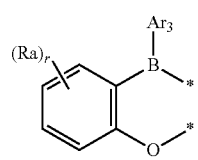

2-C

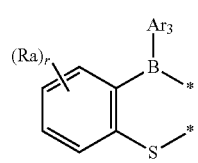

2-D

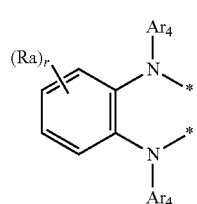

2-E

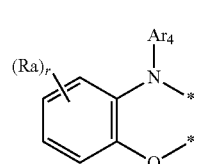

2-F

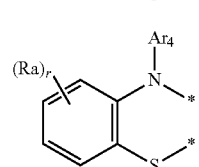

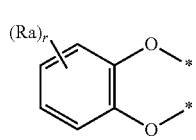

2-G

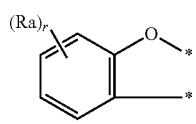

2-H

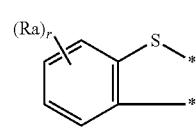

2-I

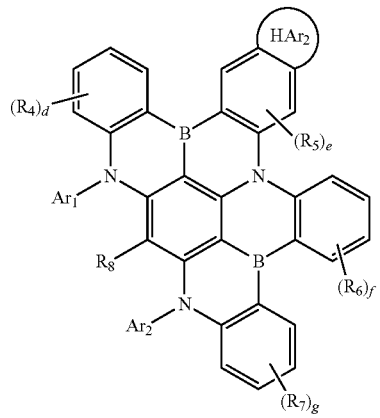

Formula 1A-2

2-J

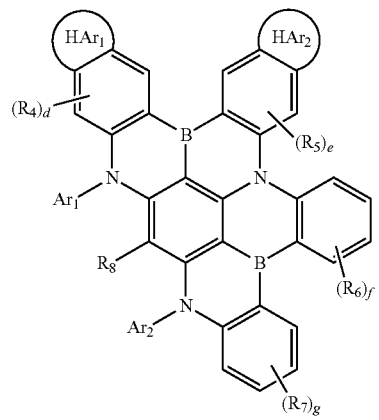

Formula 1A-3

In Formulae 2-A to 2-J, those described in Formula 2 as described above may be equally applied to $Ar_3$, $Ar_4$, Ra, and r.

Formula 1A may be represented by any one among Formula 1A-1 to Formula 1A-5. Each of Formula 1A-1 and Formula 1A-2 represents a s where one heterocycle represented by Formula 2 is condensed to the core moiety represented by Formula 1A. In addition, each of Formulae 1A-3 to 1A-5 represents a case in which two heterocycles represented by Formula 2 are condensed to different positions of the core moiety represented by Formula 1A.

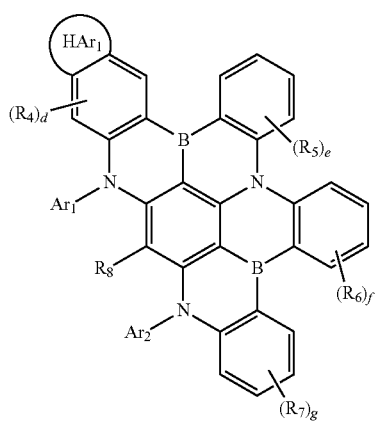

Formula 1A-1

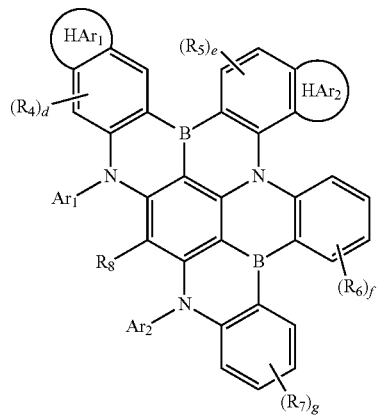

Formula 1A-4

[Formula 1A-5]

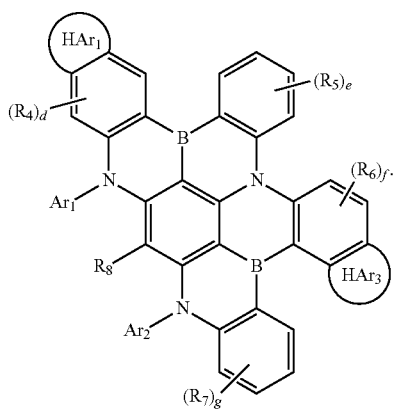

The above-described condensed cyclic compound of an embodiment may have a structure in which one or more heterocycles are bonded to a core including condensed benzoazaborine or dibenzoazaborine rings, thereby providing an expanded conjugated system. Accordingly, the conjugated structure may provide multiple resonance structures, thereby facilitating reverse intersystem crossing (RISC). The condensed cyclic compound of an embodiment having the expanded conjugated structure, may therefore be used as a high efficiency luminescent material. For example, if the condensed cyclic compound according to an embodiment is used as an emission layer material of the organic electroluminescence device, the luminous efficiency of the organic electroluminescence device may be improved.

The condensed cyclic compound of an embodiment has a molecular structure in which reverse intersystem crossing easily occurs, due to the expanded conjugated system structure, and the compound may therefore be used as a thermally activated delayed fluorescence (TADF) material. For example, the condensed cyclic compound of an embodiment may be used as a TADF material to emit blue light.

The condensed cyclic compound of an embodiment may be selected from compounds represented by Compound Group 1. The electroluminescence device 10 of an embodiment may include at least one condensed cyclic compound among the condensed cyclic compounds represented by Compound Group 1 in the emission layer EML.

[Compound Group 1]

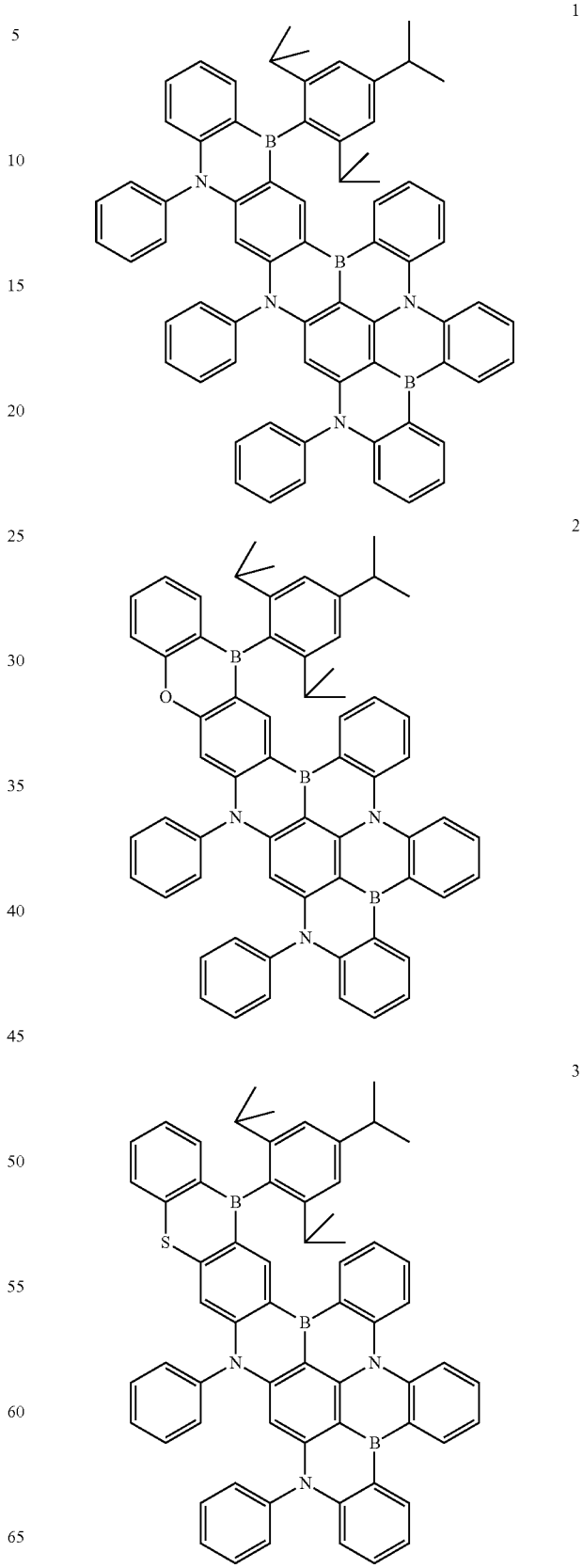

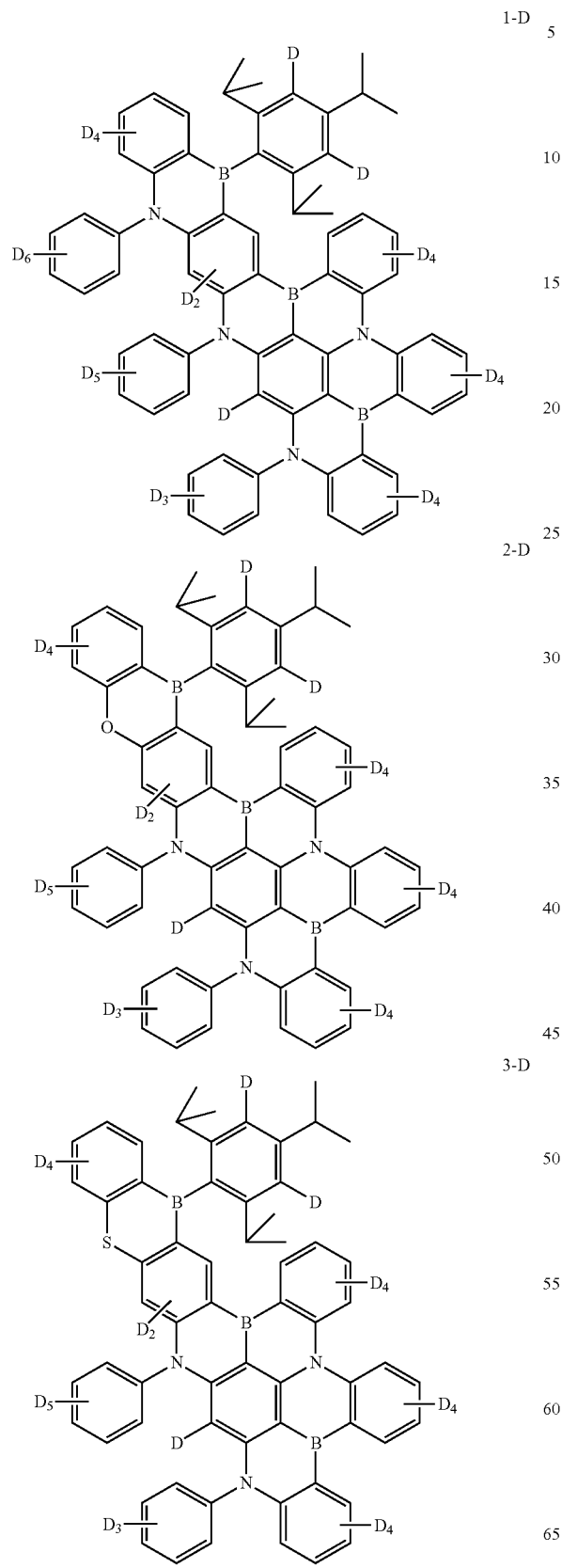
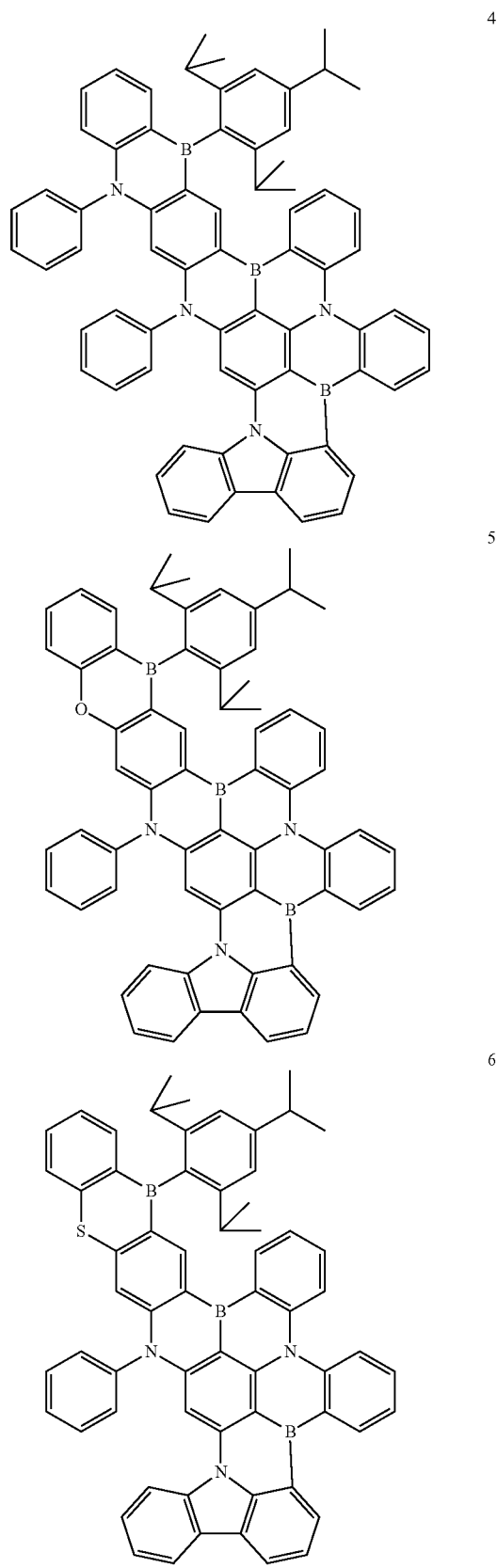

7
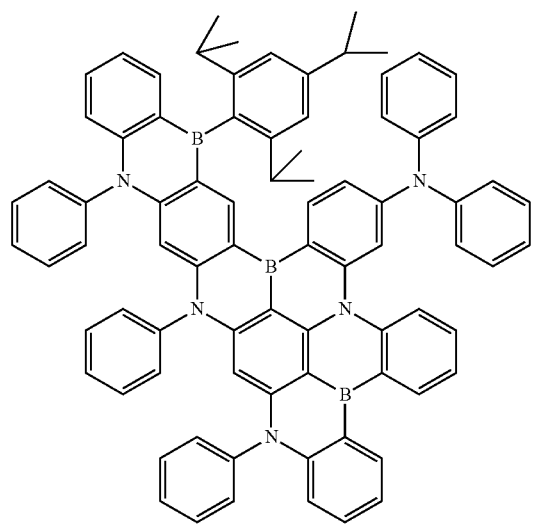
10
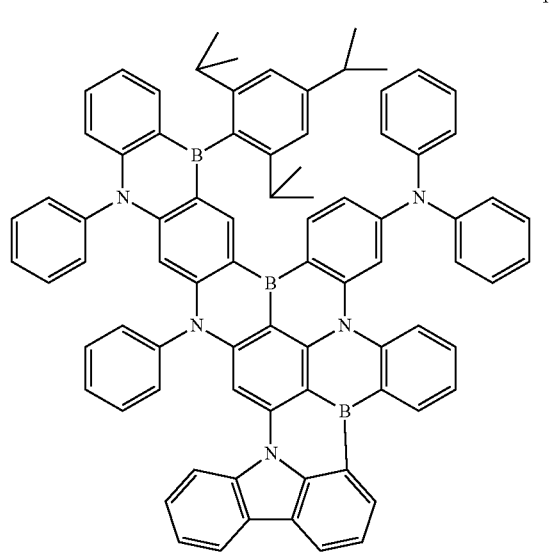
8
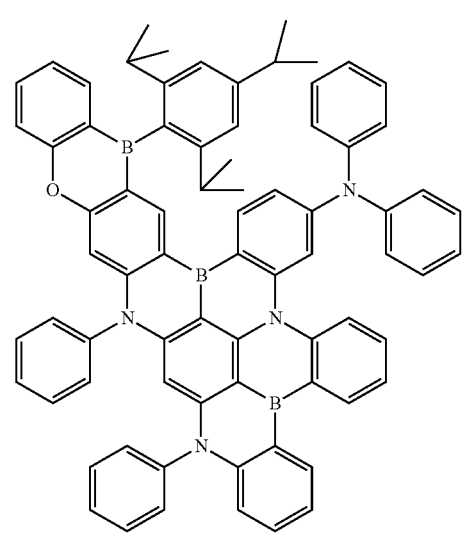
11
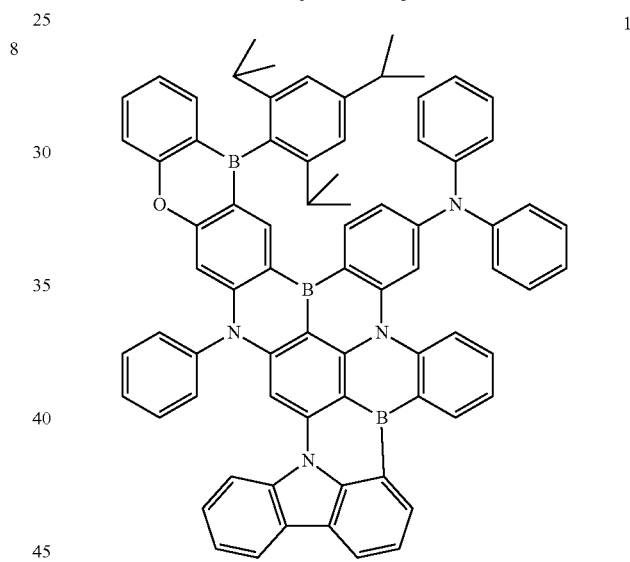
9
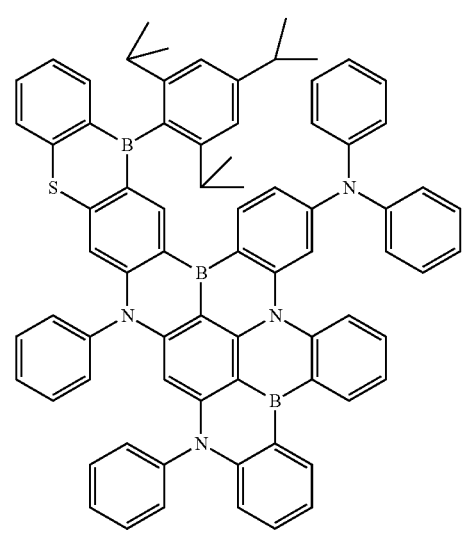
12
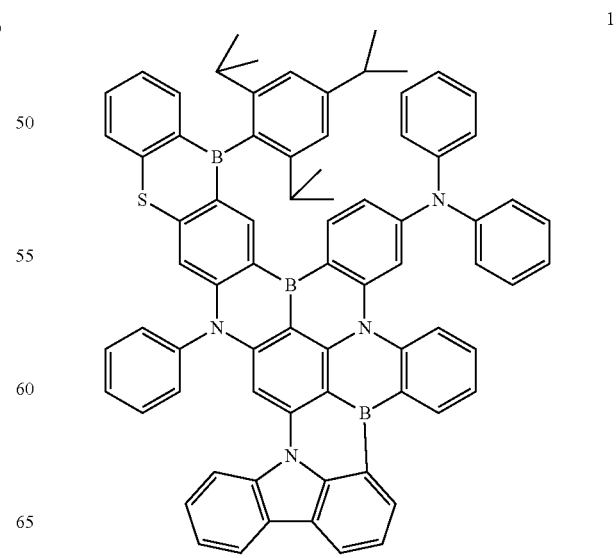

13
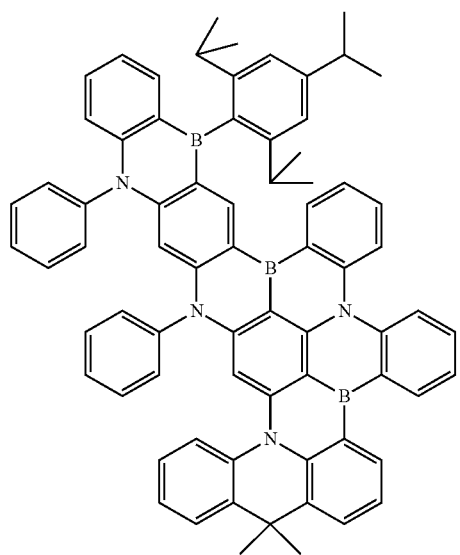
14
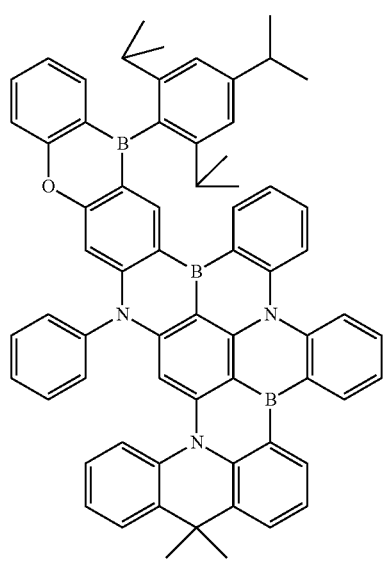
15
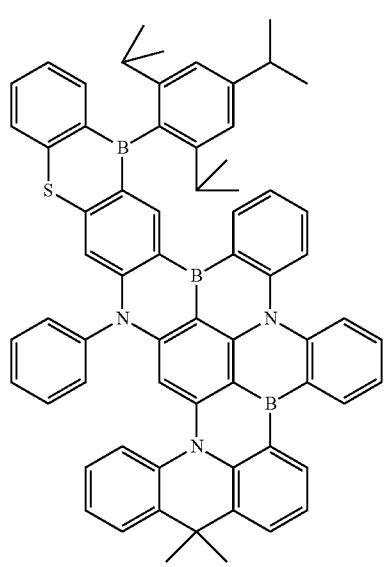
16
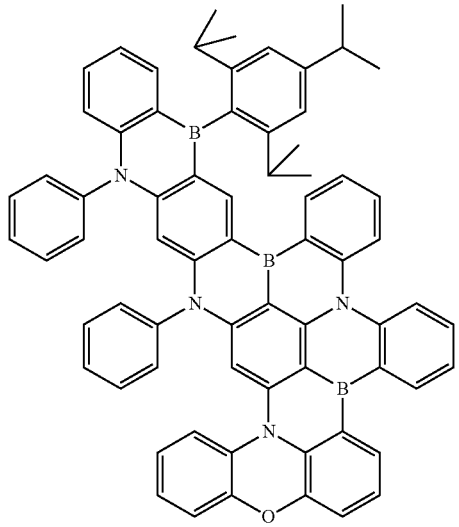
17
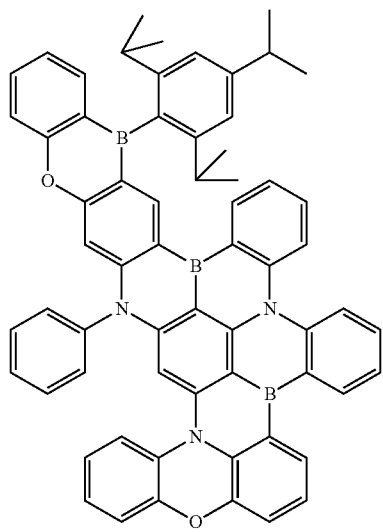
18
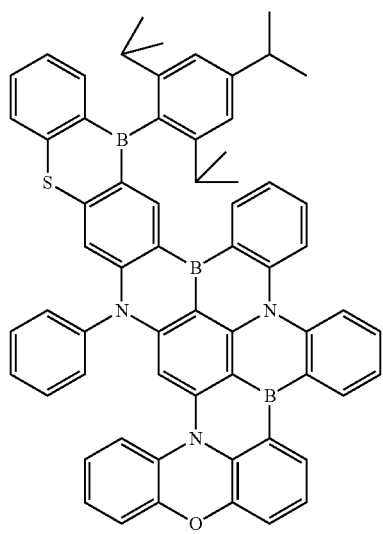

19
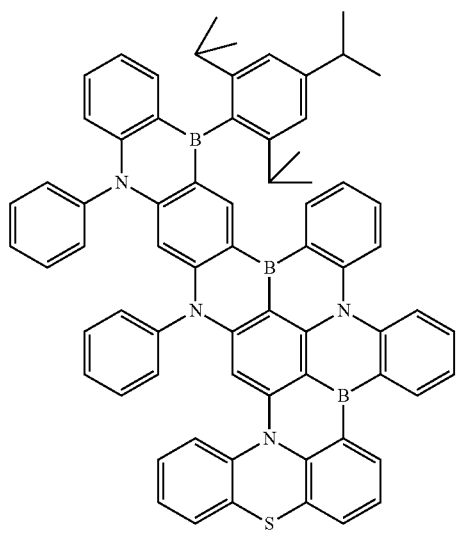
20
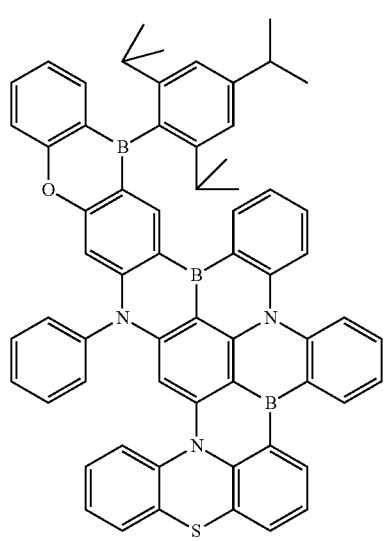
21
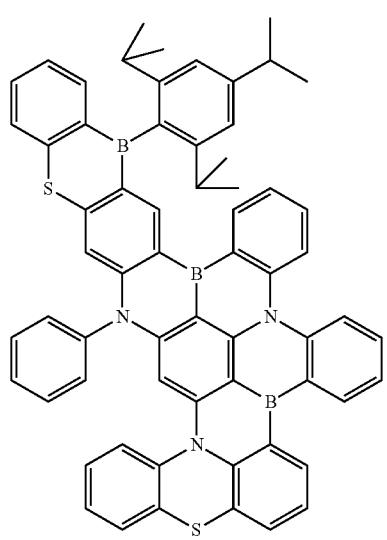
22
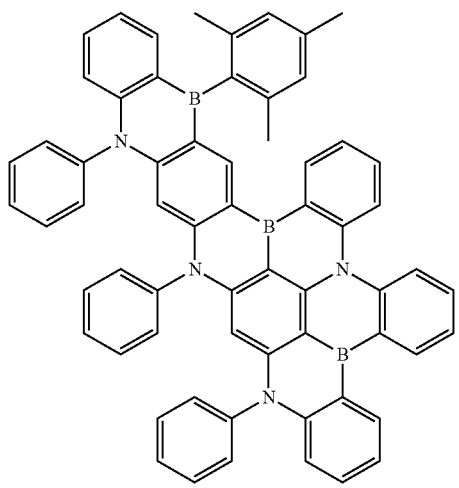
23
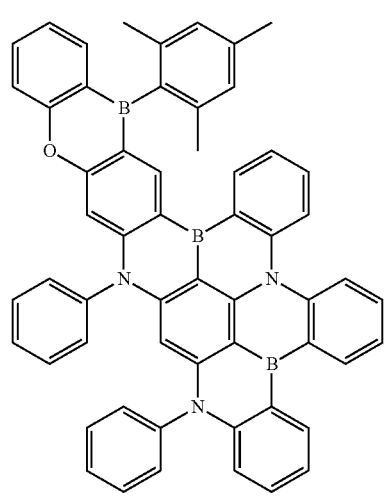
24
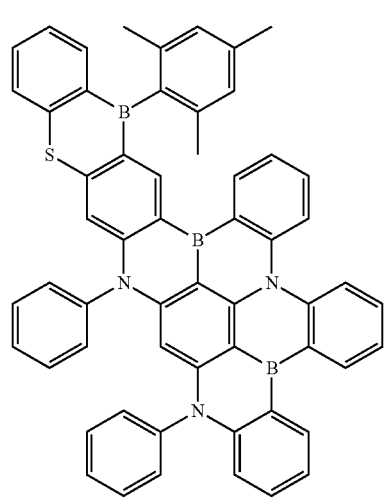

25
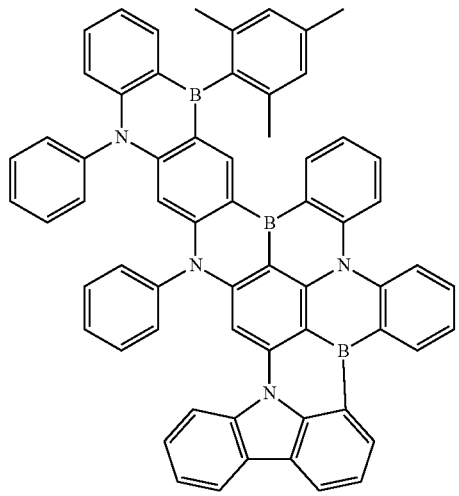
26
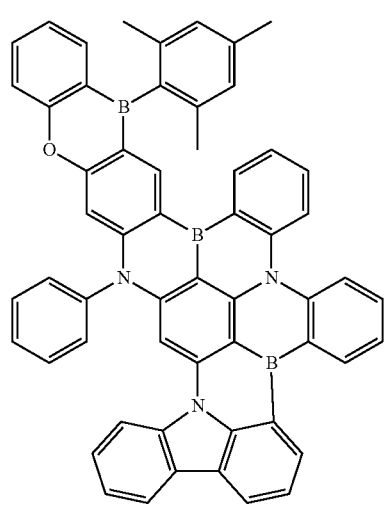
27
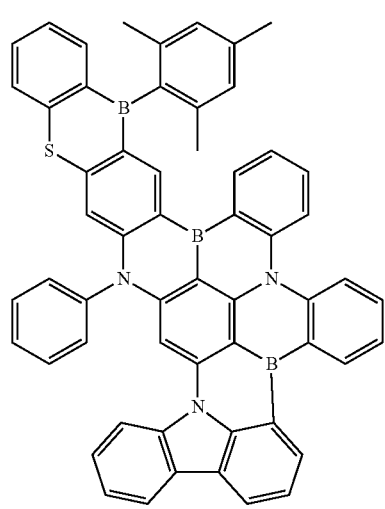
28
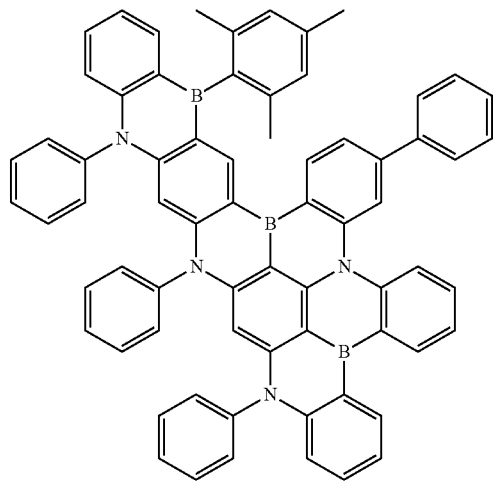
29
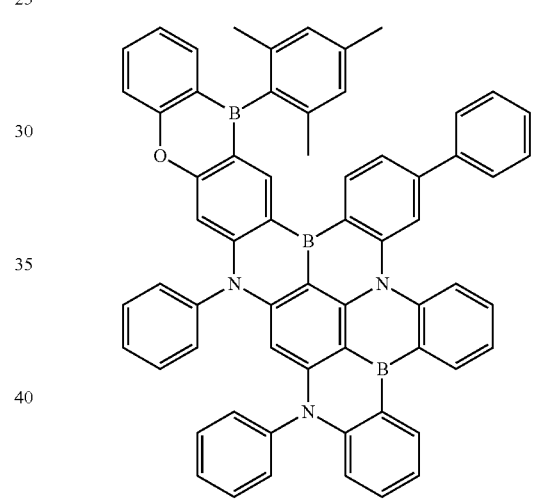
30
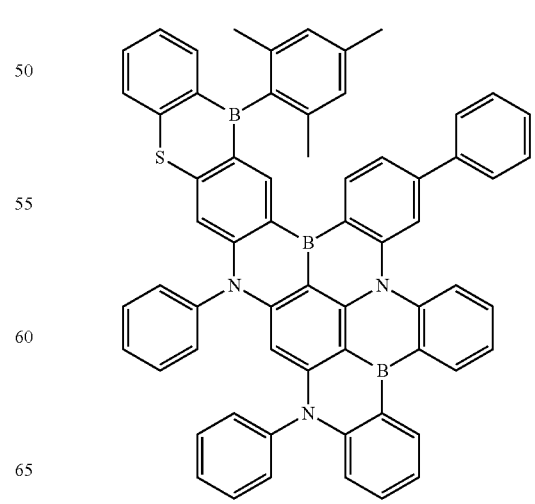

31
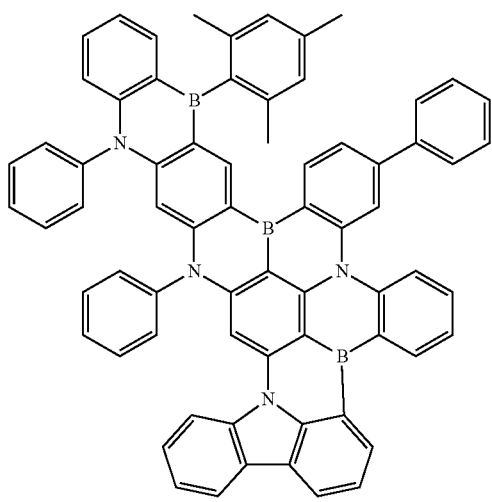
32
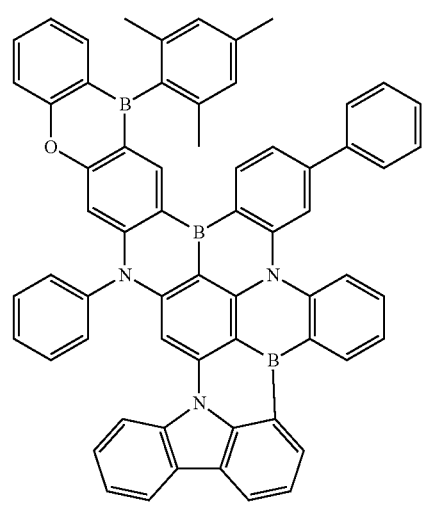
33
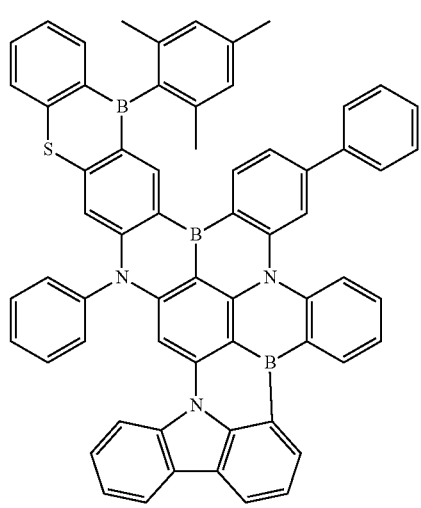
34
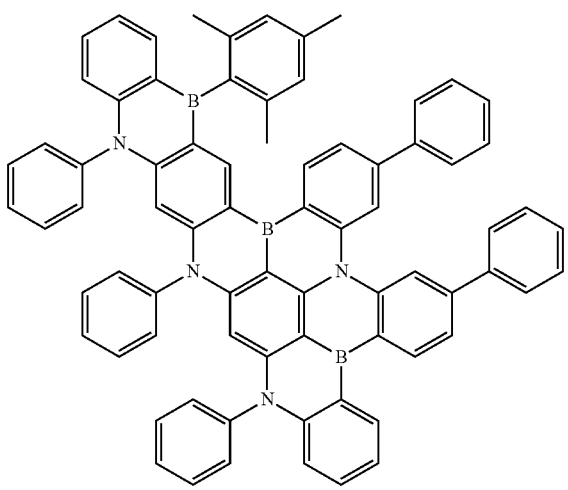
35
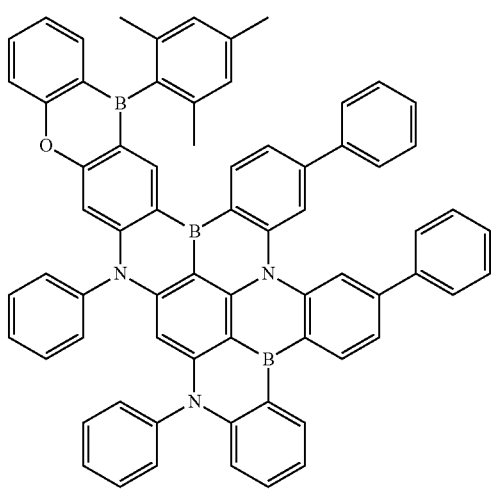
36
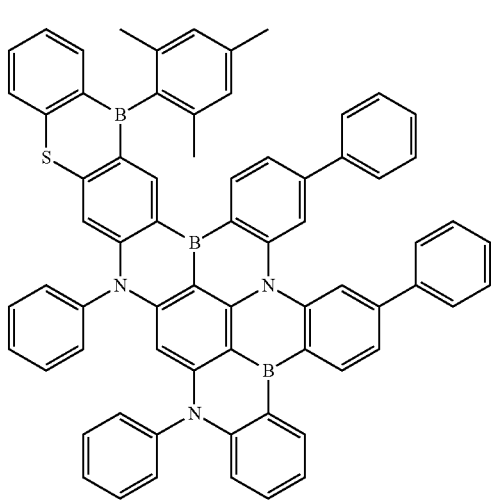

37
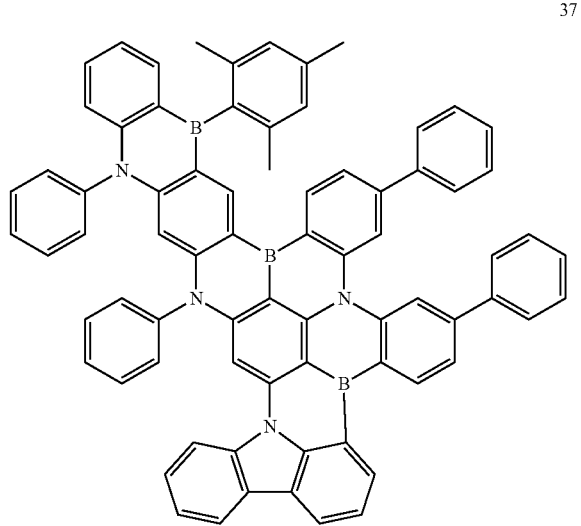
38
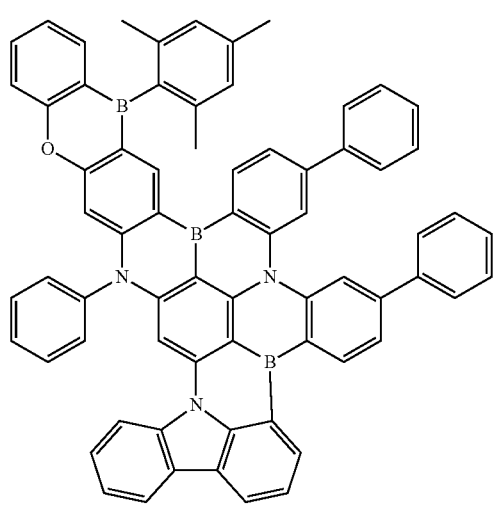
39
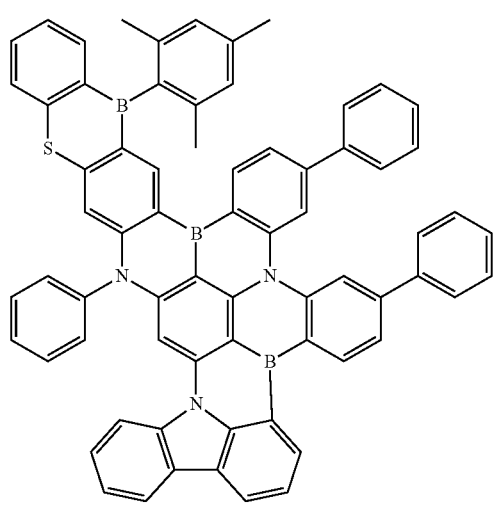
40
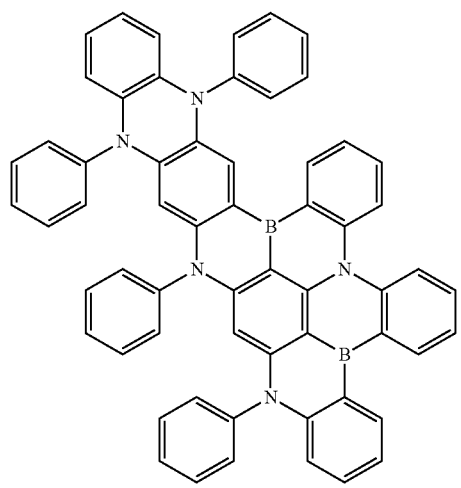
41
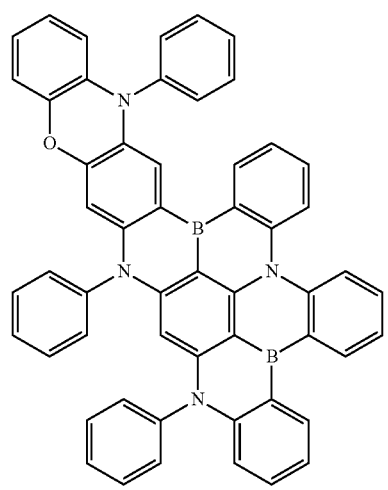
41-D
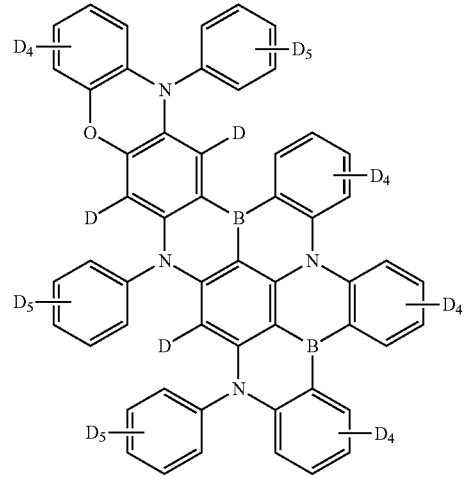

-continued
42
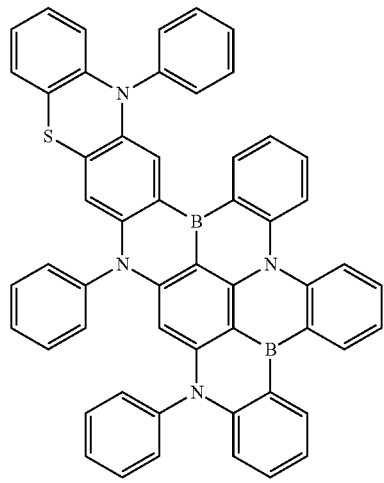
45
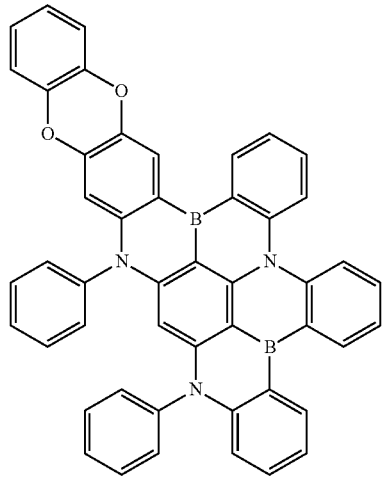
43
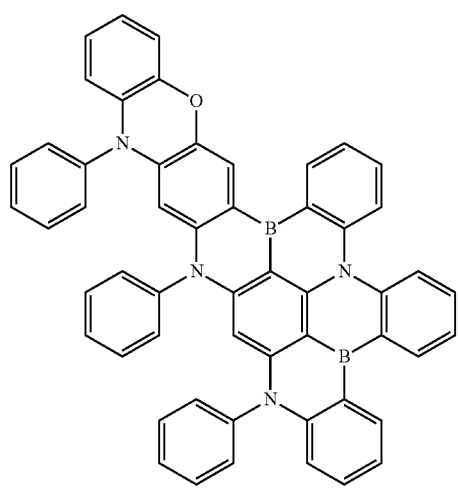
46
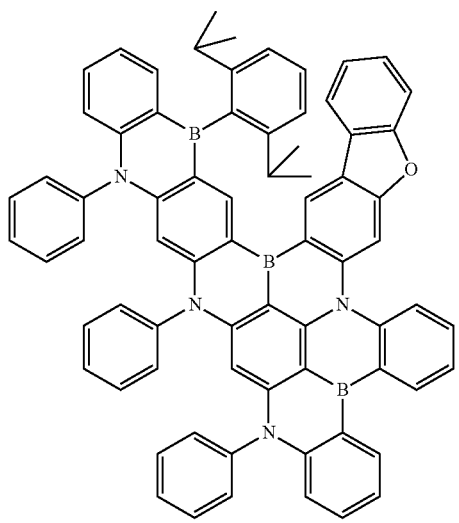
44
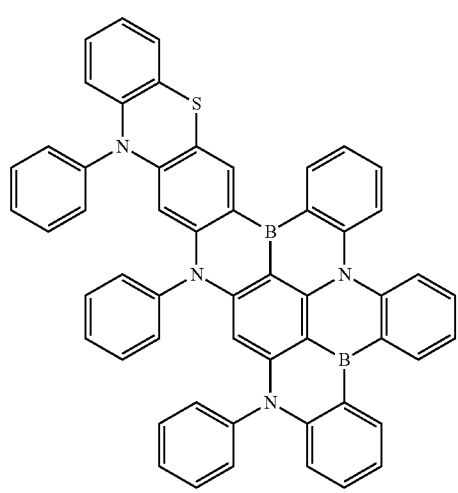
47
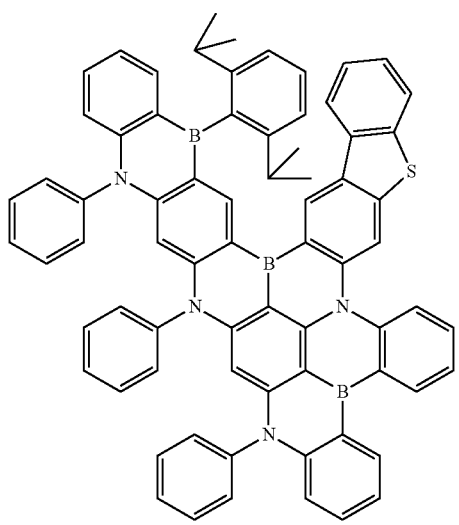

48
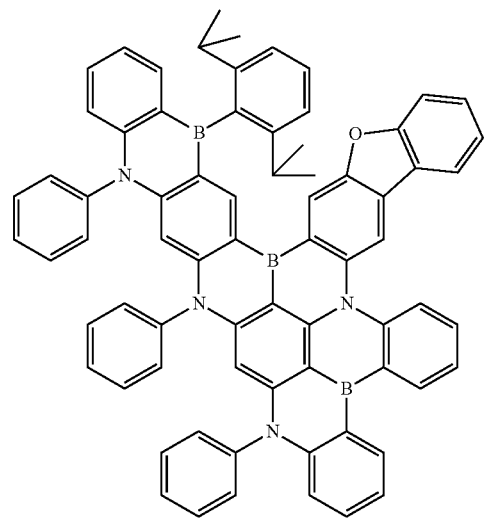
49
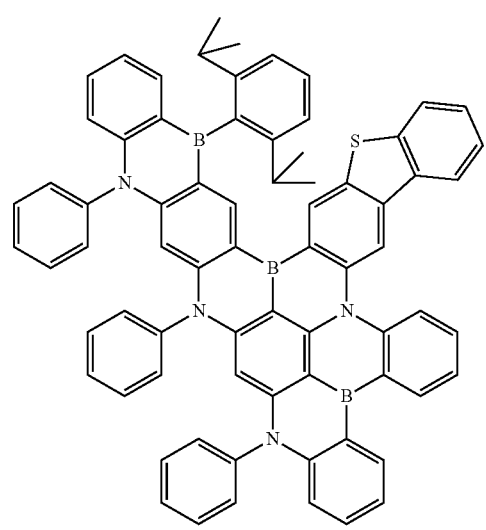
50
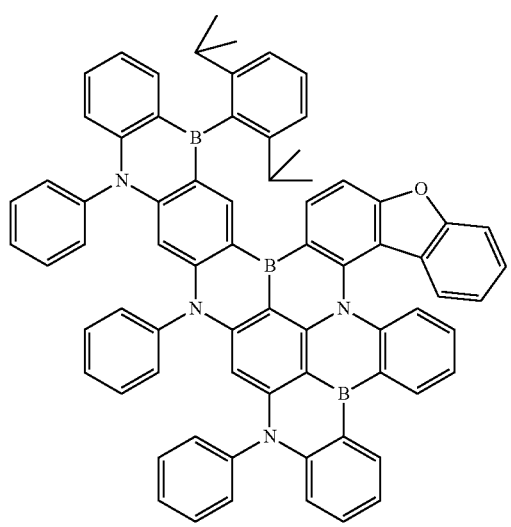
51
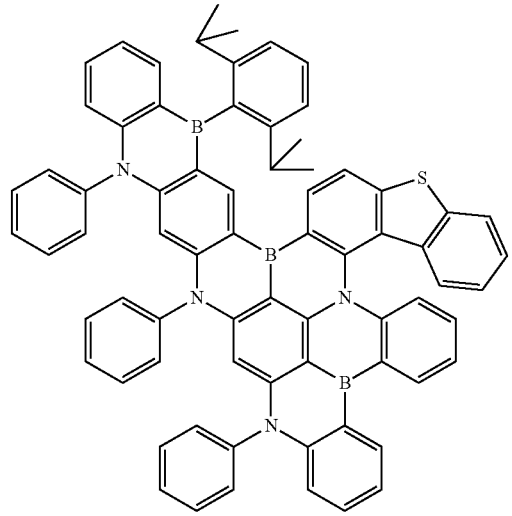
52
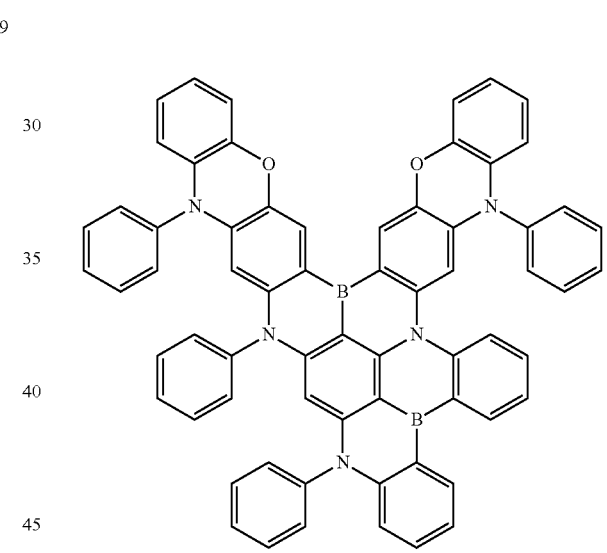
52-D
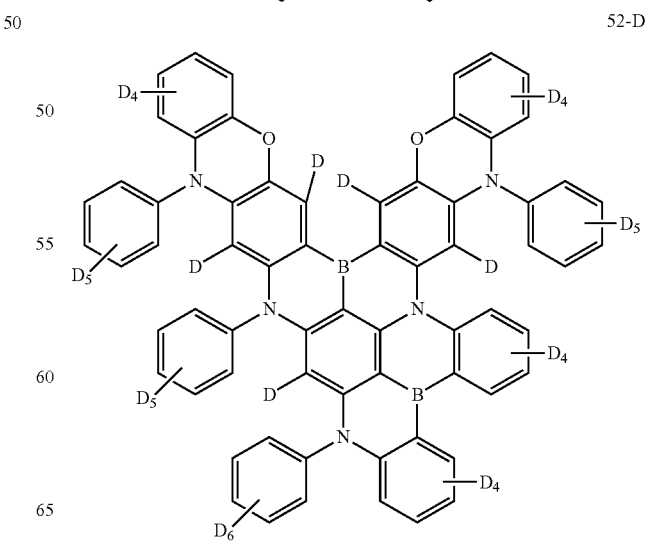

53
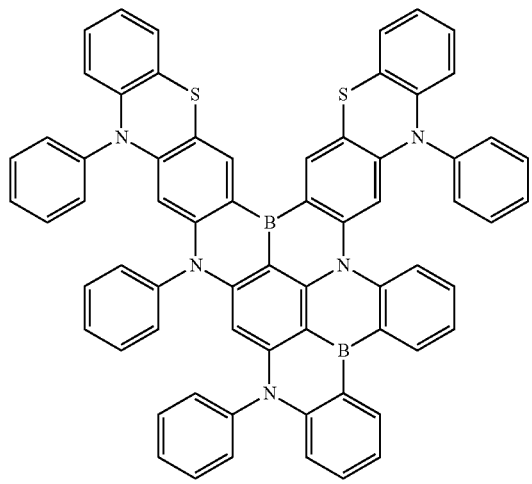
54
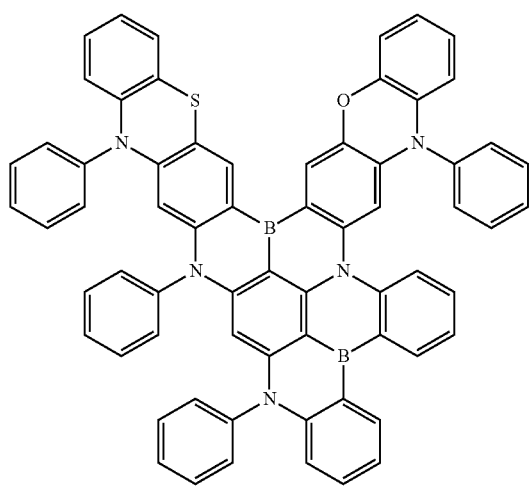
55
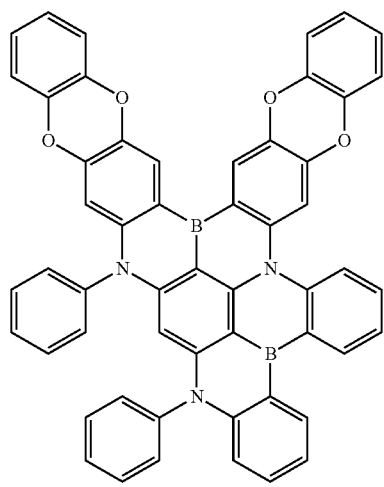
56
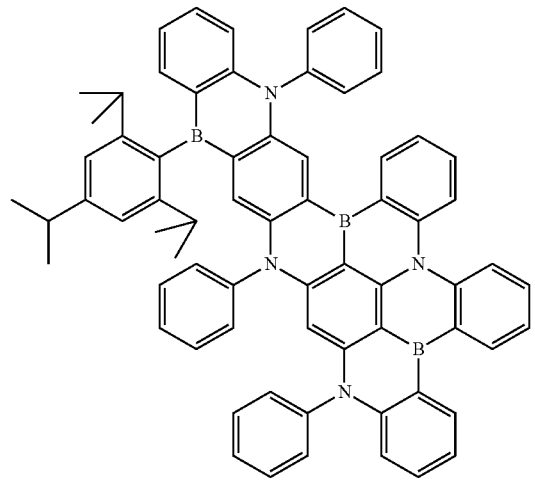
57
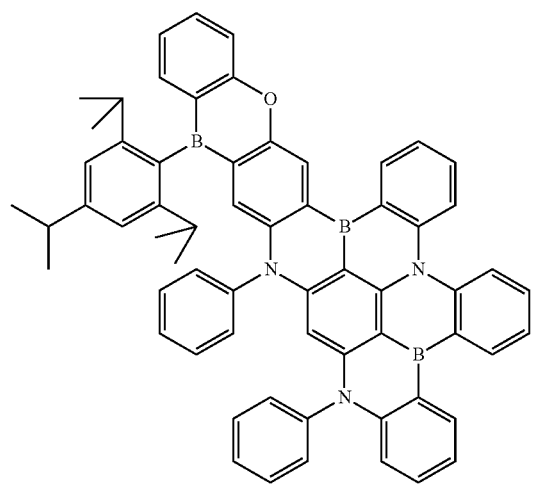
58
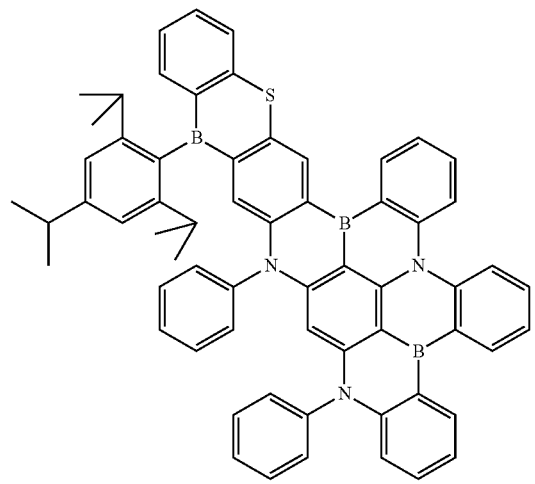

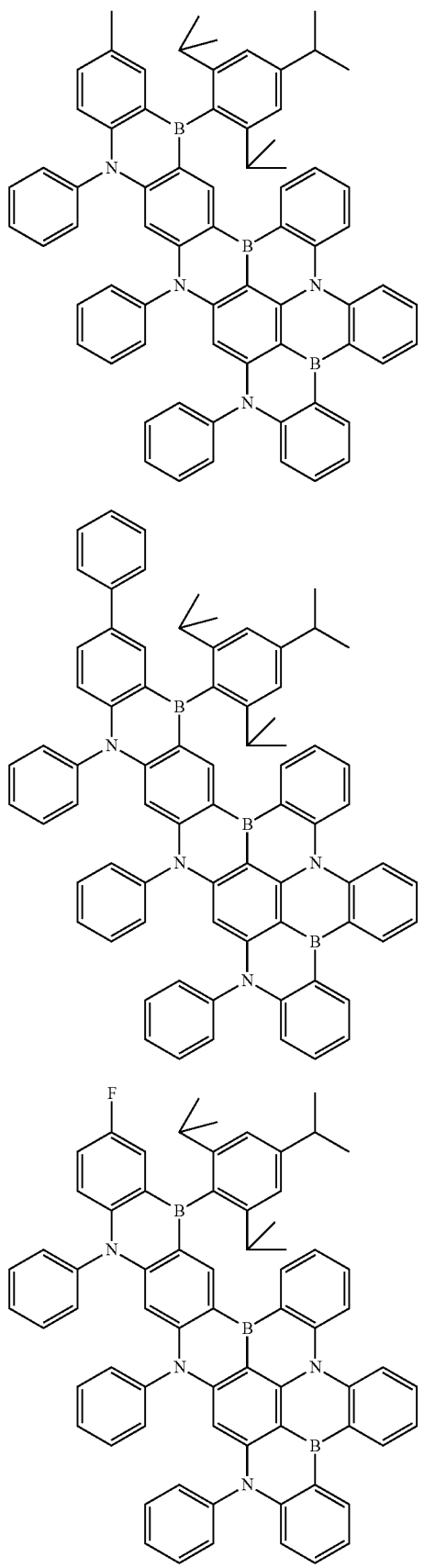
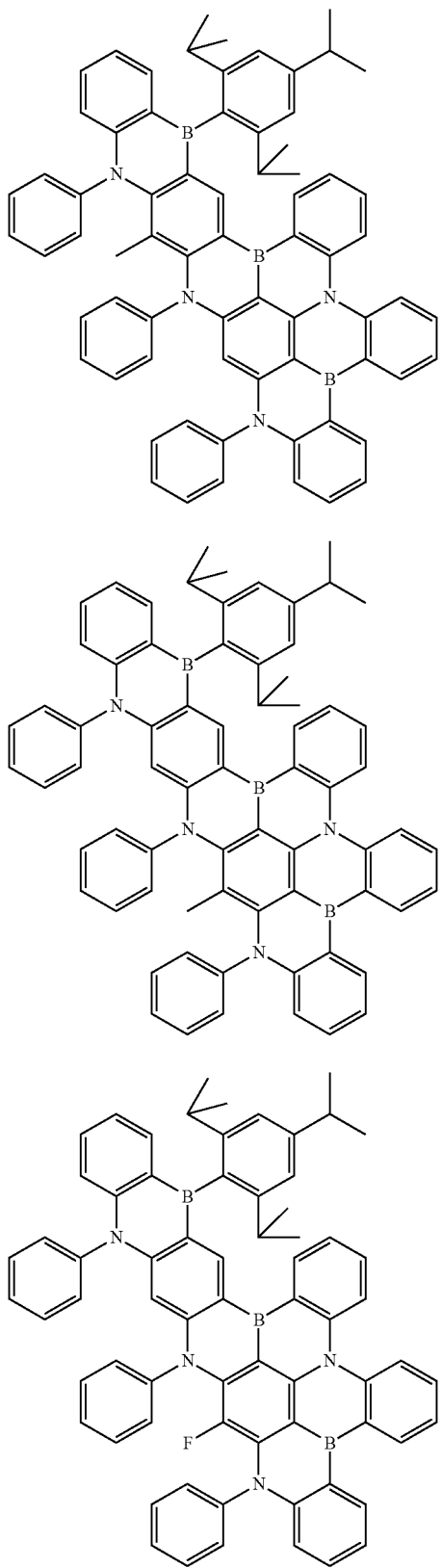

65
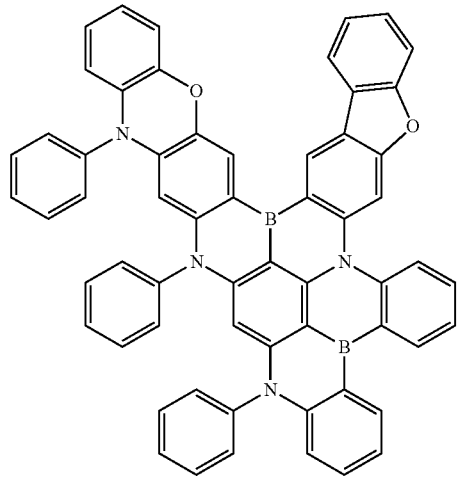
66
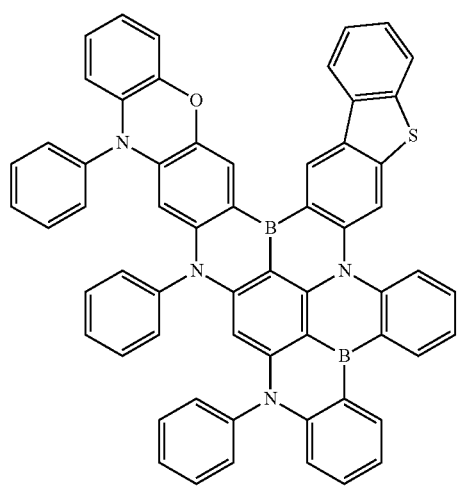
67
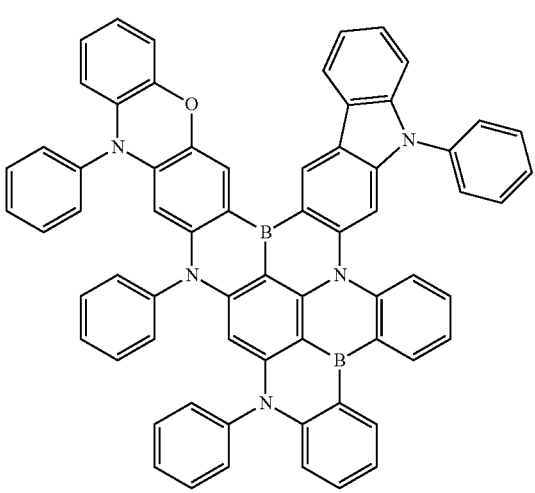
68
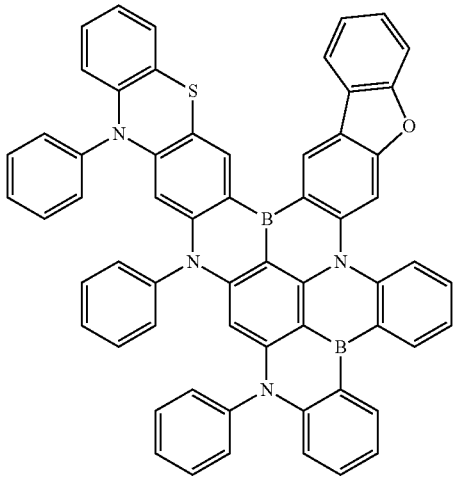
69
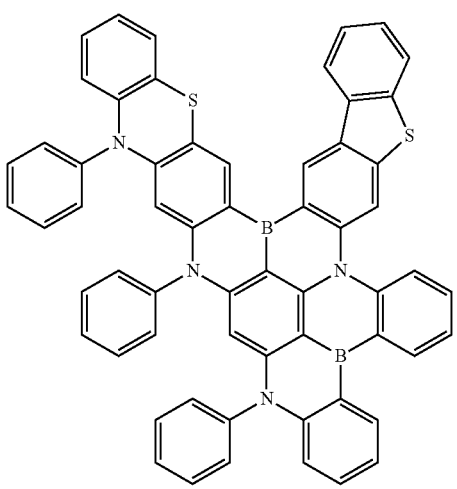
70
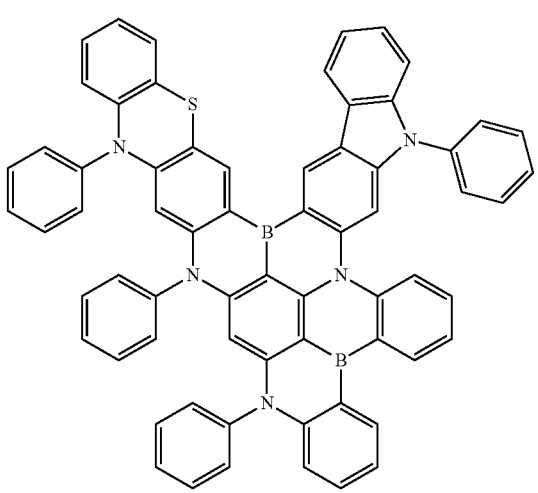

71
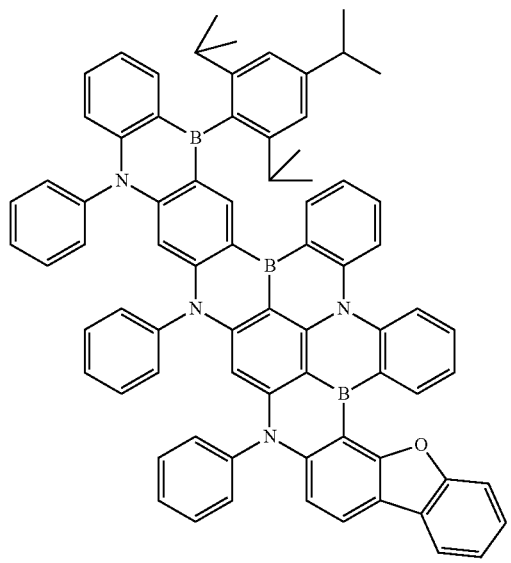
72
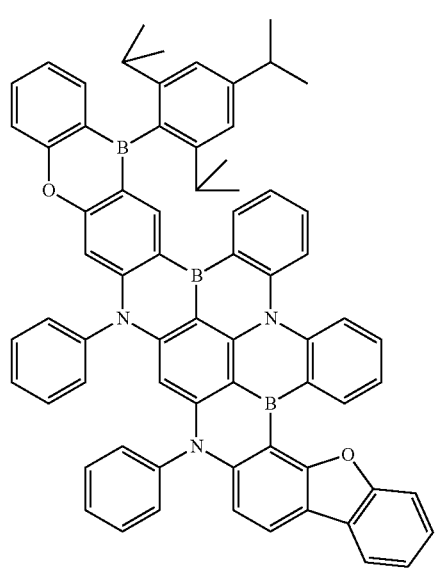
73
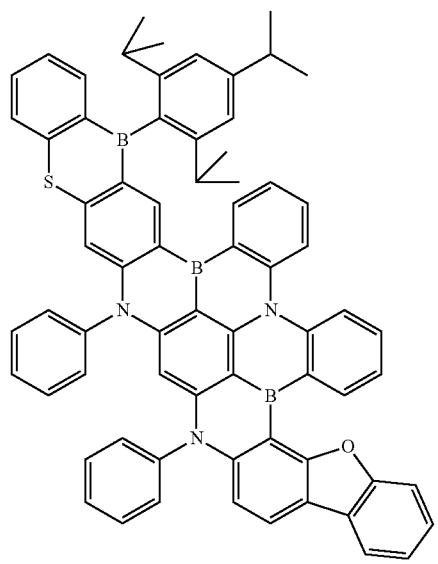
74
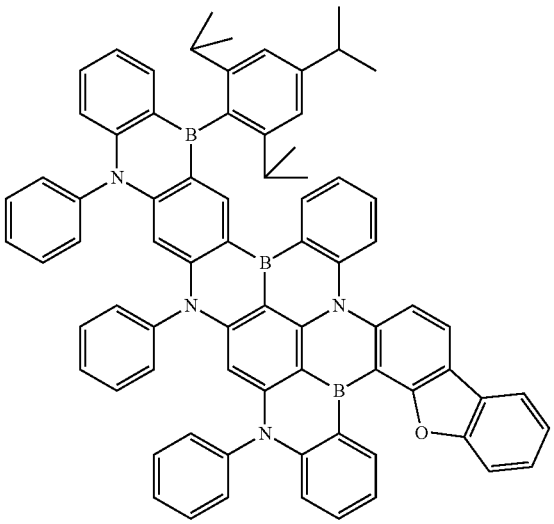
75
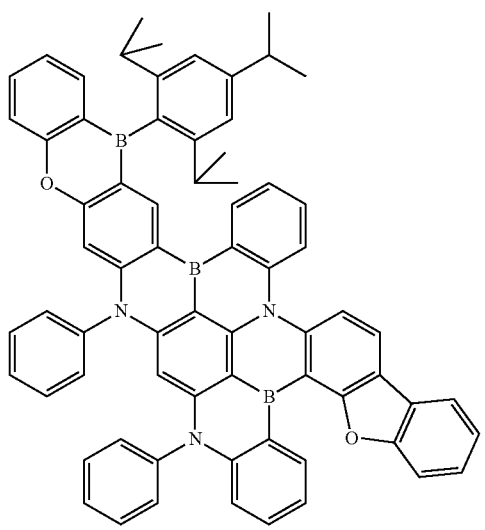
76
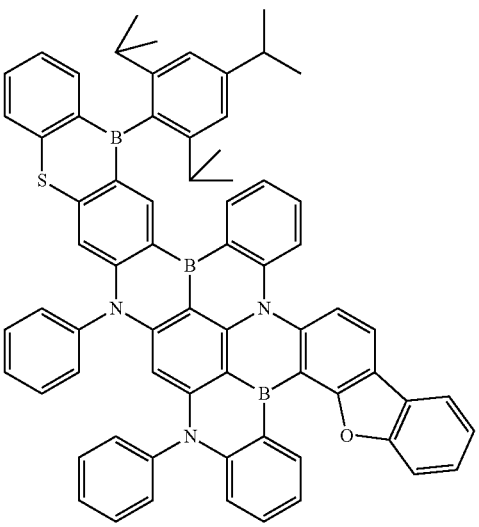

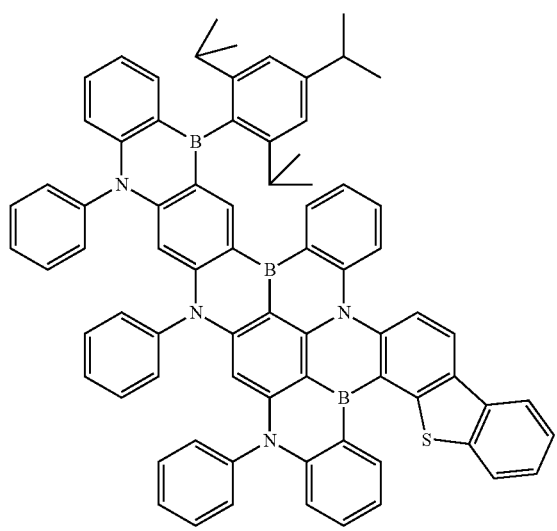

77

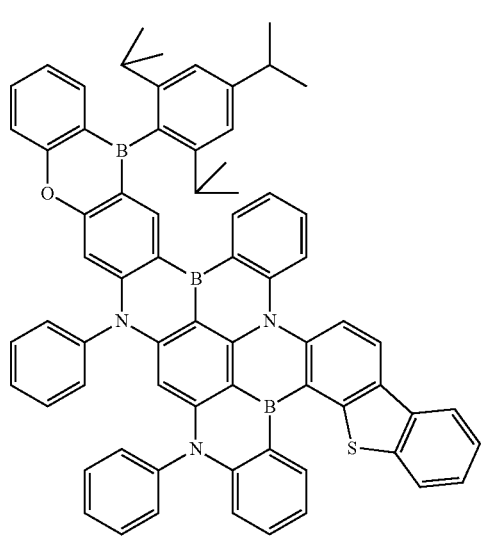

78

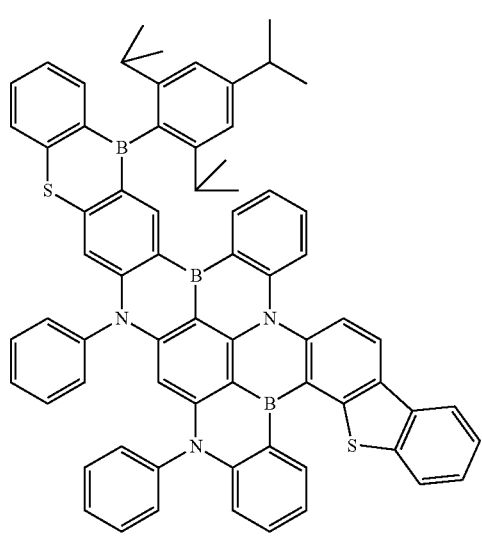

79

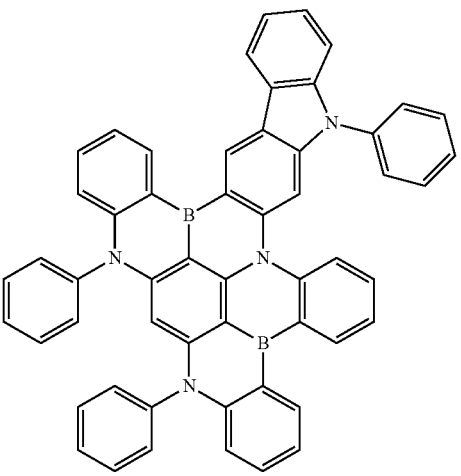

80

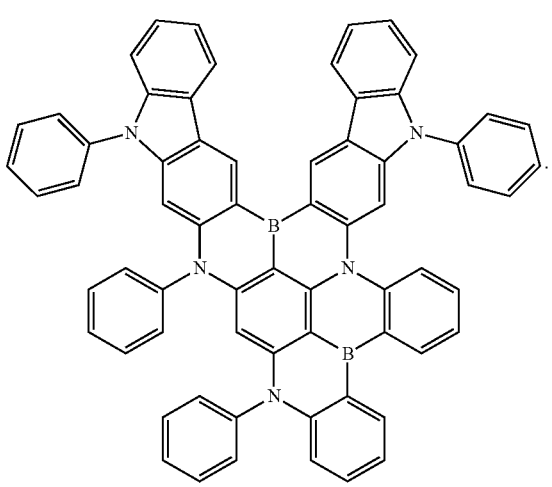

81

In some embodiments, as represented in part by the examples of Compounds 1-D to 3-D, at least one of the hydrogen atoms in the condensed cyclic compound of an embodiment may be substituted with a deuterium atom. For example, any hydrogen atom in the condensed cyclic compound according to an embodiment may be substituted with a deuterium atom.

For example, the condensed cyclic compound of an embodiment may substantially resemble Compound 1-D by having a structure in which a hydrogen atom is substituted with a deuterium atom, compared to e.g., Compound 1, and thus, Compound Group 1 is understood to provide for additional deuterated structures in which any hydrogen atom is substituted with a deuterium atom.

The condensed cyclic compound of an embodiment may be used as a blue luminescent material. For example, the condensed cyclic compound according to an embodiment may be used as a luminescent material to emit blue light having a luminescence center wavelength ($\lambda_{max}$) in a wavelength region of about 490 nm or less. For example, the condensed cyclic compound of an embodiment may be a luminescent material having a luminescence center wavelength in a wavelength region of about 460 nm to about 490 nm. The condensed cyclic compound represented by Formula 1 of an embodiment may be a blue thermally activated delayed fluorescence dopant.

The condensed cyclic compound of an embodiment may be a thermally activated delayed fluorescence emitting material. The emission layer EML in the organic electroluminescence device 10 including the condensed cyclic compound of an embodiment may be to emit delayed fluorescence. For example, the emission layer EML may be to emit thermally activated delayed fluorescence (TADF).

In some embodiments, the organic electroluminescence device 10 of an embodiment may include a plurality of emission layers. The plurality of emission layers may be sequentially stacked, and for example, the organic electroluminescence device 10 including the plurality of emission layers may be to emit white light. The organic electroluminescence device including a plurality of emission layers may be an organic electroluminescence device having a tandem structure. When the organic electroluminescence device 10 includes a plurality of emission layers, at least one emission layer EML may include the above-described condensed cyclic compound of an embodiment.

In an embodiment, the emission layer EML includes a host and a dopant, and may include the above-described condensed cyclic compound of an embodiment as a dopant. For example, the emission layer EML in the organic electroluminescence device 10 of an embodiment may include a host for emitting delayed fluorescence and a dopant for emitting delayed fluorescence, and may include the above-described condensed cyclic compound of an embodiment as a dopant for emitting delayed fluorescence. The emission layer EML may include at least one among the condensed cyclic compounds represented by Compound Group as a thermally activated delayed fluorescence dopant.

In an embodiment, the emission layer EML is a delayed fluorescence emission layer, and the emission layer EML may include any suitable host material and the above-described condensed cyclic compound of an embodiment. For example, in an embodiment, the condensed cyclic compound may be used as a TADF dopant.

In an embodiment, the emission layer may include any suitable host materials. For example, in an embodiment, the emission layer EML may include, as a host material, tris(8-hydroxyquinolinato)aluminum (Alq$_3$), 4,4'-bis(N-carbazolyl)-1,1'-biphenyl (CBP), poly(N-vinylcarbazole (PVK), 9,10-di(naphthalene-2-yl)anthracene (ADN), 4,4',4''-tris (carbazol-9-yl)-triphenylamine (TCTA), 1,3,5-tris(1-phenyl-1H-benz[d]imidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), 2-Methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzo[b,d]furan (PPF), 3,3'-bis(N-carbazolyl)-1,1'-biphenyl (mCBP), 1,3-bis (N-carbazolyl)benzene (mCP), etc. However, embodiments are not limited thereto, and other suitable delayed fluorescence emission host materials may be included.

The emission layer EML in the organic electroluminescence device 10 of an embodiment may further include any suitable dopant material. In an embodiment, the emission layer EML may further include, as dopant materials, styryl derivatives (e.g., 1,4-bis[2-(3-N-ethylcarbazolyl)vinyl]benzene (BCzVB), 4-(di-p-tolylamino)-4'-[(di-p-tolylamino) styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and derivatives thereof (e.g., 2,5,8,11-tetra-t-butylperylene (TBP)), pyrene and derivatives thereof (e.g., 1-dipyrene, 1,4-dipyrenylbenzene, 1,4-bis(N,N-diphenylamino)pyrene), etc.

In the organic electroluminescence device 10 of an embodiment illustrated in FIGS. 1 to 4, the electron transport region ETR is provided on the emission layer EML. The electron transport region ETR may include at least one of a hole blocking layer HBL, an electron transport layer ETL, or an electron injection layer EIL, but embodiments are not limited thereto. The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of a plurality of different materials, or may have a structure in which an electron transport layer ETL/electron injection layer EIL and a hole blocking layer HBL/electron transport layer ETL/ electron injection layer EIL are stacked in order from the emission layer EML, but is not limited thereto. The thickness of the electron transport region ETR may be, for example, about 1000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.).

When the electron transport region ETR includes the electron transport layer ETL, the electron transport region ETR may include an anthracene-based compound. However, the embodiments are not limited thereto, and the electron transport region may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-Tri(1-phenyl-1H-benz[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq$_2$), 9,10-di(naphthalene-2-yl)anthracene (ADN), 1,3-Bis[3,5-di(pyridin-3-yl)phenyl]benzene (BmPyPhB), or a mixture thereof. The thickness of the electron transport layers ETL may be about 100 Å to about 1,000 Å, for example, about 150 Å to about 500 Å. When the thickness of the electron transport layers ETL satisfies the above-described range, satisfactory electron transport characteristics may be obtained without a substantial increase in driving voltage.

When the electron transport region ETR includes the electron injection layer EIL, the electron transport region ETR may be formed using a metal halide such as LiF, NaCl, CsF, RbCl, and RbI, a lanthanide metal (such as ytterbium (Yb)), a metal oxide (such as Li$_2$O and/or BaO), or lithium quinolate (LiQ), etc., but embodiments are not limited thereto. The electron injection layer EIL may also be formed of a mixture material of an electron transport material and an insulating organo-metal salt. The organo-metal salt may be a material having an energy band gap of about 4 eV or more. The organo-metal salt may include, for example, metal acetates, metal benzoates, metal acetoacetates, metal acetylacetonates, and/or metal stearates. The thickness of the electron injection layers EIL may be about 1 Å to about 100 Å, and about 3 Å to about 90 Å. When the thickness of the electron injection layer EIL satisfies the above-described range, satisfactory electron injection properties may be obtained without a substantial increase in driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen), but is not limited thereto.

The second electrode EL2 is provided on the electron transport region ETR. The second electrode EL2 may be a common electrode or cathode. The second electrode EL2 may be a transmissive electrode, a transflective electrode, or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, In, Zn, Sn, Yb, or a compound or mixture thereof (e.g., AgMg, AgYb, or MgAg). In some embodiments, the first electrode EL1 may have a multilayer structure including a reflective layer or a transflective layer formed of the above-described materials, and a transparent conductive layer formed of ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the organic electroluminescence device 10 according to an embodiment. The capping layer CPL may include, for example, α-NPD, NPB, TPD, m-MTDATA, Alq₃, CuPc, N4,N4,N4',N4'-tetra (biphenyl-4-yl) biphenyl-4,4'-diamine (TPD15), 4,4',4"-tris (carbazol-9-yl)triphenylamine (TCTA), N, N'-bis(naphthalen-1-yl), etc. However, embodiments are not limited thereto, and a capping layer CPL may include an amine compound. For example, the capping layer CPL may include at least one of Compound CPL1 or Compound CPL2:

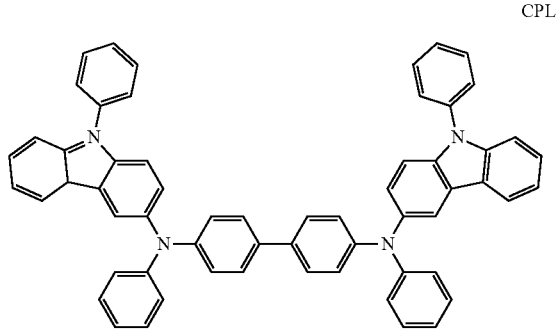

CPL1

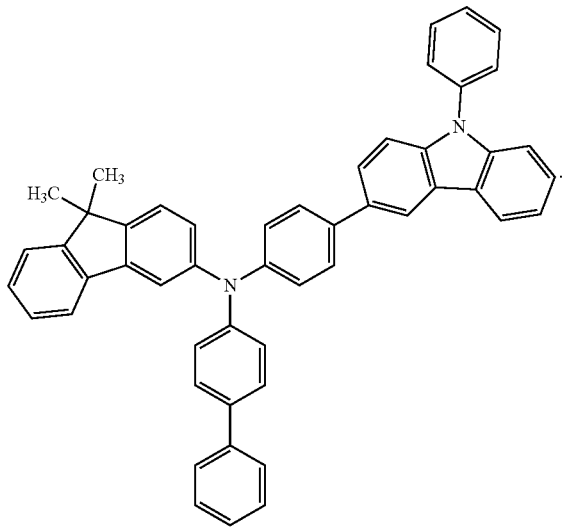

CPL2

In some embodiments, the refractive index of the capping layer CPL may be 1.6 or more. For example, the refractive index of the capping layer CPL may be 1.6 or more with respect to light in a wavelength range of about 550 nm to about 660 nm.

The organic electroluminescence device 10 according to an embodiment of the present disclosure may include the above-described condensed cyclic compound of an embodiment in the emission layer EML disposed between the first electrode EL1 and the second electrode EL2 to thereby exhibit excellent luminous efficiency. In some embodiments, the organic electroluminescence device of an embodiment may exhibit high luminous efficiency in an emission wavelength region of blue light. In addition, the condensed cyclic compound according to an embodiment may be a thermally activated delayed fluorescence dopant, and the emission layer EML may include the compound of an embodiment to emit a thermally activated delayed fluorescence, enabling good luminous efficiency characteristics.

Meanwhile, the above-described condensed cyclic compound of an embodiment may be included in an organic layer (e.g., a second or separate organic layer) in addition to the emission layer EML. For example, the organic electroluminescence device 10 according to an embodiment of the present disclosure may also include the above-described condensed cyclic compound in at least one functional layer disposed between the first electrode EL1 and the second electrode EL2, or in the capping layer CPL disposed on the second electrode EL2.

The above-described condensed cyclic compound of an embodiment may include heterocycle structures that are condensed and bonded to a core moiety in which benzoazaborine or dibenzoazaborine is condensed, thereby providing an expanded conjugated system. Accordingly, the condensed cyclic compound of an embodiment may be used as a luminescent material having high efficiency characteristics due to increased resonance effects in the molecule. Furthermore, the organic electroluminescence device of an embodiment including the condensed cyclic compound of an embodiment in the emission layer EML may be to emit blue light and exhibit high efficiency characteristics.

Hereinafter, with reference to Examples and Comparative Examples, a condensed cyclic compound according to an embodiment of this present disclosure and an organic electroluminescence device of an embodiment will be described in more detail. In addition, the Examples shown below are illustrated only for the understanding of this present disclosure, and the scope of the present disclosure is not limited thereto.

EXAMPLES

1. Example Synthesis of Condensed Cyclic Compound

First, a synthetic method of the condensed cyclic compound according to the current embodiment will be described by illustrating synthetic methods of compounds 1, 2, 3, 41, 52, 55, and 67. The following methods are provided as examples, but the synthetic method according to an embodiment of the present disclosure is not limited to the following examples.

(1) Synthesis of Compound 1

Compound 1 according to an example may be synthesized by, for example, the steps (tasks) shown in Reaction Formula 1:

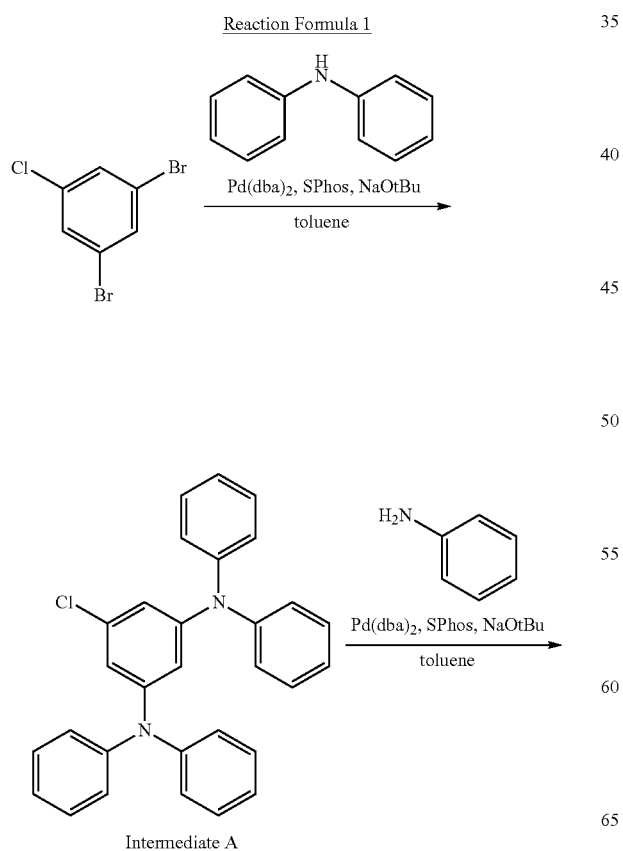

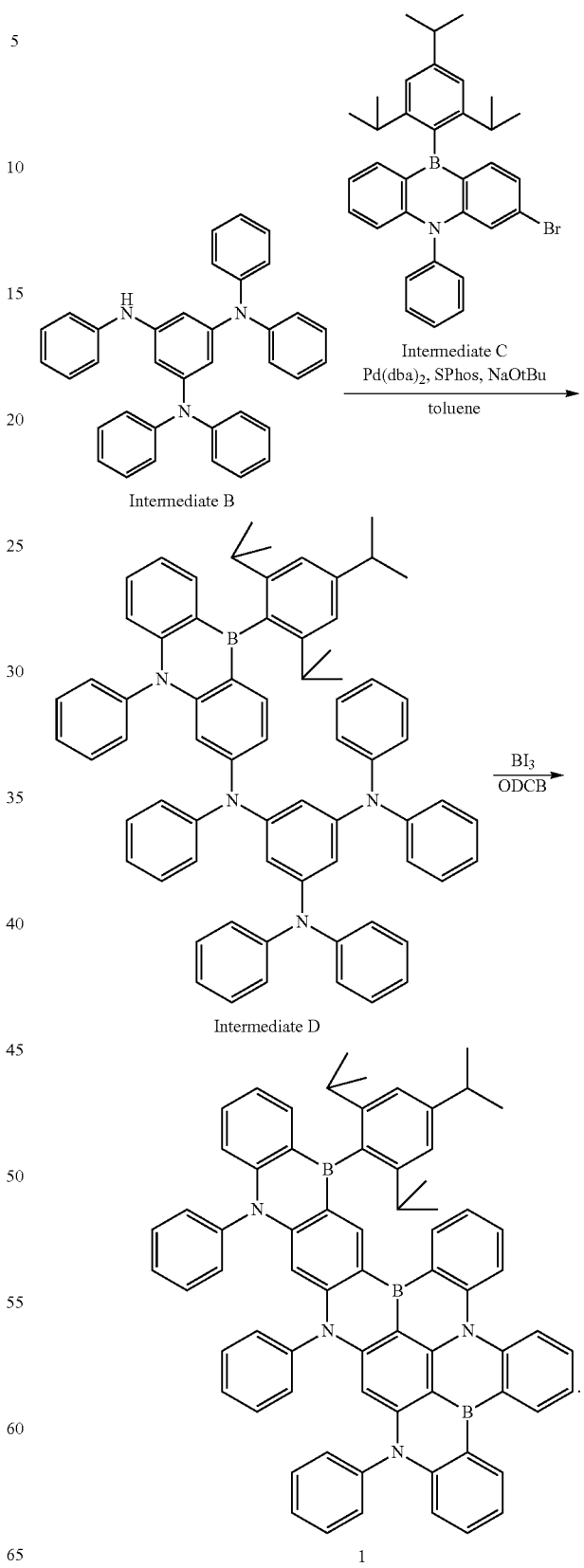

Synthesis of Intermediate A

In an argon (Ar) atmosphere, in a 1000 mL three-neck flask, 1,3-dibromo-5-chlorobenzene (50.0 g), diphenylamine (62.6 g), bis(dibenzylidene acetone) palladium(0) (Pd(dba)$_2$, 2.12 g), 2-dicyclohexylphosphino-2',6'-dimethoxybiphenyl (SPhos, 1.56 g), and sodium tert-butoxide (NaOtBu, 36.0 g) were added and dissolved in 500 mL of toluene and heated under reflux for 2 hours. After cooling to room temperature, the resulting product was extracted with CH$_2$Cl$_2$ by adding water to obtain an organic layer. Then, the organic layer was dried with MgSO$_4$, and the solvent was removed by distillation under reduced pressure. The resulting crude product was purified by silica gel column chromatography to obtain Intermediate A (74.4 g, yield 90%). The molecular weight of Intermediate A as measured by FAB-MS measurement was 446.

Synthesis of Intermediate B

In an Ar atmosphere, in a 500 mL three-neck flask, Intermediate A (35.0 g), aniline (10.9 g), Pd(dba)$_2$ (0.45 g), SPhos (0.32 g), and NaOtBu (11.3 g) were added and dissolved in 200 mL of toluene and heated under reflux for 1 hour. After cooling to room temperature, water was added to the reaction and the mixture was extracted with CH$_2$Cl$_2$ to obtain an organic layer. Then, the organic layer was dried with MgSO$_4$, and the solvent was removed by distillation under reduced pressure. The resulting crude product was purified by sonication in ethanol to obtain Intermediate B (37.1 g, yield 94%). The molecular weight of Intermediate B measured by FAB-MS measurement was 503.

Synthesis of Intermediate C

Intermediate C, which is an azaborine derivative, was synthesized with reference to Park, S. et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion," *Adv. Funct. Mater.* 2018, 28, 1802031, the entire content of which is incorporated herein by reference.

Synthesis of Intermediate D

In an Ar atmosphere, in a 500 mL three-neck flask, Intermediate B (10.0 g), Intermediate C (10.7 g), Pd(dba)$_2$ (0.11 g), SPhos (0.08 g), and NaOtBu (1.91 g) were added and dissolved in 100 mL of toluene and heated under reflux for 3 hours. Water was added to the reaction and the mixture was extracted with CH$_2$Cl$_2$ to obtain an organic layer. The organic layer was dried with MgSO$_4$, and the solvent was removed by distillation under reduced pressure. The resulting crude product was purified by a silica gel column chromatography to obtain Intermediate D (16.9 g, yield 89%). The molecular weight of Intermediate D measured by FAB-MS measurement was 959.

Synthesis of Compound 1

In an Ar atmosphere, in a 300 mL three-neck flask, Intermediate D (16.0 g) was added and dissolved in 100 mL of o-dichlorobenzene (ODCB) and cooled to 0° C. in an ice bath. Boron triiodide (BI$_3$, 19.6 g) was added thereto and the mixture was heated and stirred at 150° C. for 18 hours. Then, the mixture was cooled to 0° C. in the ice bath and 25 mL of triethylamine was added thereto. Then, after the temperature was returned to room temperature, the reaction solution was filtered with silica gel and the residual solvent was removed by distillation under reduced pressure. The resulting crude product was purified by recrystallization from toluene to obtain Compound 1 (1.20 g, yield 7%). The molecular weight of Compound 1 measured by FAB-MS measurement was 974.

(2) Synthesis of Compound 2

Compound 2 according to an example may be synthesized by, for example, the steps shown in Reaction Formula 2:

Reaction Formula 2

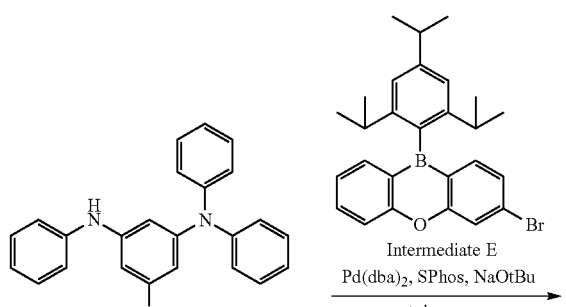

Intermediate B

Intermediate E
Pd(dba)$_2$, SPhos, NaOtBu
toluene

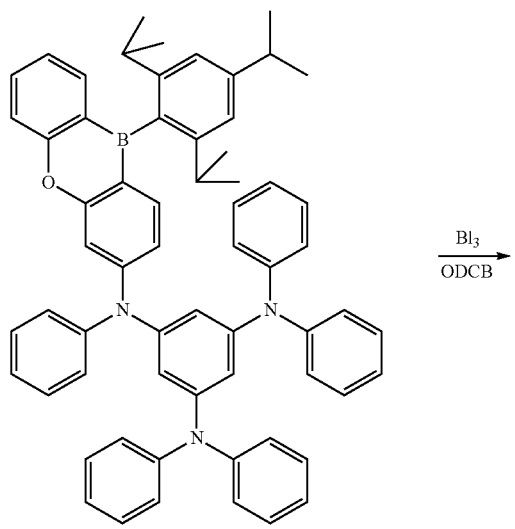

Intermediate F

BI$_3$
ODCB

-continued

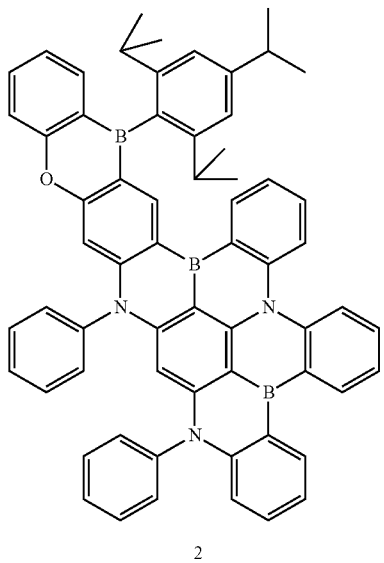

2

Synthesis of Intermediate E

Intermediate E, which is an oxaborine derivative, was synthesized with reference to Numata, M. et al., "High efficiency pure blue thermally activated delayed fluorescence molecules having 10H-phenoxaborin and acridan units," *Chem. Commun.* 2015, 51, 9443-9446, the entire content of which is incorporated herein by reference.

Synthesis of Intermediate F

In an Ar atmosphere, in a 500 mL three-neck flask, Intermediate B (10.0 g), Intermediate E (9.16 g), Pd(dba)$_2$ (0.11 g), SPhos (0.08 g), and NaOtBu (1.91 g) were added and dissolved in 100 mL of toluene and heated under reflux for 3 hours. After cooling to room temperature, water was added to the reaction and the mixture was extracted with CH$_2$Cl$_2$ to obtain an organic layer. Then, the organic layer was dried with MgSO$_4$, and the solvent was removed by distillation under reduced pressure. The resulting crude product was purified by a silica gel column chromatography to obtain Intermediate F (16.1 g, yield 92%). The molecular weight of Intermediate F measured by FAB-MS measurement was 883.

Synthesis of Compound 2

In an Ar atmosphere, in a 300 mL three-neck flask, Intermediate F (16.0 g) was added and dissolved in 100 mL of ODCB and cooled to 0° C. in an ice bath. Then, BI$_3$ (19.6 g) was added thereto and the mixture was heated and stirred at 150° C. for 18 hours. The mixture was cooled to 0° C. in the ice bath and 25 mL of triethylamine was added thereto. Then, after the temperature was returned to room temperature, the reaction solution was filtered with silica gel and the residual solvent was removed by distillation under reduced pressure. The resulting crude product was purified by recrystallization from toluene to obtain Compound 2 (1.01 g, yield 6%). The molecular weight of Compound 2 measured by FAB-MS measurement was 899.

(3) Synthesis of Compound 3

Compound 3 according to an example may be synthesized by, for example, the steps shown in Reaction Formula 3:

Reaction Formula 3

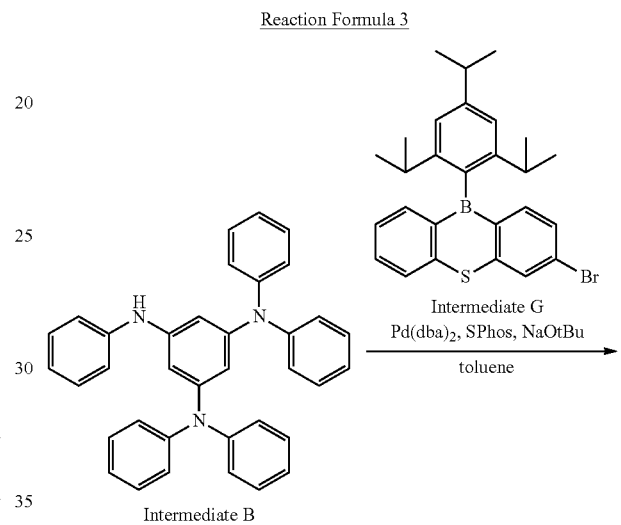

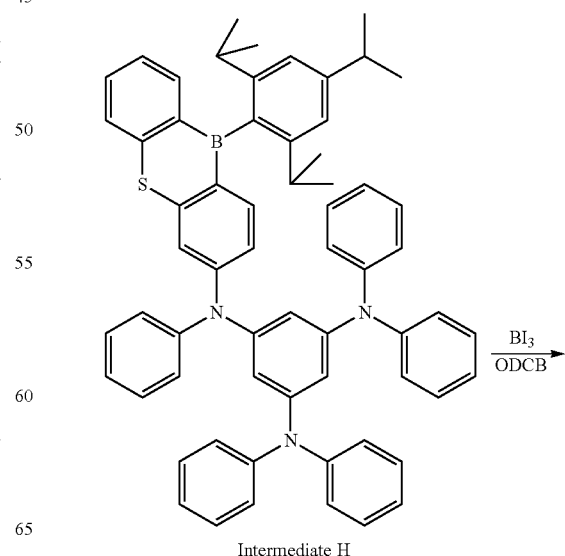

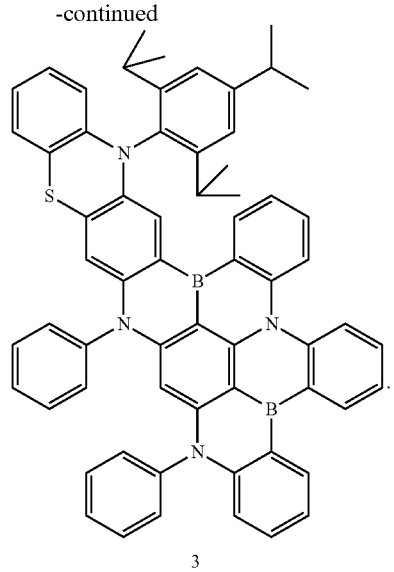

3

Synthesis of Intermediate G

Intermediate G, which is a thiaborine derivative, was synthesized with reference to Park, S. et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion," *Adv. Funct. Mater.* 2018, 28, 1802031.

Synthesis of Intermediate H

In an Ar atmosphere, in a 500 mL three-neck flask, Intermediate B (10.0 g), Intermediate G (9.48 g), Pd(dba)$_2$ (0.11 g), SPhos (0.08 g), and NaOtBu (1.91 g) were added and dissolved in 100 mL of toluene and heated under reflux for 3 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate H (15.3 g, yield 86%). The molecular weight of Intermediate H measured by FAB-MS measurement was 900.

Synthesis of Compound 3

In an Ar atmosphere, in a 300 mL three-neck flask, Intermediate H (15.0 g) was added and dissolved in 100 mL of ODCB and cooled to 0° C. in an ice bath. Then, BI$_3$ (19.6 g) was added thereto and the mixture was heated and stirred at 150° C. for 18 hours. The mixture was cooled to 0° C. in the ice bath and 23 mL of triethylamine was added thereto. Then, after the temperature was returned to room temperature, the reaction solution was filtered with silica gel and the residual solvent was removed by distillation under reduced pressure. The resulting crude product was recrystallized from toluene and purified to obtain Compound 3 (0.87 g, yield 6%). The molecular weight of Compound 3 measured by FAB-MS measurement was 915.

(4) Synthesis of Compound 41

Compound 41 according to an example may be synthesized by, for example, the steps shown in Reaction Formula 4:

Reaction Formula 4

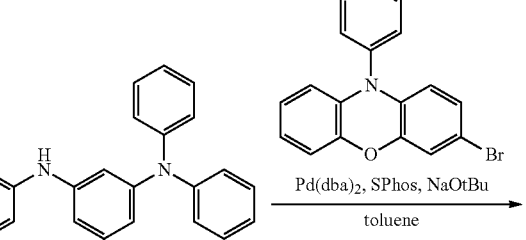

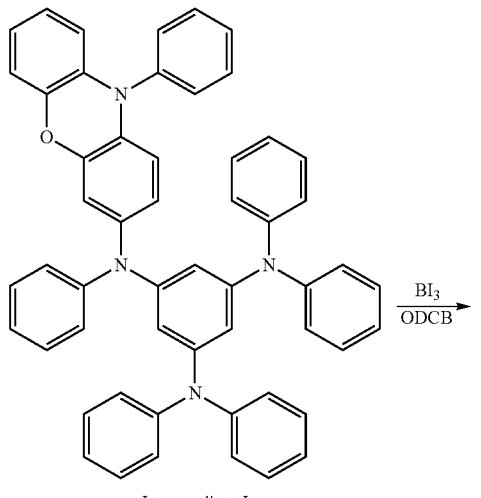

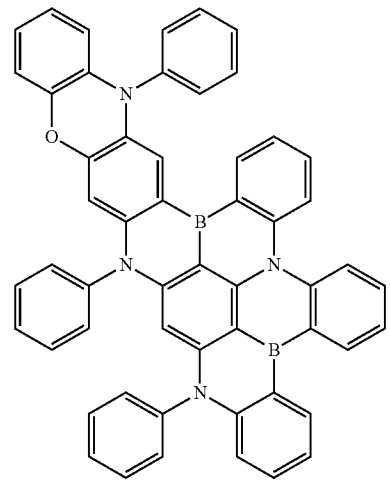

Synthesis of Intermediate J

In an Ar atmosphere, in a 500 mL three-neck flask, Intermediate B (15.0 g), 3-bromo-10-phenylphenoxazine (10.1 g), Pd(dba)$_2$ (0.17 g), SPhos (0.12 g), and NaOtBu (2.86 g) were added and dissolved in 100 mL of toluene and heated under reflux for 3 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate J (17.4 g, yield 77%). The molecular weight of Intermediate J measured by FAB-MS measurement was 760.

Synthesis of Compound 41

In an Ar atmosphere, in a 300 mL three-neck flask, Intermediate J (15.0 g) was added and dissolved in 100 mL of ODCB. Then, the mixture was cooled to 0° C. in an ice bath, BI$_3$ (19.6 g) was added thereto, and the mixture was heated and stirred at 150° C. for 18 hours. The mixture was cooled to 0° C. in the ice bath and 27 mL of triethylamine was added thereto. After the temperature was returned to room temperature, the reaction solution was filtered with a silica gel and the residual solvent was removed by distillation under reduced pressure. The resulting crude product was purified by recrystallization from toluene to obtain Compound 41 (1.84 g, yield 12%). The molecular weight of Compound 41 measured by FAB-MS measurement was 776.

(5) Synthesis of Compound 52

Compound 52 according to an example may be synthesized by, for example, the steps shown in Reaction Formula 5:

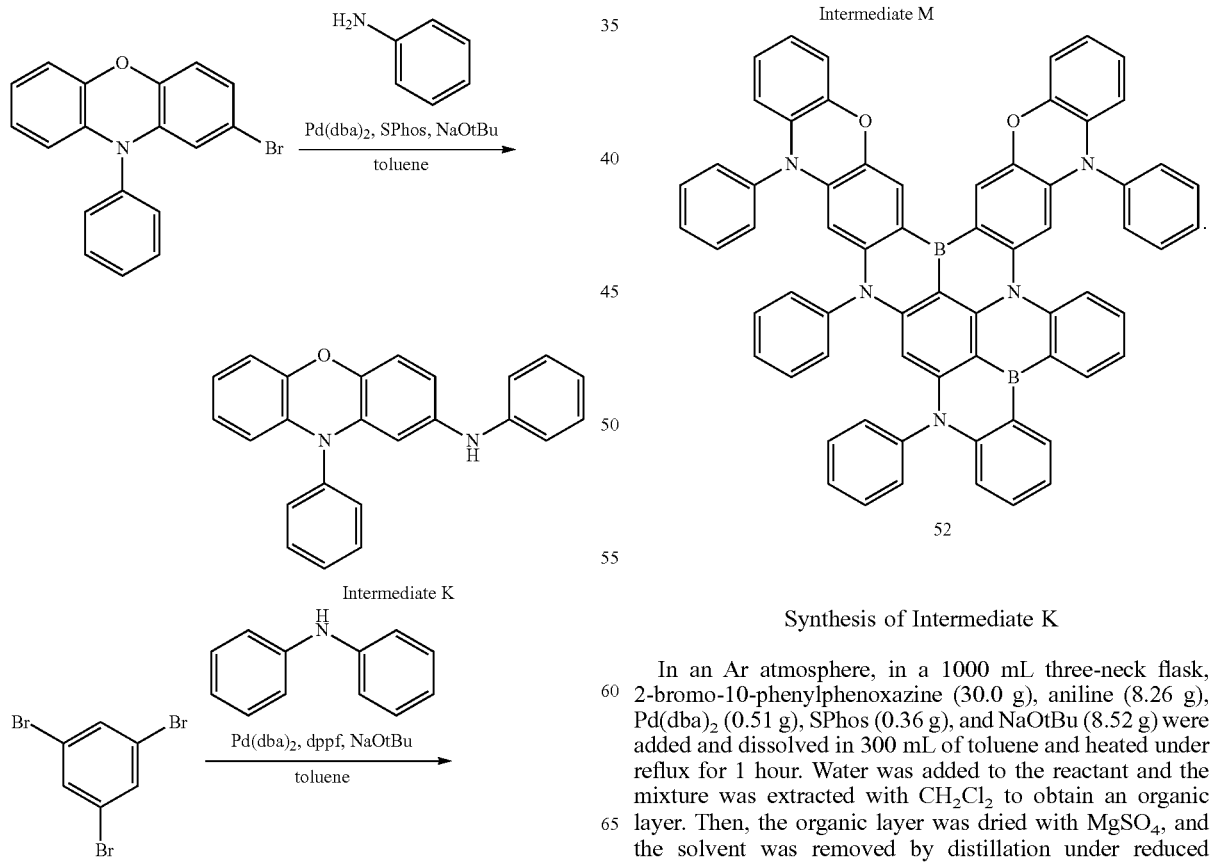

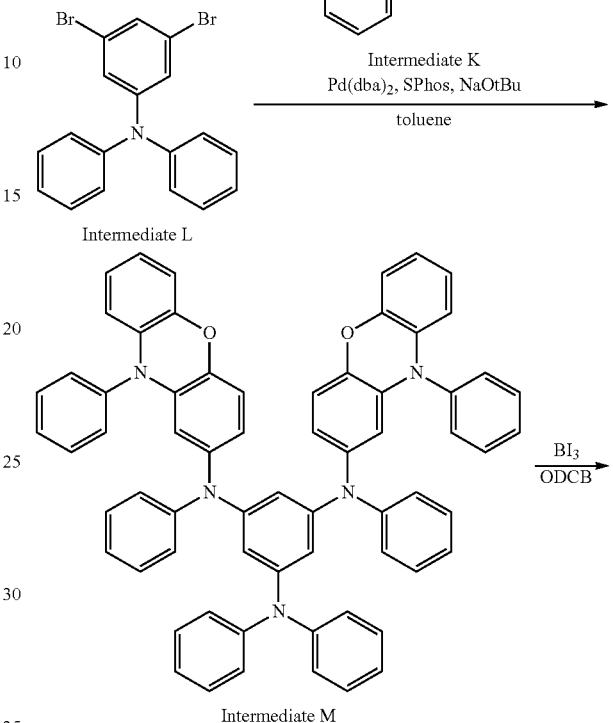

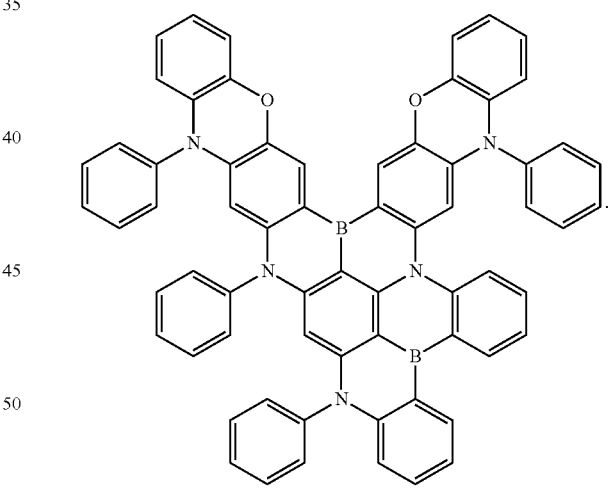

Synthesis of Intermediate K

In an Ar atmosphere, in a 1000 mL three-neck flask, 2-bromo-10-phenylphenoxazine (30.0 g), aniline (8.26 g), Pd(dba)$_2$ (0.51 g), SPhos (0.36 g), and NaOtBu (8.52 g) were added and dissolved in 300 mL of toluene and heated under reflux for 1 hour. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate K (23.3 g, yield 75%). The molecular weight of Intermediate K measured by FAB-MS measurement was 350.

Synthesis of Intermediate L

In an Ar atmosphere, in a 1000 mL three-neck flask, 1,3,5-tribromobenzene (50.0 g), diphenylamine (26.8 g), Pd(dba)$_2$ (0.91 g), bis(diphenylphosphino)ferrocene (dppf, 1.76 g), and NaOtBu (15.3 g) were added and dissolved in 300 mL of toluene and heated under reflux for 2 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate L (25.6 g, yield 40%). The molecular weight of Intermediate L measured by FAB-MS measurement was 403.

Synthesis of Intermediate M

In an Ar atmosphere, in a 500 mL three-neck flask, Intermediate L (10.0 g), Intermediate K (17.4 g), Pd(dba)$_2$ (0.14 g), SPhos (0.10 g), and NaOtBu (4.80 g) were added and dissolved in 100 mL of toluene and heated under reflux for 3 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate M (15.9 g, yield 68%). The molecular weight of Intermediate M measured by FAB-MS measurement was 942.

Synthesis of Compound 52

In an Ar atmosphere, in a 300 mL three-neck flask, Intermediate M (15.0 g) was added and dissolved in 100 mL of ODCB and cooled to 0° C. in an ice bath. Then, BI$_3$ (19.6 g) was added thereto and the mixture was heated and stirred at 150° C. for 18 hours. The mixture was cooled to 0° C. in the ice bath and 22 mL of triethylamine was added thereto. After the temperature was returned to room temperature, the reaction solution was filtered with silica gel and the residual solvent was removed by distillation under reduced pressure. The resulting crude product was purified by recrystallization from toluene to obtain Compound 52 (2.09 g, yield 14%). The molecular weight of Compound 52 measured by FAB-MS measurement was 957.

(6) Synthesis of Compound 55

Compound 55 according to an example may be synthesized by, for example, the steps shown in Reaction Formula 6:

Reaction Formula 6

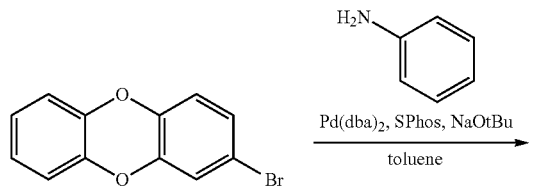

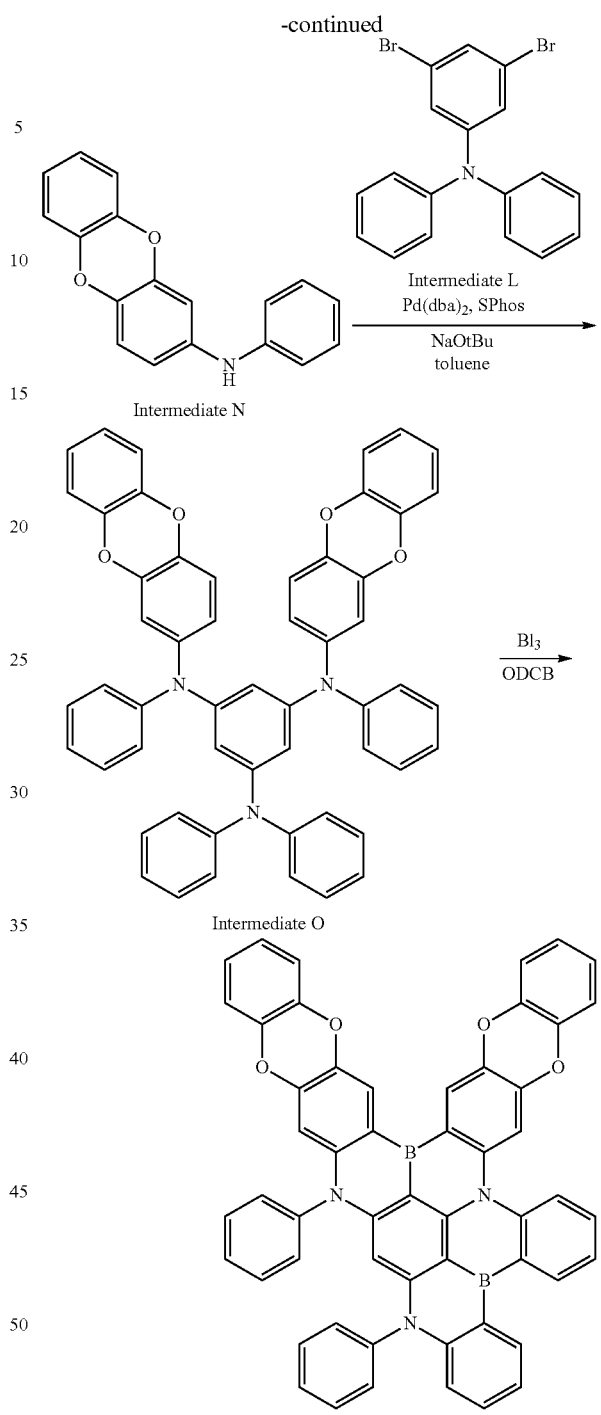

Synthesis of Intermediate N

In an Ar atmosphere, in a 1000 mL three-neck flask, 2-bromodibenzodioxin (30.0 g), aniline (10.6 g), Pd(dba)$_2$ (0.66 g), SPhos (0.46 g), and NaOtBu (11.0 g) were added and dissolved in 400 mL of toluene and heated under reflux for 3 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate N (21.9 g, yield 70%). The molecular weight of Intermediate N measured by FAB-MS measurement was 275.

Synthesis of Intermediate O

In an Ar atmosphere, in a 1000 mL three-neck flask, Intermediate N (20.0 g), Intermediate L (14.6 g), Pd(dba)$_2$ (0.41 g), SPhos (0.30 g), and NaOtBu (6.98 g) were added and dissolved in 250 mL of toluene and heated under reflux for 4 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by a silica gel column chromatography to obtain Intermediate O (18.7 g, yield 65%). The molecular weight of Intermediate O measured by FAB-MS measurement was 791.

Synthesis of Compound 55

In an Ar atmosphere, in a 300 mL three-neck flask, Intermediate O (15.0 g) was added and dissolved in 100 mL of ODCB and cooled to 0° C. in an ice bath. Then, BI$_3$ (19.6 g) was added thereto and the mixture was heated and stirred at 150° C. for 18 hours. The mixture was cooled to 0° C. in the ice bath and 26 mL of triethylamine was added thereto. After the temperature was returned to room temperature, the reaction solution was filtered with silica gel and the residual solvent was removed by distillation under reduced pressure. The resulting crude product was purified by recrystallization from toluene to obtain Compound 55 (2.73 g, yield 18%). The molecular weight of Compound 55 measured by FAB-MS measurement was 799.

(7) Synthesis of Compound 67

Compound 67 according to an example may be synthesized by, for example, the steps shown in Reaction Formula 7:

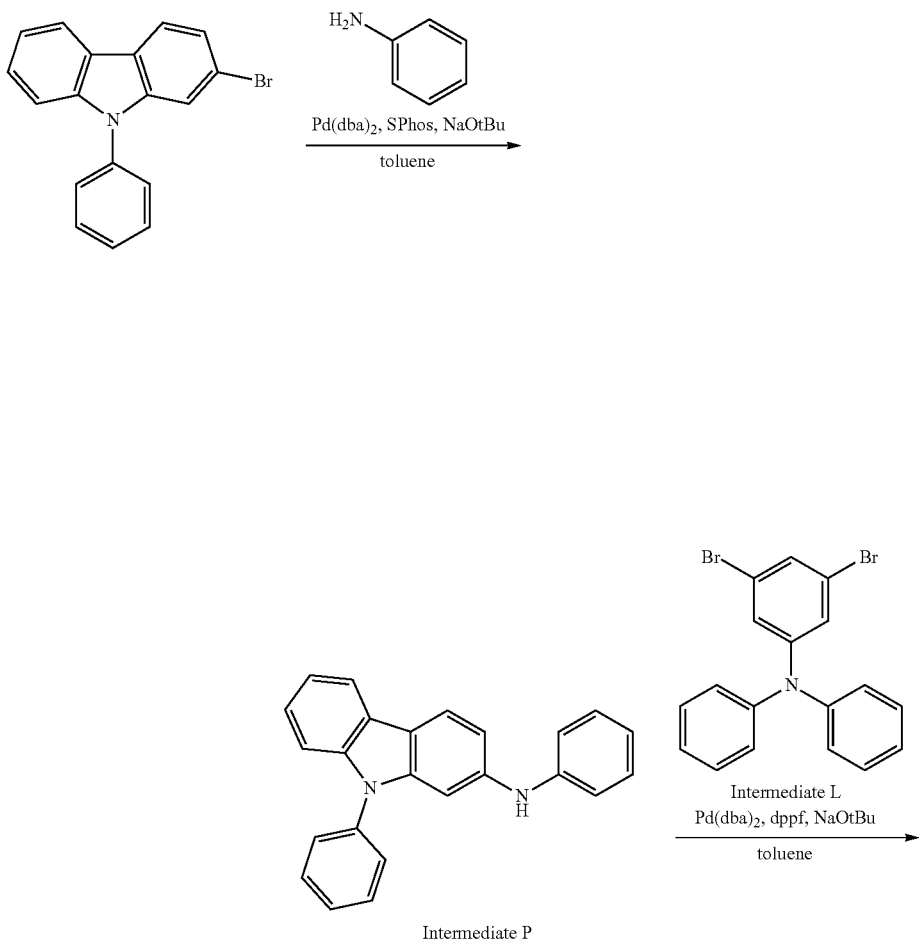

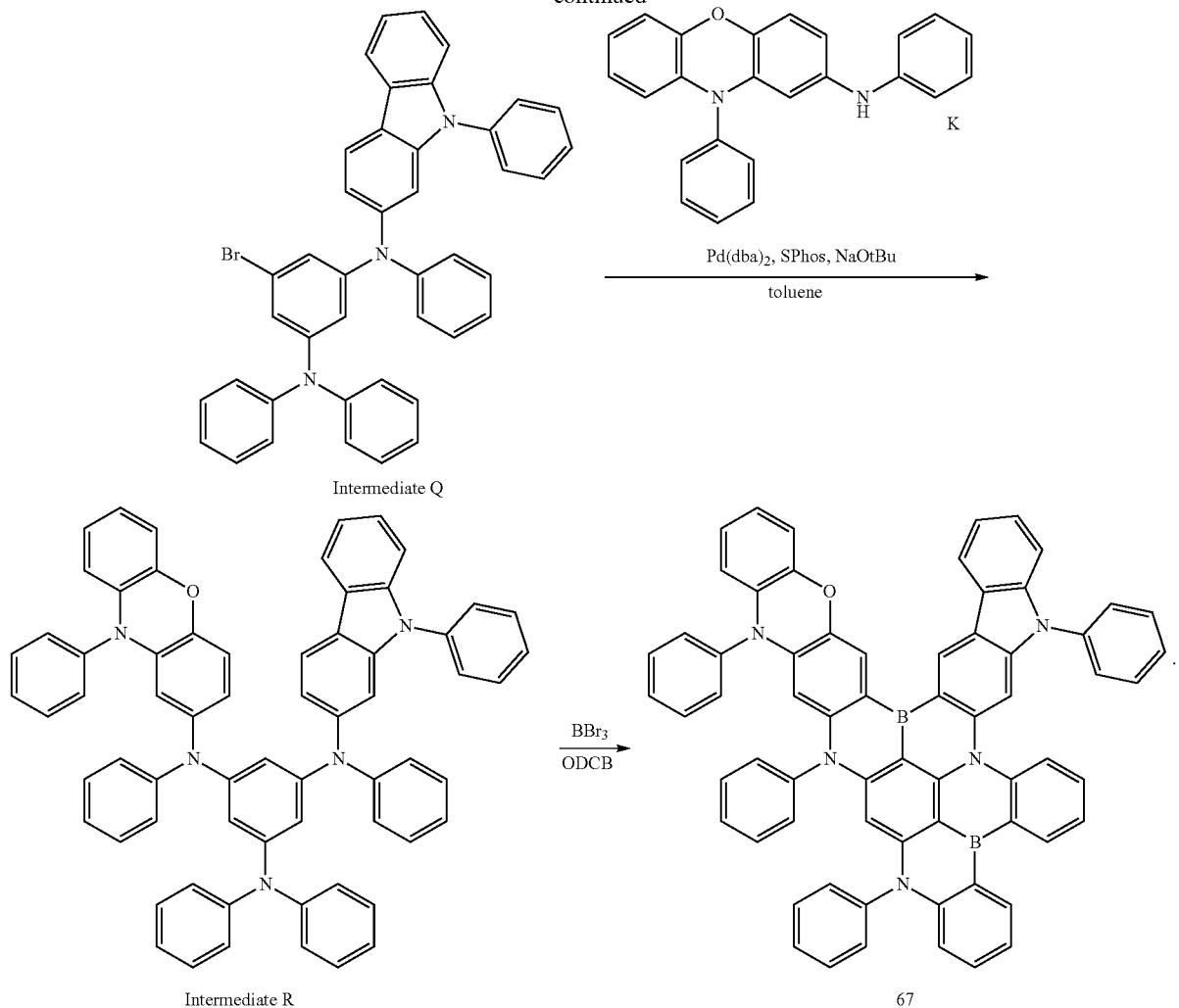

Synthesis of Intermediate P

In an Ar atmosphere, in a 1000 mL three-neck flask, 2-bromo-9-phenyl-9H-carbazole (50.0 g), aniline (14.5 g), Pd(dba)$_2$ (0.90 g), SPhos (0.64 g), and NaOtBu (14.9 g) were added and dissolved in 400 mL of toluene and heated under reflux for 3 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate P (35.3 g, yield 68%). The molecular weight of Intermediate P measured by FAB-MS measurement was 334.

Synthesis of Intermediate Q

In an Ar atmosphere, in a 1000 mL three-neck flask, Intermediate P (20.0 g), Intermediate L (24.1 g), Pd(dba)$_2$ (0.34 g), dppf (0.66 g), and NaOtBu (5.74 g) were added and dissolved in 200 mL of toluene and heated under reflux for 2 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate Q (20.4 g, yield 52%). The molecular weight of Intermediate Q measured by FAB-MS measurement was 656.

Synthesis of Intermediate R

In an Ar atmosphere, in a 500 mL three-neck flask, Intermediate Q (19.0 g), Intermediate K (10.1 g), Pd(dba)$_2$ (0.16 g), SPhos (0.12 g), and NaOtBu (2.78 g) were added and dissolve in 100 mL of toluene and heated under reflux for 3 hours. Water was added to the reactant and the mixture was extracted with CH$_2$Cl$_2$ to obtain an organic layer. Then, the organic layer was dried with MgSO$_4$, and the solvent was removed by distillation under reduced pressure. The resulting crude product was purified by silica gel column chromatography to obtain Intermediate R (17.4 g, yield 65%). The molecular weight of Intermediate R measured by FAB-MS measurement was 926.

Synthesis of Compound 67

In an Ar atmosphere, in a 300 mL three-neck flask, Intermediate R (15.0 g) was added and dissolved in 100 mL of ODCB and cooled to 0° C. in an ice bath. Then, BI$_3$ (19.6 g) was added thereto and the mixture was heated and stirred at 150° C. for 18 hours. The mixture was cooled to 0° C. in the ice bath and 22 mL of triethylamine was added thereto. After the temperature was returned to room temperature, the reaction solution was filtered with silica gel and the residual solvent was removed by distillation under reduced pressure. The resulting crude product was purified by recrystallization from toluene to obtain Compound 67 (1.42 g, yield 9%). The molecular weight of Compound 67 measured by FAB-MS measurement was 941.

2. (Manufacture and Evaluation of Organic Electroluminescence Device)

An evaluation of the organic electroluminescence device including the condensed cyclic compound of an embodiment in the emission layer was carried out as follows. The method for manufacturing the organic electroluminescence device for the evaluation of the device is described below.

Compounds 1, 2, 3, 41, 52, 55, and 67 as described above were used as dopant materials in the emission layer to manufacture the organic electroluminescence devices of Examples 1 to 7. Comparative Examples 1 to 3 are organic electroluminescence devices manufactured using Comparative Example Compounds C1, C2, and C3, respectively, as emission layer dopant materials.

Compounds used in Examples 1 to 7 and Comparative Examples 1 to 3 are listed in Table 1.

TABLE 1

Compound 1

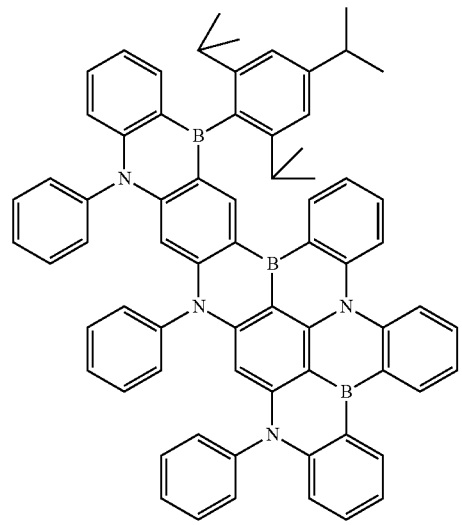 [SMILES: CC(C)c1cc(C(C)C)c(B2c3ccccc3N(c3ccccc3)c3cc4c(cc32)B2c3ccccc3N3c5ccccc5B5c6ccccc6N(c6ccccc6)c6cc(c2c3c65)N4c2ccccc2)c(C(C)C)c1]

1

Compound 2

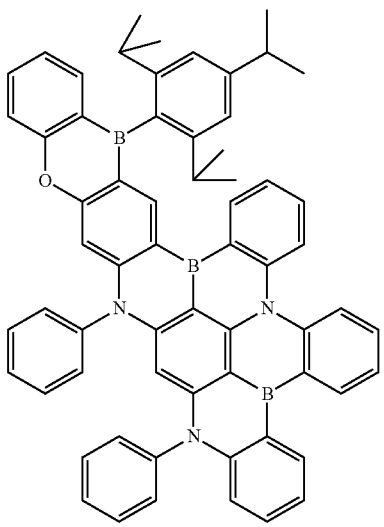 [SMILES: CC(C)c1cc(C(C)C)c(B2c3ccccc3Oc3cc4c(cc32)B2c3ccccc3N3c5ccccc5B5c6ccccc6N(c6ccccc6)c6cc(c2c3c65)N4c2ccccc2)c(C(C)C)c1]

2

TABLE 1-continued
Compound 3
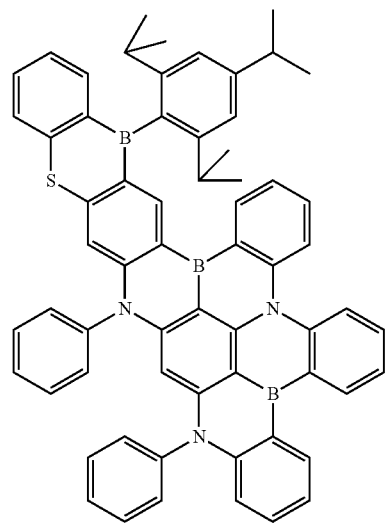 [SMILES: CC(C)c1cc(C(C)C)c(B2c3ccccc3Sc3cc4c(cc32)B2c3ccccc3N3c5ccccc5B5c6ccccc6N(c6ccccc6)c6cc(c2c3c65)N4c2ccccc2)c(C(C)C)c1]
3
Compound 41
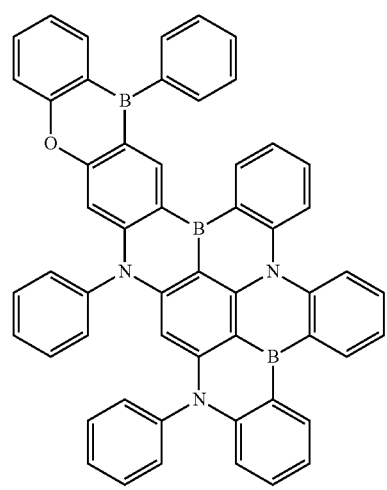 [SMILES: c1ccc(B2c3ccccc3Oc3cc4c(cc32)B2c3ccccc3N3c5ccccc5B5c6ccccc6N(c6ccccc6)c6cc(c2c3c65)N4c2ccccc2)cc1]
41
Compound 52
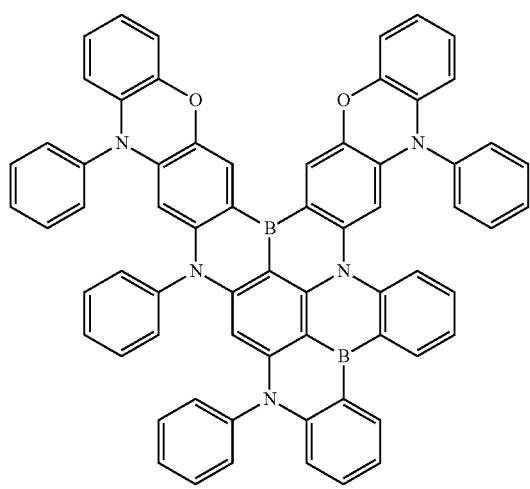 [SMILES: c1ccc(N2c3ccccc3Oc3cc4c(cc32)N(c2ccccc2)c2cc3c5c6c2B4c2cc4c(cc2N6c2ccccc2B5c2ccccc2N3c2ccccc2)N(c2ccccc2)c2ccccc2O4)cc1]
52

TABLE 1-continued
Compound 55
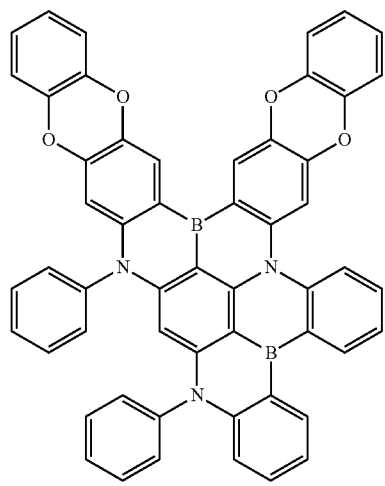 [SMILES: c1ccc(N2c3ccccc3B3c4ccccc4N4c5cc6c(cc5B5c7cc8c(cc7N(c7ccccc7)c7cc2c3c4c75)Oc2ccccc2O8)Oc2ccccc2O6)cc1]
55
Compound 67
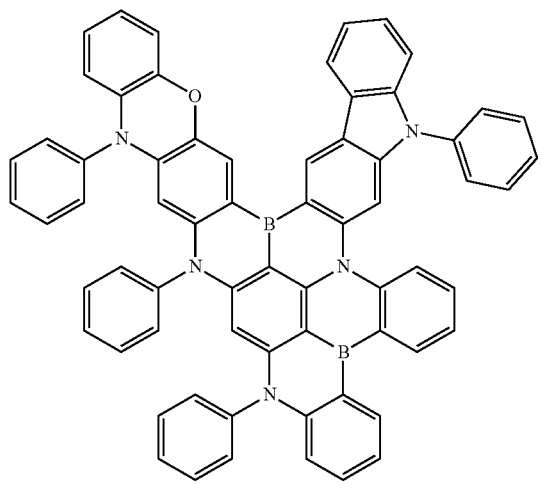 [SMILES: c1ccc(N2c3ccccc3Oc3cc4c(cc32)N(c2ccccc2)c2cc3c5c6c2B4c2cc4c7ccccc7n(-c7ccccc7)c4cc2N6c2ccccc2B5c2ccccc2N3c2ccccc2)cc1]
67
Comparative
Example
Compound C1
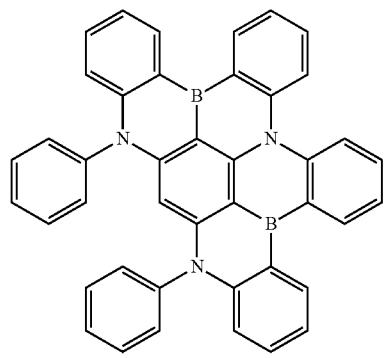 [SMILES: c1ccc(N2c3ccccc3B3c4ccccc4N4c5ccccc5B5c6ccccc6N(c6ccccc6)c6cc2c3c4c65)cc1]
C1

TABLE 1-continued

| | |
|---|---|
| Comparative Example Compound C2 | 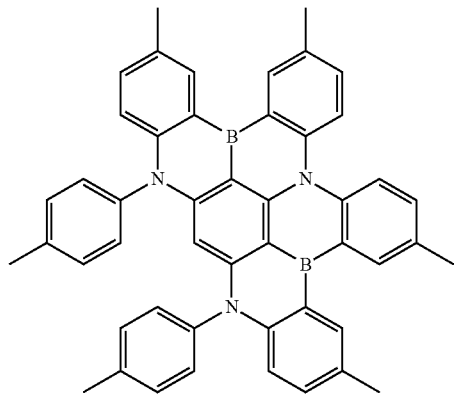<br>C2 |
| Comparative Example Compound C3 | 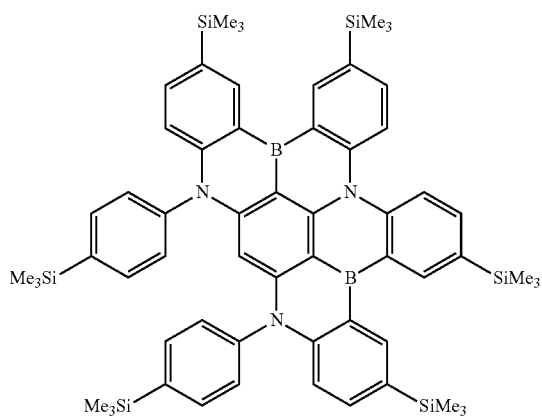 [SMILES: C[Si](C)(C)c1ccc(N2c3ccc([Si](C)(C)C)cc3B3c4cc([Si](C)(C)C)ccc4N4c5ccc([Si](C)(C)C)cc5B5c6cc([Si](C)(C)C)ccc6N(c6ccc([Si](C)(C)C)cc6)c6cc2c3c4c65)cc1]<br>C3 |

Manufacture of Organic Electroluminescence Device

A 1500 Å-thick ITO was patterned on a glass substrate, and the glass substrate was washed with ultrapure water, irradiated with ultraviolet rays for about 30 minutes, and treated with ozone. Thereafter, HAT-CN was deposited to a thickness of about 100 Å, α-NPD was deposited to a thickness of about 800 Å, and mCP was deposited to a thickness of about 50 Å to form a hole transport region.

To form an emission layer, a condensed cyclic compound of an example or a Comparative Example Compound and a host material were co-deposited in a ratio of about 1:99 to form a 200 Å-thick layer. For example, the emission layer was formed by mixing and co-depositing a host material with each of Compounds 1, 2, 3, 41, 52, 55, and 67 in Examples 1 to 11, respectively, and by mixing and co-depositing a host material with each of Comparative Example Compounds C1, C2, and C3 in Comparative Examples 1 to 3, respectively. When the emission layer was formed, mCBP was used as a host material.

Then, a 300 Å-thick layer was formed on the emission layer with TPBi, and a 50 Å-thick layer was sequentially formed with LiF to form an electron transport region. Next, a second electrode having a thickness of about 1,000 Å was formed of aluminum (Al). A capping layer having a thickness of about 700 Å was formed of Compound CPL1 on the second electrode.

In the Examples, the hole transport region, the emission layer, the electron transport region, and the second electrode were each formed using a vacuum deposition apparatus.

The compounds used in the manufacture of each functional layer of the organic electroluminescence devices are as follows:

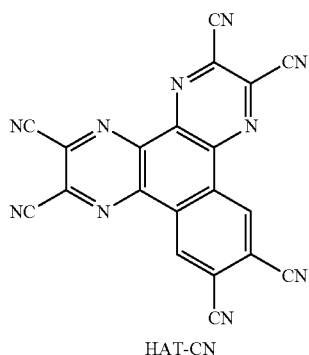

HAT-CN

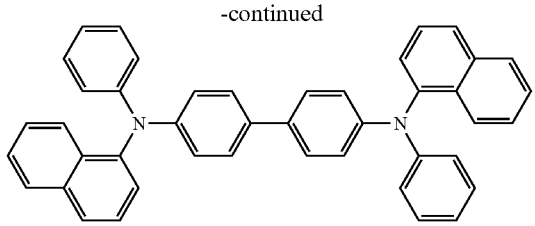

α-NPD

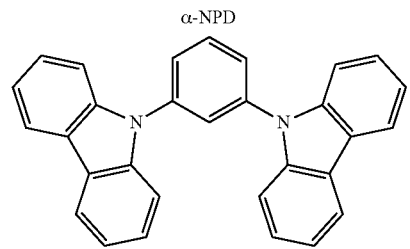

mCP

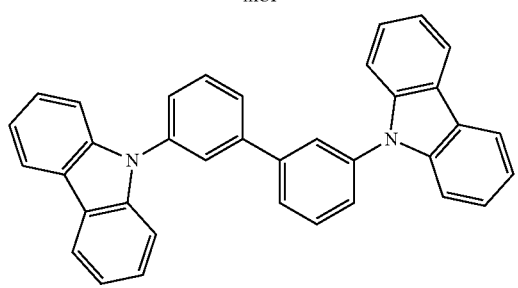

mCBP

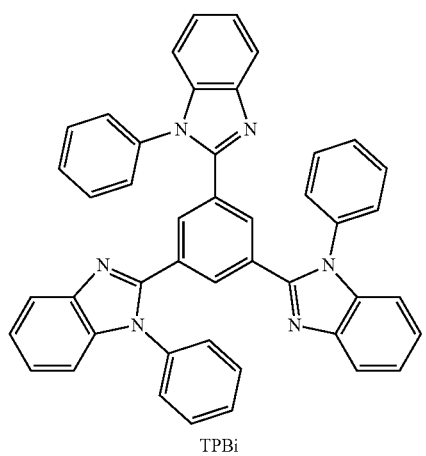

TPBi

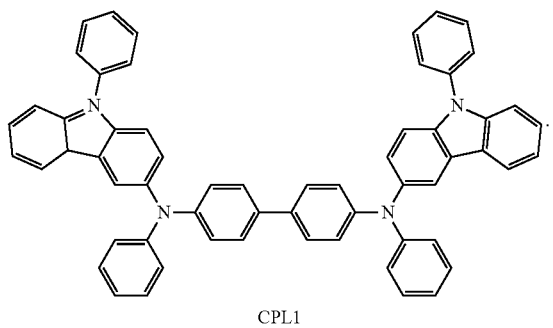

CPL1

Evaluation of Organic Electroluminescence Device Characteristics

The evaluation results of the organic electroluminescence devices of Examples 1 to 11 and Comparative Examples 1 to 3 are listed in Table 2. A maximum emission wavelength ($\lambda_{max}$) and a luminous efficiency ($EQE_{MAX}$, $EQE_{1000nit}$) of the manufactured organic electroluminescence devices are compared in Table 2. In the results, the maximum emission wavelength ($\lambda_{max}$) represents the wavelength showing the maximum value in the emission spectrum, the $EQE_{MAX}$ is the maximum value of the external quantum efficiency, and $EQE_{1000nit}$ is the value of the external quantum efficiency at 1000 cd/m².

TABLE 2

| Device manufactured examples | Dopant Material | $\lambda_{max}$ (nm) | $EQE_{MAX}$ (%) | $EQE_{1000\ nit}$ (%) |
|---|---|---|---|---|
| Example 1 | Example Compound 1 | 470 | 24 | 18 |
| Example 2 | Example Compound 2 | 468 | 25 | 16 |
| Example 3 | Example Compound 3 | 471 | 22 | 16 |
| Example 4 | Example Compound 41 | 486 | 21 | 15 |
| Example 5 | Example Compound 52 | 484 | 20 | 16 |
| Example 6 | Example Compound 55 | 469 | 22 | 14 |
| Example 7 | Example Compound 67 | 472 | 22 | 15 |
| Comparative Example 1 | Comparative Example Compound C1 | 460 | 14 | 11 |
| Comparative Example 2 | Comparative Example Compound C2 | 461 | 17 | 10 |
| Comparative Example 3 | Comparative Example Compound C3 | 461 | 15 | 4 |

Referring to the results of Table 2, it is confirmed that the organic electroluminescence devices of Examples 1 to 11 emit in a blue wavelength region of 460 nm to 490 nm, and exhibit higher luminous efficiency characteristics than those of Comparative Examples 1 to 3.

For example, Examples 1 to 7 exhibit higher maximum external quantum efficiency values than Comparative Examples 1 to 3, and the external quantum efficiency value at 1000 cd/m² is also higher than those of Comparative Examples 1 to 3.

Compared to the Comparative Example Compounds, the condensed cyclic compounds according to embodiments of the present disclosure have a structure in which heterocycles and benzoazaborine or dibenzoazaborine rings are condensed, thereby providing an expanded conjugated system in one compound structure. It is believed that is the cause of the Examples (using the condensed cyclic compound as an emission layer dopant) having improved efficiencies compared to the Comparative Example Compounds.

When comparing Comparative Example Compound C1 (used in Comparative Example 1) and the Example Compounds used in Examples 1 to 7, the Example Compounds have a form in which at least one heterocycle is condensed to a basic structure of Comparative Compound C1. Therefore, it is confirmed that a luminous intensity of the condensed cyclic compound is increased by the further condensed heterocyclic group.

In addition, when comparing Comparative Compounds C2 (used in Comparative Example 2) and the Example Compounds 1, 2, and 3 (used in Examples 1 to 3), the Example Compounds have a condensed structure in which a boron atom is in a para-position with respect to a nitrogen atom of benzoazaborine, and thereby reverse intersystem crossing may easily occur by resonance effects in a molecule compared to Comparative Example Compound C2. Accordingly, it is believed that Examples 1 to 3 resultingly exhibit improved luminous efficiencies compared to Comparative Example 2.

The condensed cyclic compound of an example may have a structure including a condensed heterocycle to expand the conjugated system in a molecule. The increase in resonance effects allows the difference between the triplet energy level and the singlet energy level to be reduced, and thereby the condensed cyclic compound of an example may exhibit high efficiency by exhibiting thermally activated delayed fluorescence emission.

The condensed cyclic compound of the Examples has a 1,3,5-triamino-2,4-dibora-benzene derivative as a core, and includes a plurality of heterocycles that are connected and condensed with a boron and a nitrogen atom of the core moiety, and devices including the compound exhibit excellent emission characteristics. In addition, the expanded conjugated system provided by including the further condensed heterocycles to the core including multiple benzoazaborines results in high luminous efficiency characteristics.

The organic electroluminescence device of an example may include the condensed cyclic compound of an example in the emission layer to exhibit high luminous efficiency in a blue emission wavelength region.

The organic electroluminescence device of an embodiment may exhibit excellent luminous efficiency.

The condensed cyclic compounds of an embodiment may be contained in the emission layer of the organic electroluminescence device to contribute to high efficiency of the organic electroluminescence device.

Although the present disclosure has been described with reference to embodiments of the present disclosure, it will be understood that the present disclosure should not be limited to these embodiments, and that various changes and modifications can be made by those skilled in the art without departing from the spirit and scope of the present disclosure.

As used herein, the terms "substantially," "about," and similar terms are used as terms of approximation and not as terms of degree, and are intended to account for the inherent deviations in measured or calculated values that would be recognized by those of ordinary skill in the art.

Accordingly, the technical scope of the present disclosure is not intended to be limited to the contents set forth in the detailed description of the specification, but is intended to be defined by the appended claims and equivalents thereof.

What is claimed is:

1. An organic electroluminescence device comprising:
   a first electrode;
   a second electrode on the first electrode; and
   an emission layer between the first electrode and the second electrode and comprising a condensed cyclic compound represented by Formula 1,
   wherein the first electrode and the second electrode each independently comprise any one selected from Ag, Mg, Cu, Al, Pt, Pd, Au, Ni, Nd, Ir, Cr, Li, Ca, LiF Mo, Ti, In, Zn, Sn, and Yb, a compound of two or more thereof, a mixture of two or more thereof, or an oxide thereof:

Formula 1

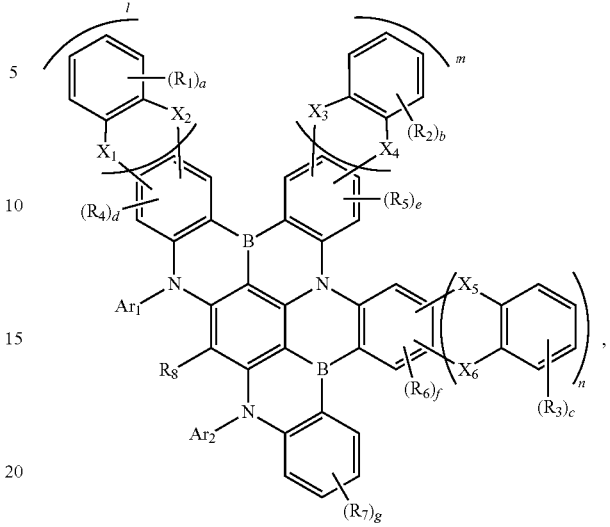

and
wherein in Formula 1,
$X_1$ to $X_6$ are each independently a direct linkage, $BAr_3$, $NAr_4$, O, or S,
$Ar_1$ to $Ar_4$ are each independently a substituted or unsubstituted aryl group having 6 to 30 ring-forming carbon atoms, or a substituted or unsubstituted heteroaryl group having 2 to 30 ring-forming carbon atoms,
l, m, and n are each independently 0 or 1, at least one of l, m, or n is 1,
a to g are each independently an integer of 0 to 4, and
$R_1$ to $R_8$ are each independently a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring.

2. The organic electroluminescence device of claim 1, wherein Formula 1 is represented by any one among Formula 1-1 to Formula 1-3:

Formula 1-1

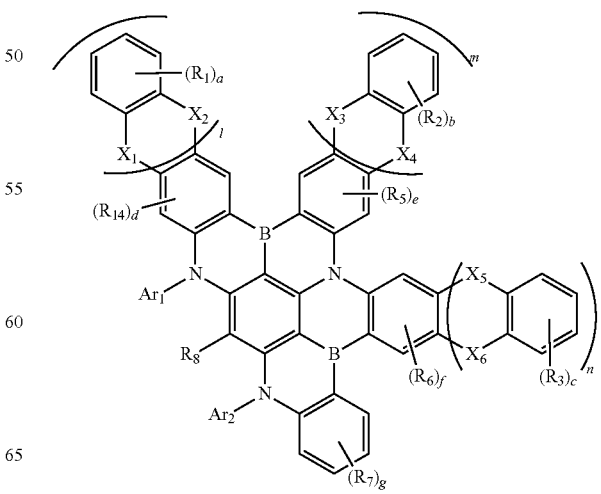

Formula 1-2
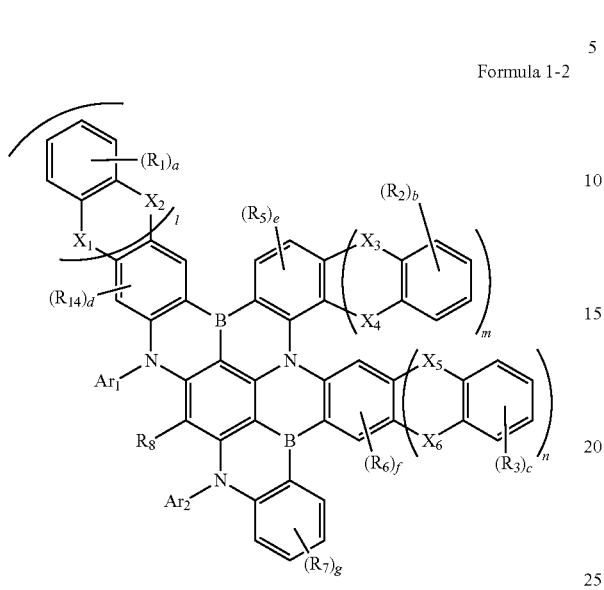
Formula 1-3
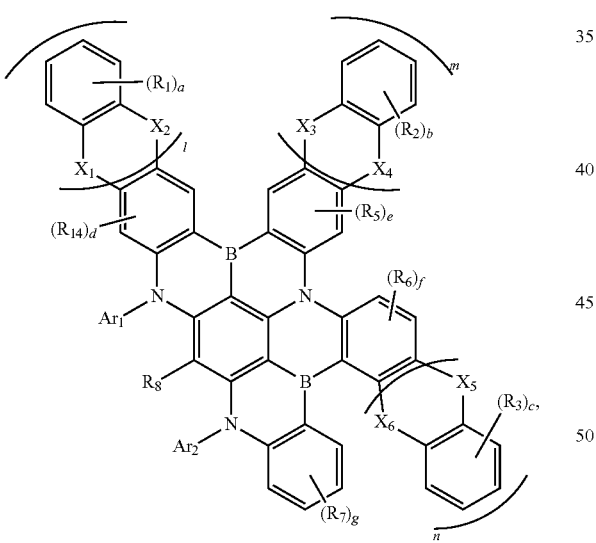
and
wherein in Formula 1-1 to Formula 1-3, $X_1$ to $X_6$, $Ar_1$, $Ar_2$, l, m, n, a to g, and $R_1$ to $R_8$ are each independently the same as defined in Formula 1.
3. The organic electroluminescence device of claim 1, wherein Formula 1 is represented by any one among Formula 1-A to Formula 1-E:
Formula 1-A
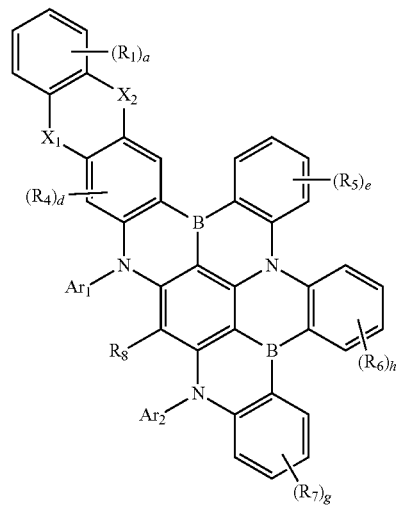
Formula 1-B
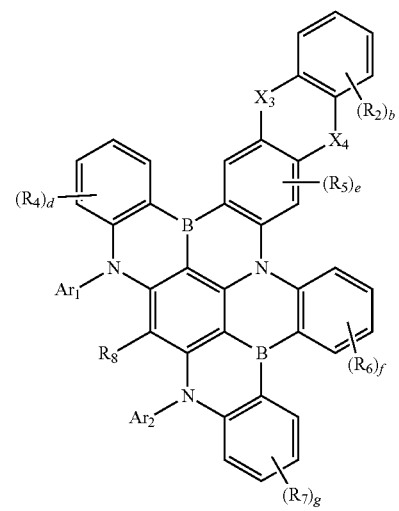
Formula 1-C
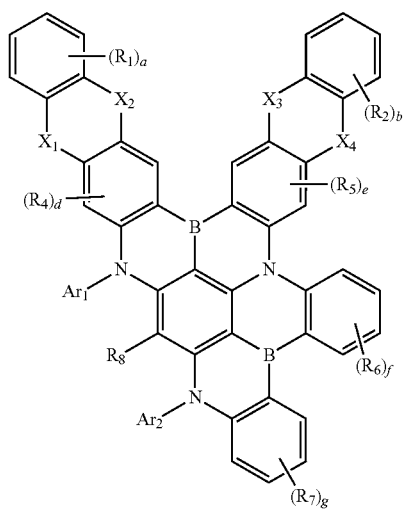

Formula 1-D

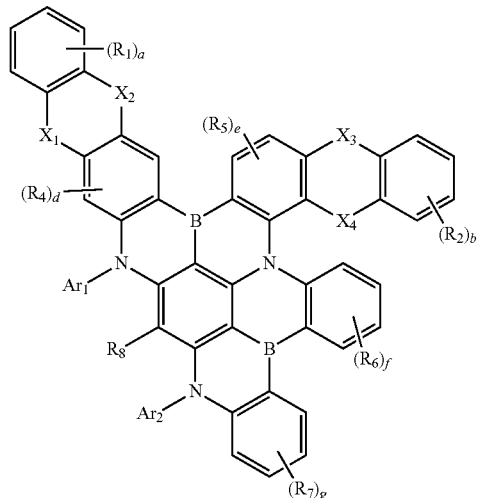

Formula 1-E

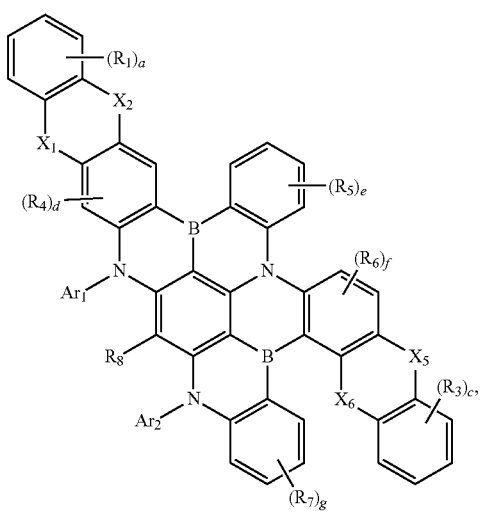

and
wherein in Formula 1-A to Formula 1-E, $X_1$ to $X_6$, $Ar_1$, $Ar_2$, a to g, and $R_1$ to $R_8$ are each independently the same as defined in Formula 1.

4. The organic electroluminescence device of claim 1, wherein $Ar_1$ to $Ar_4$ are each independently an unsubstituted phenyl group, a phenyl group substituted with a substituted or unsubstituted alkyl group having 1 to 10 carbon atoms, or a phenyl group substituted with a deuterium atom.

5. The organic electroluminescence device of claim 1, wherein $R_1$ to $R_8$ are each a deuterium atom.

6. The organic electroluminescence device of claim 1, wherein the emission layer is to emit delayed fluorescence.

7. The organic electroluminescence device of claim 1, wherein the emission layer comprises a host and a dopant, and the dopant comprises the condensed cyclic compound.

8. The organic electroluminescence device of claim 1, wherein the emission layer to emit light having a center wavelength of about 460 nm to about 490 nm.

9. The organic electroluminescence device of claim 1, wherein the emission layer comprises at least one selected from the condensed cyclic compounds represented by Compound Group 1:

Compound Group 1

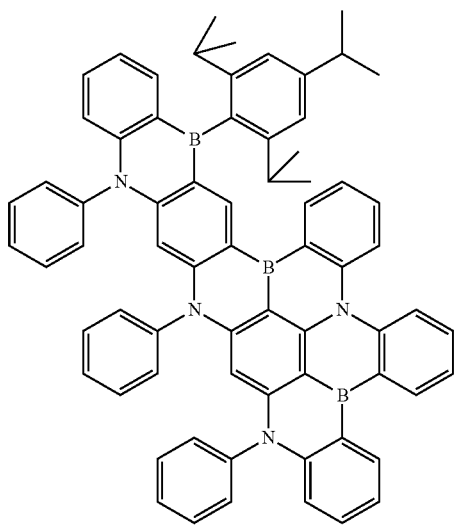

1

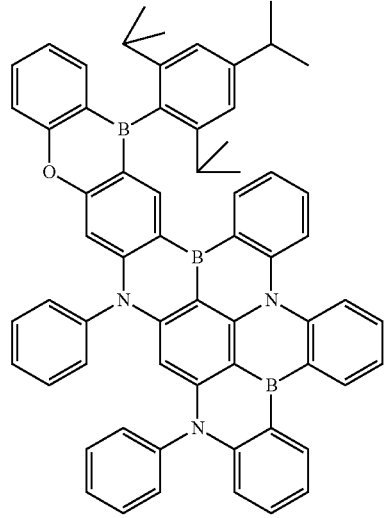

2

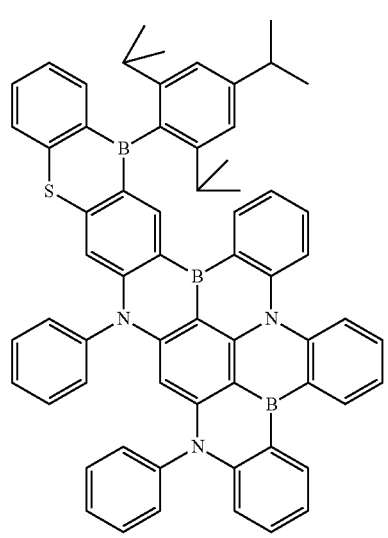

3

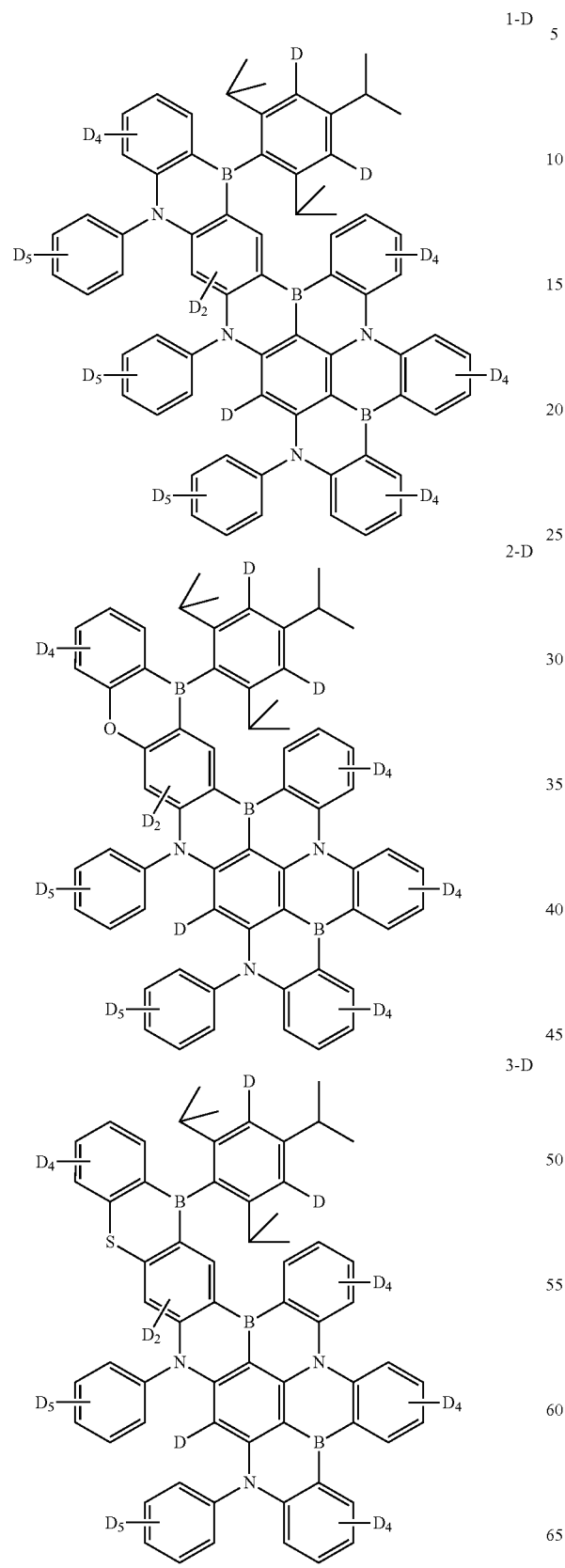
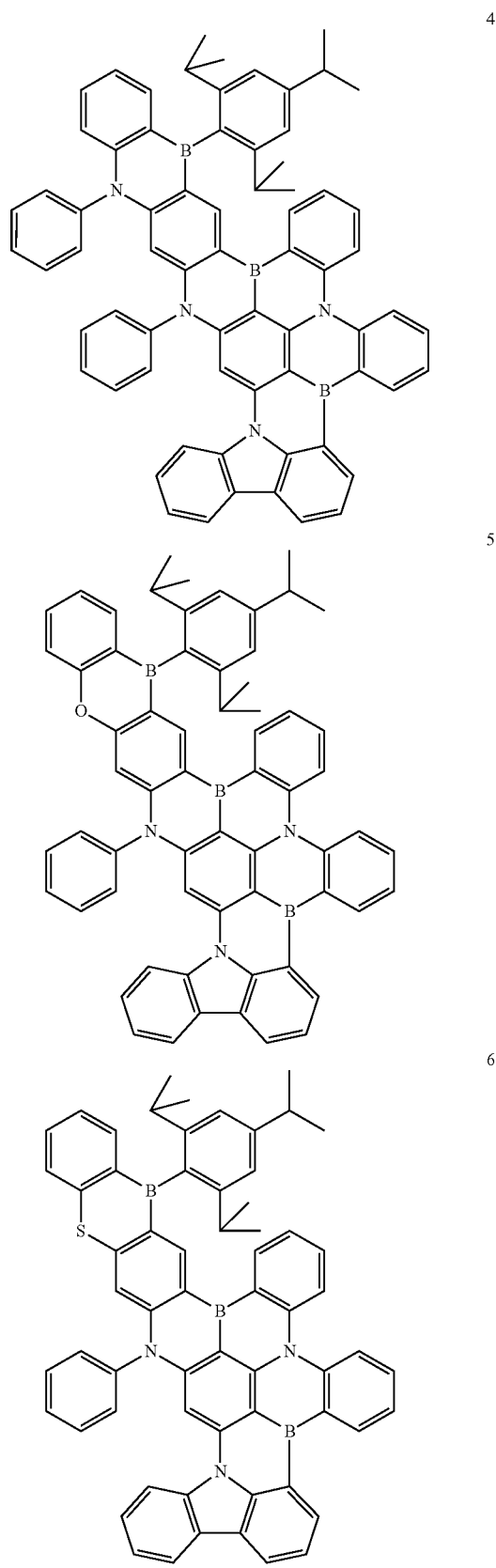

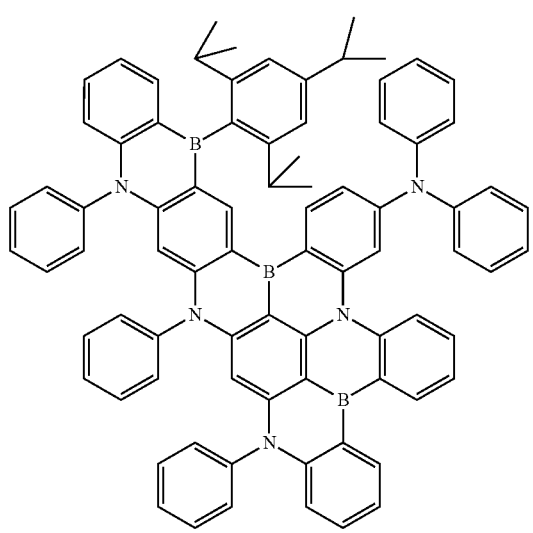
7
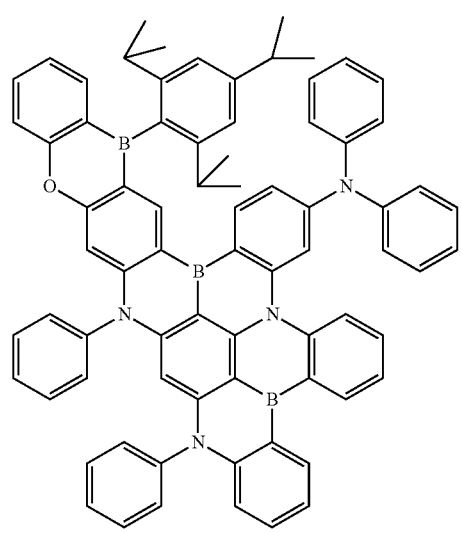
8
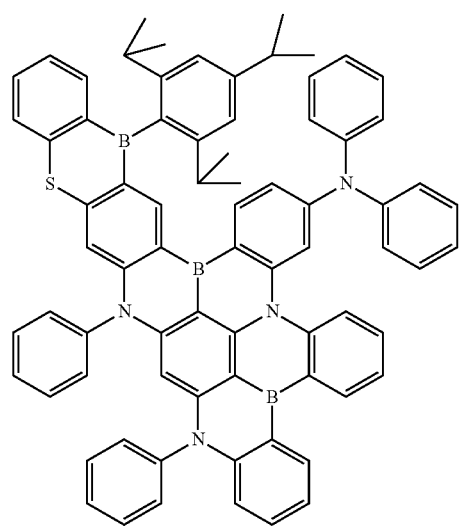
9
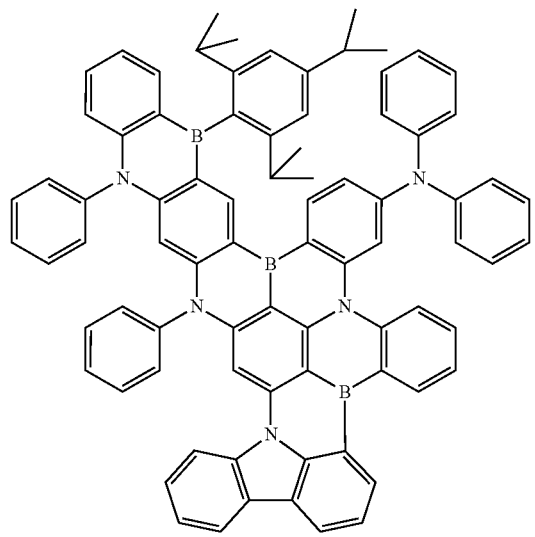
10
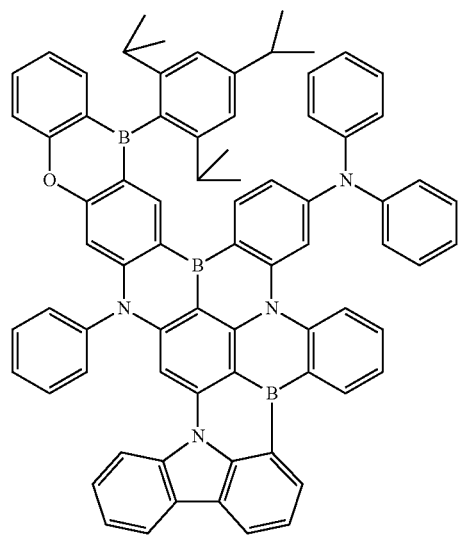
11
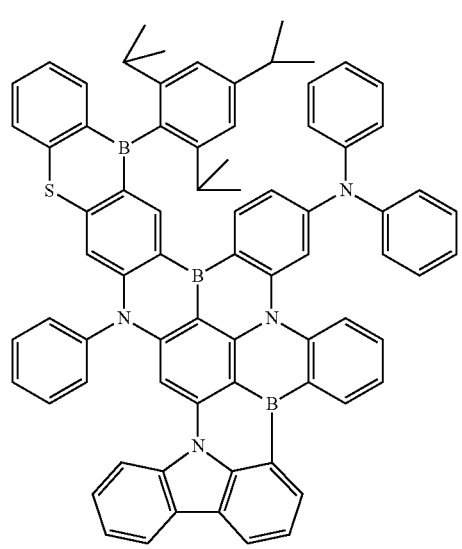
12

95
13
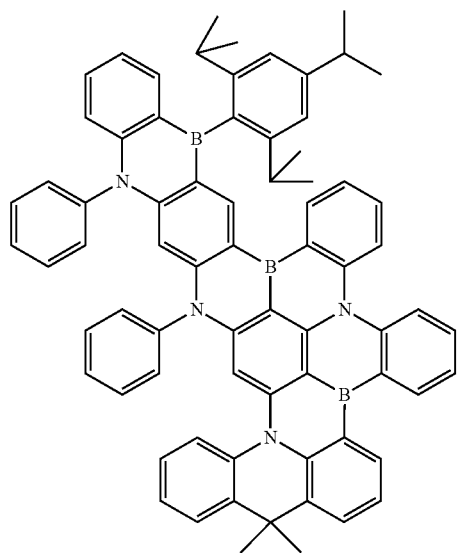
14
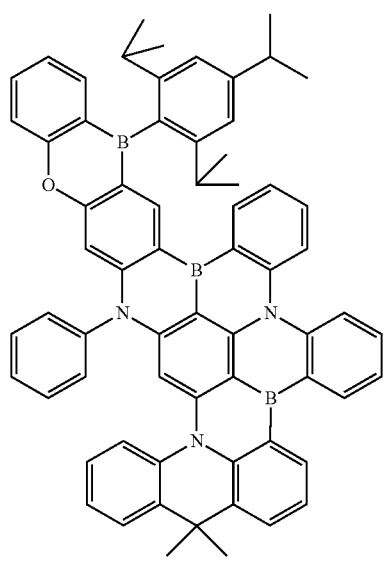
15
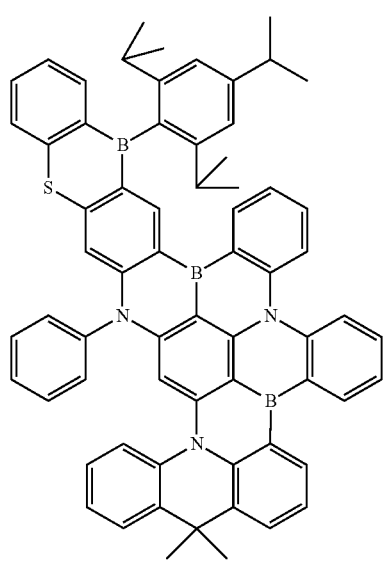
96
16
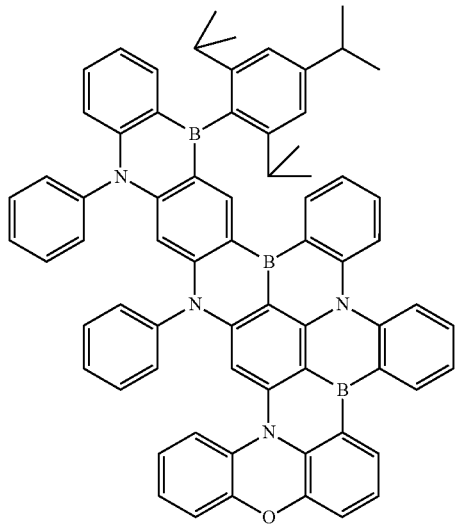
17
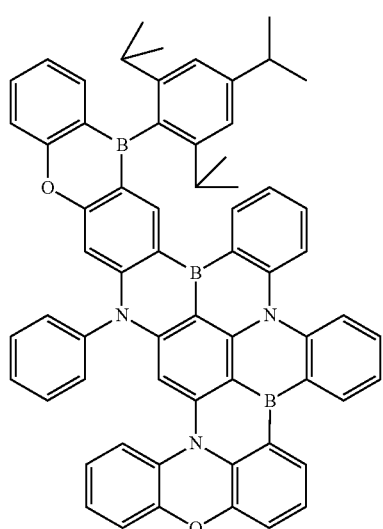
18
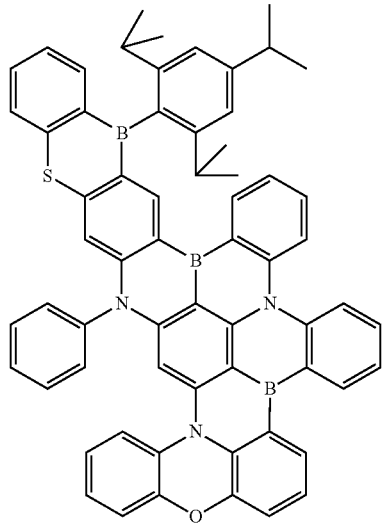

19
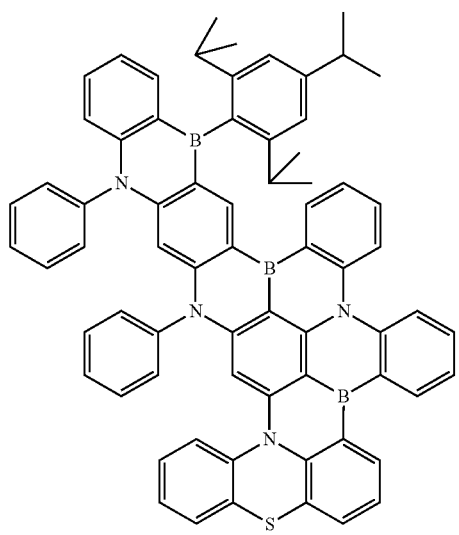
20
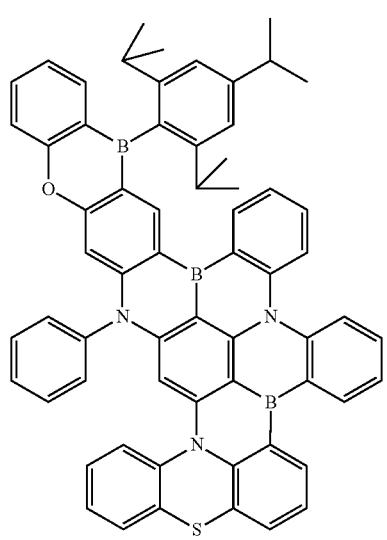
21
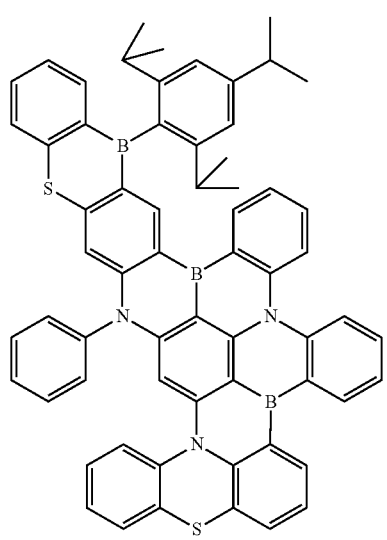
22
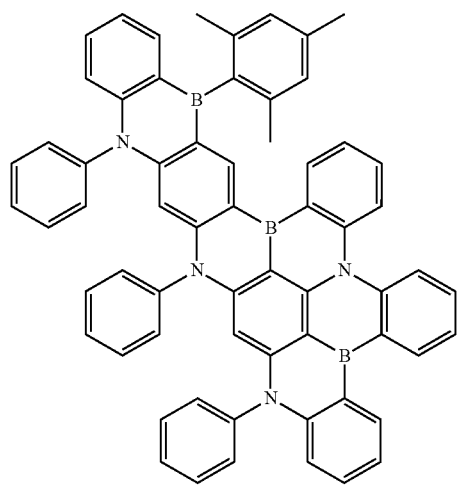
23
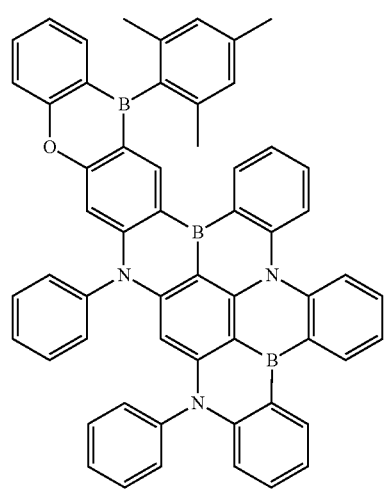
24
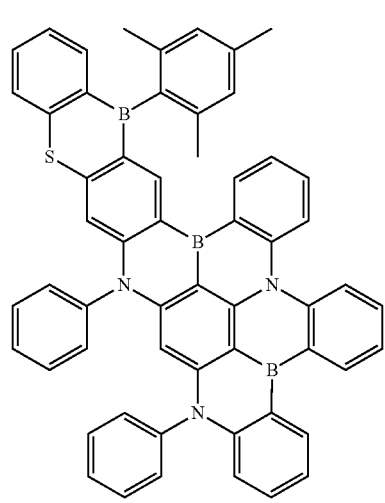

99
-continued
25
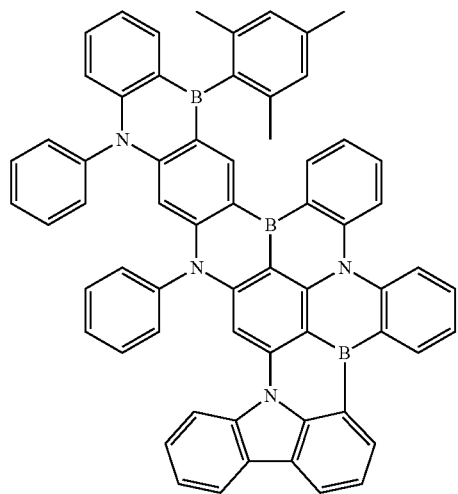
26
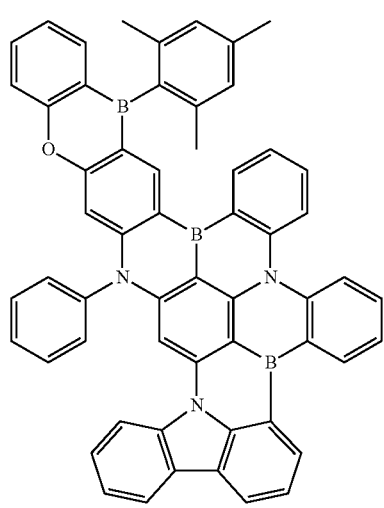
27
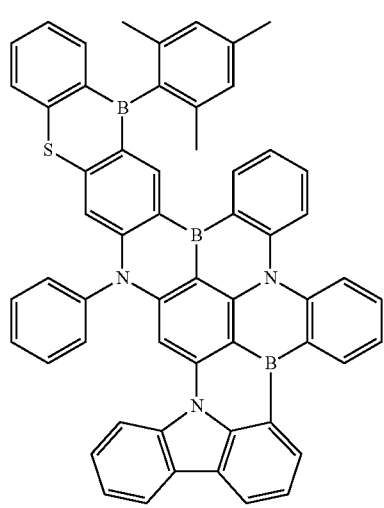
100
-continued
28
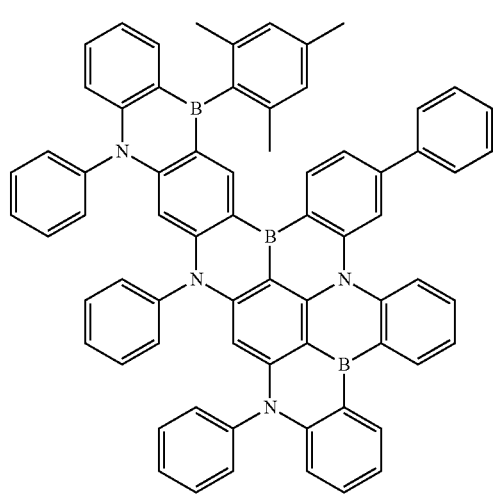
29
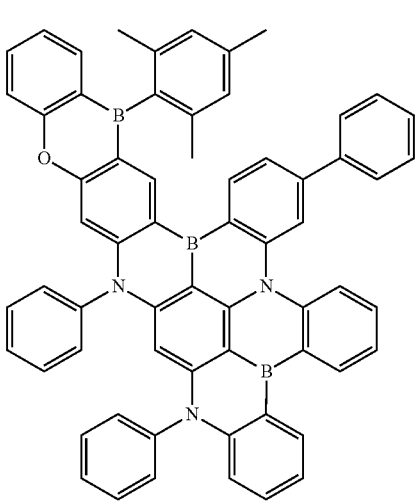
30
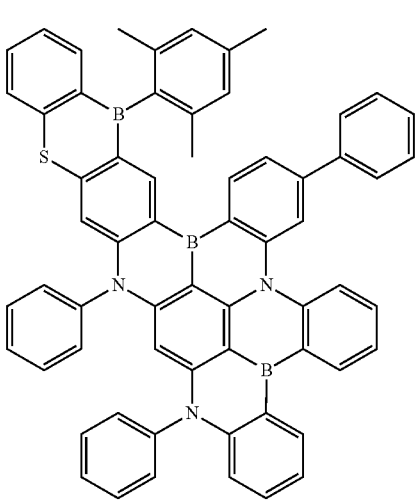

| 31 | 34 |
|---|---|
| 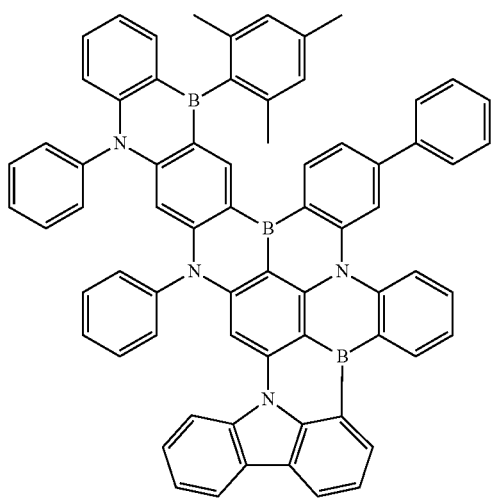 | 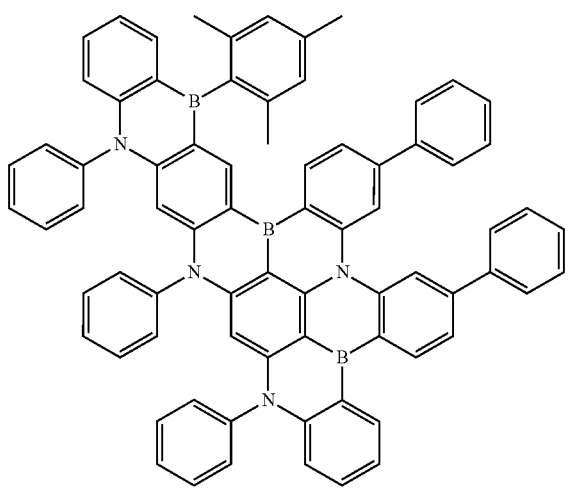 |
| 32 | 35 |
| 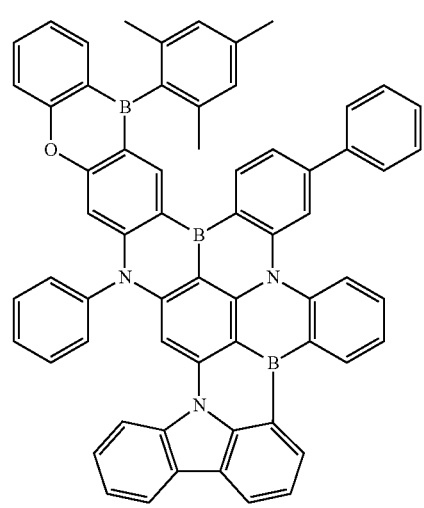 | 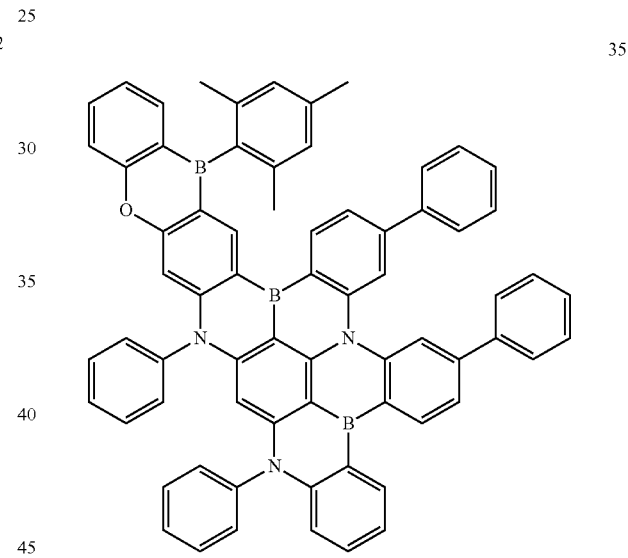 |
| 33 | 36 |
| 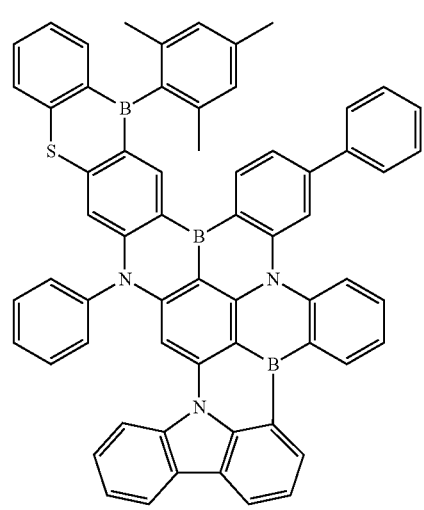 | 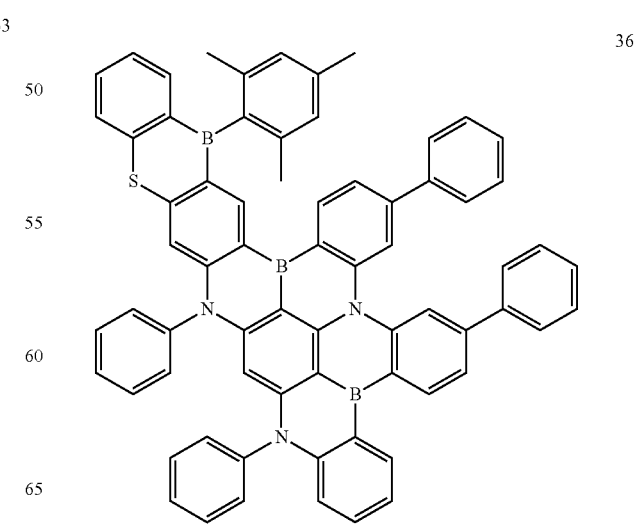 |

37
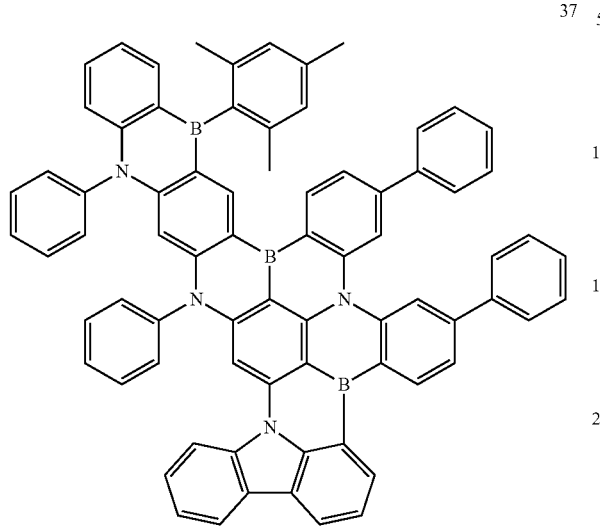
38
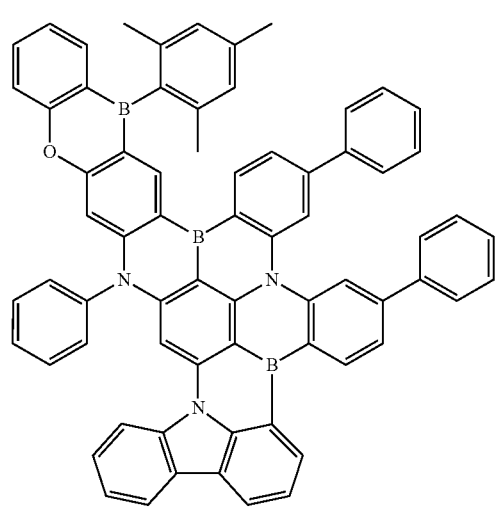
39
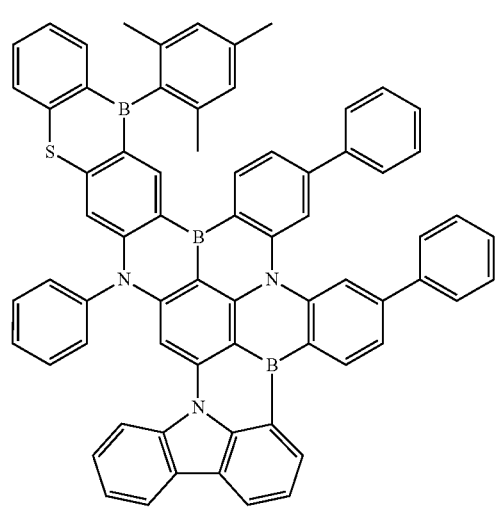
40
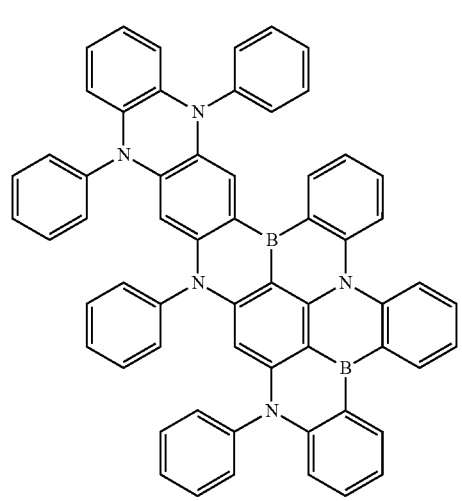
41
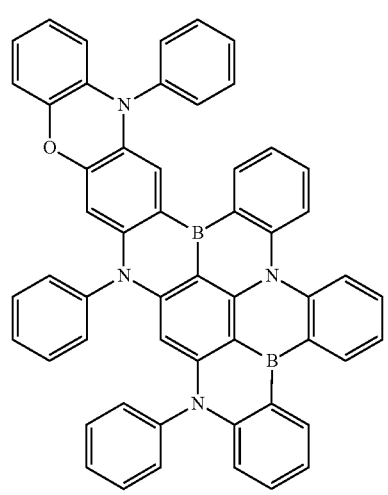
41-D
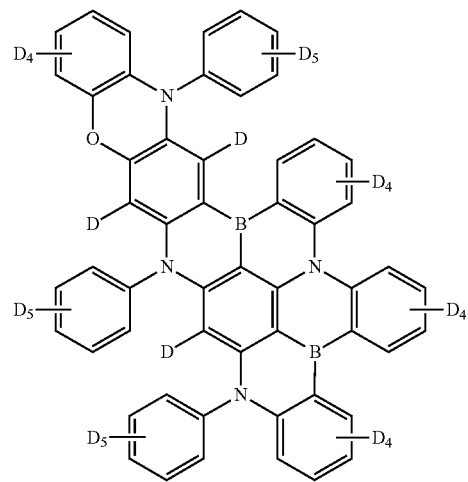

42
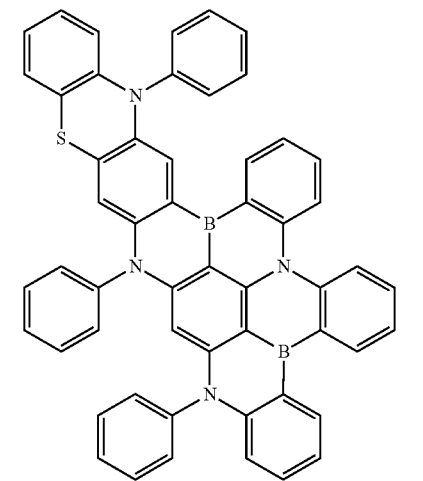
43
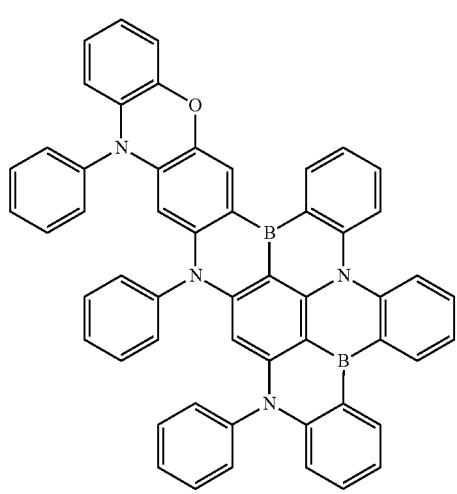
44
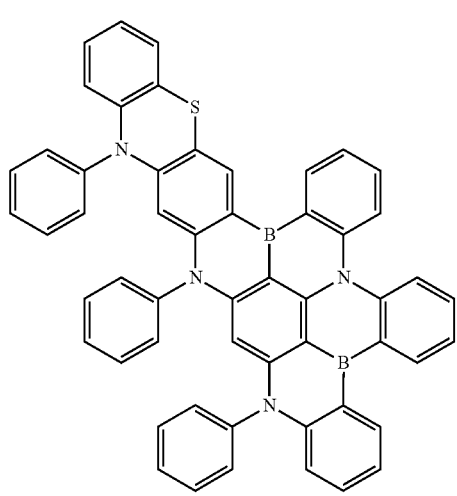
45
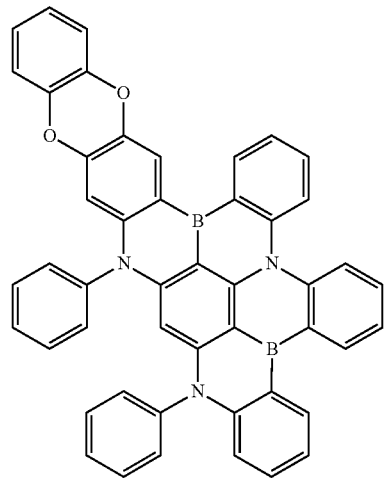
46
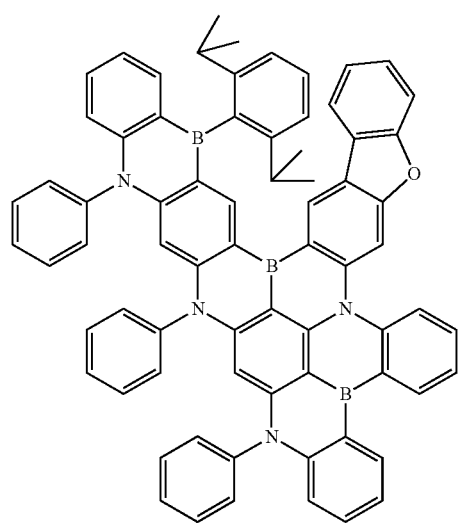
47
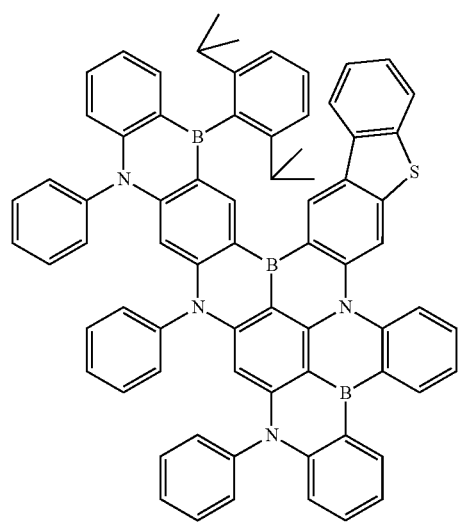

107
-continued
48
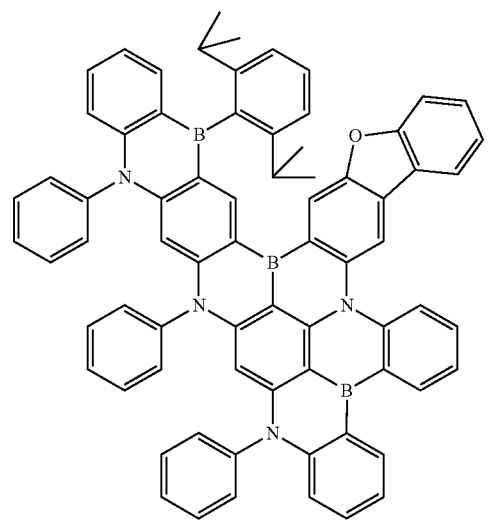
49
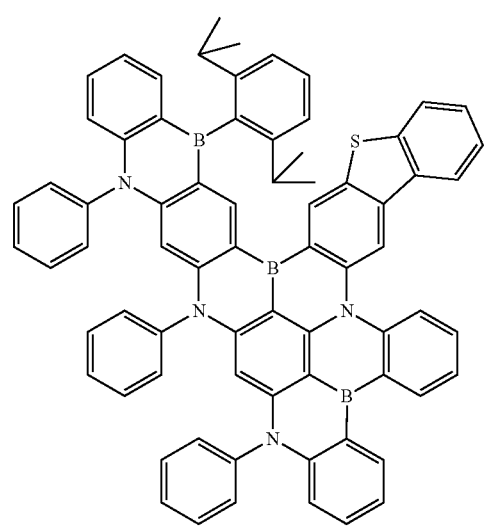
50
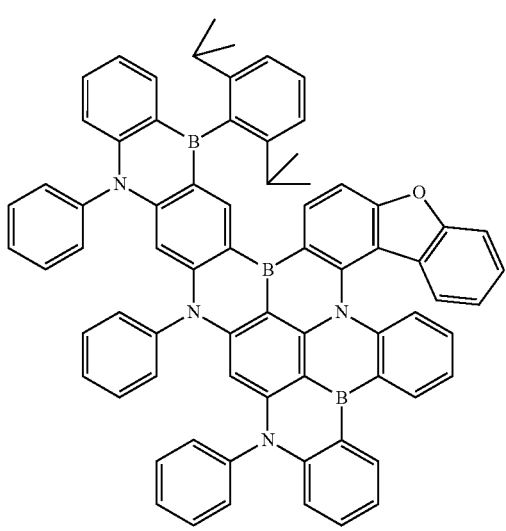
108
-continued
51
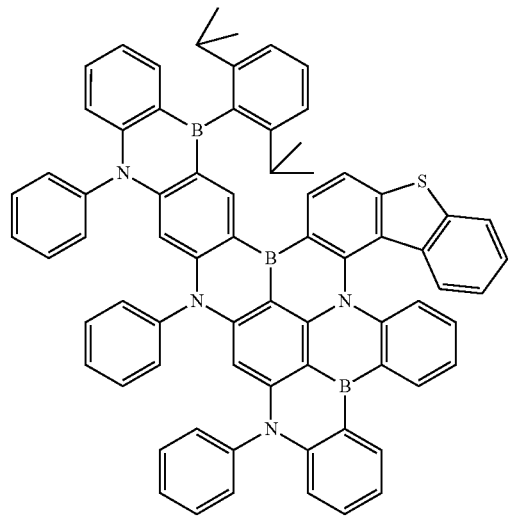
52
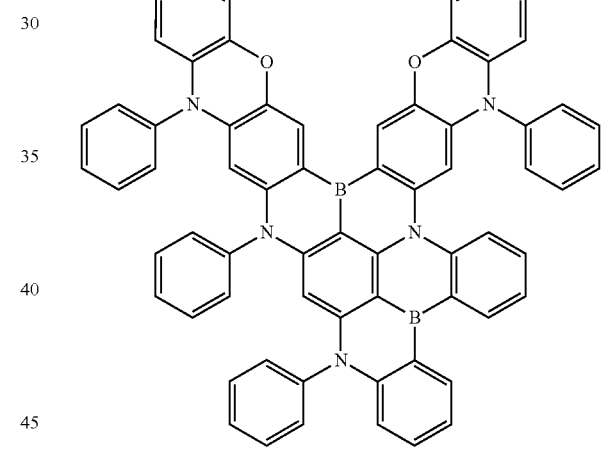
52-D
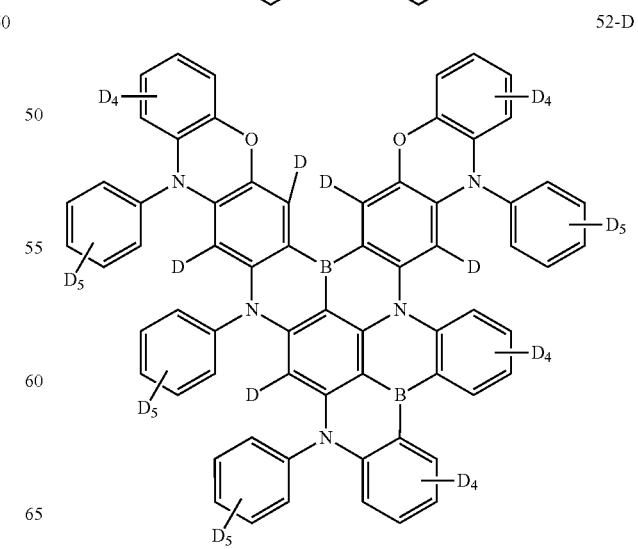

109
-continued
53
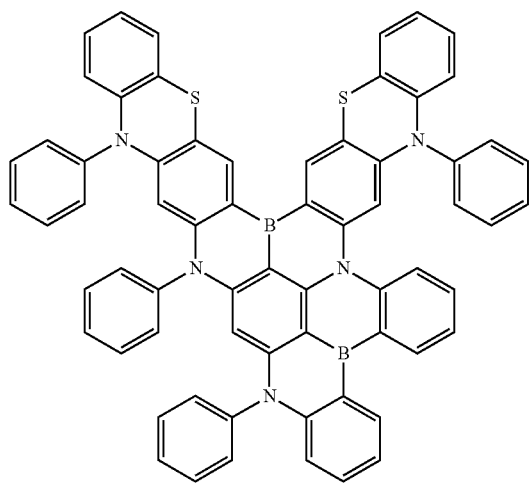
54
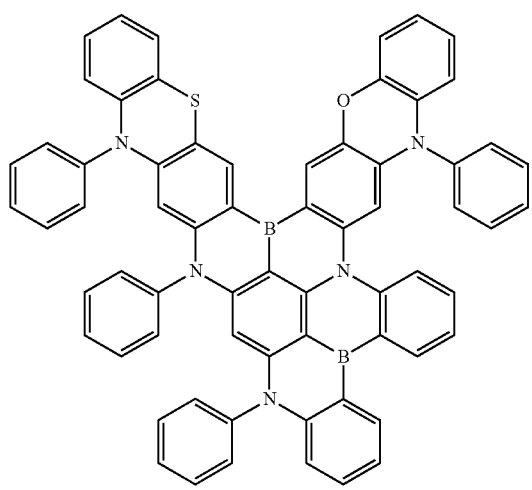
55
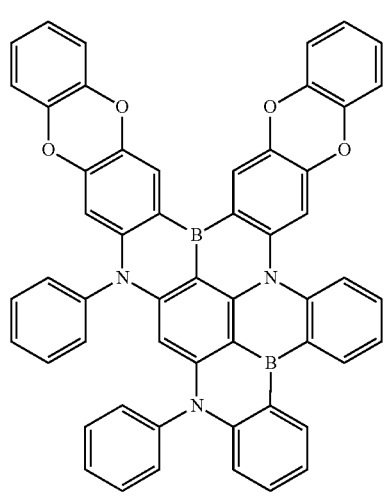
110
-continued
56
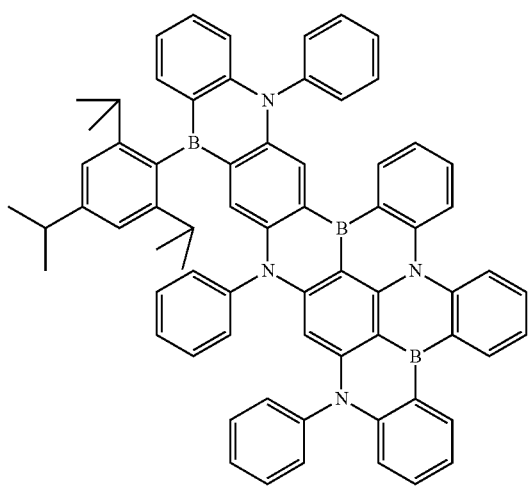
57
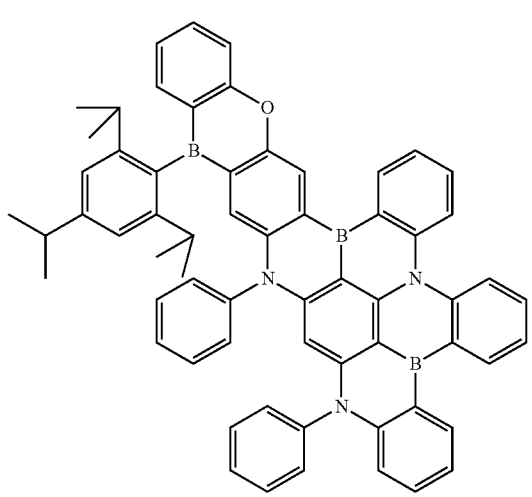
58
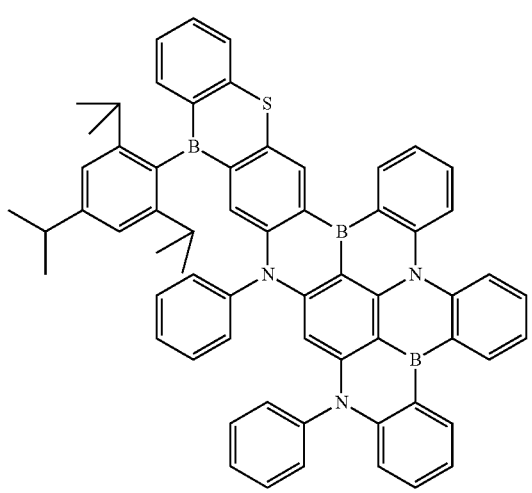

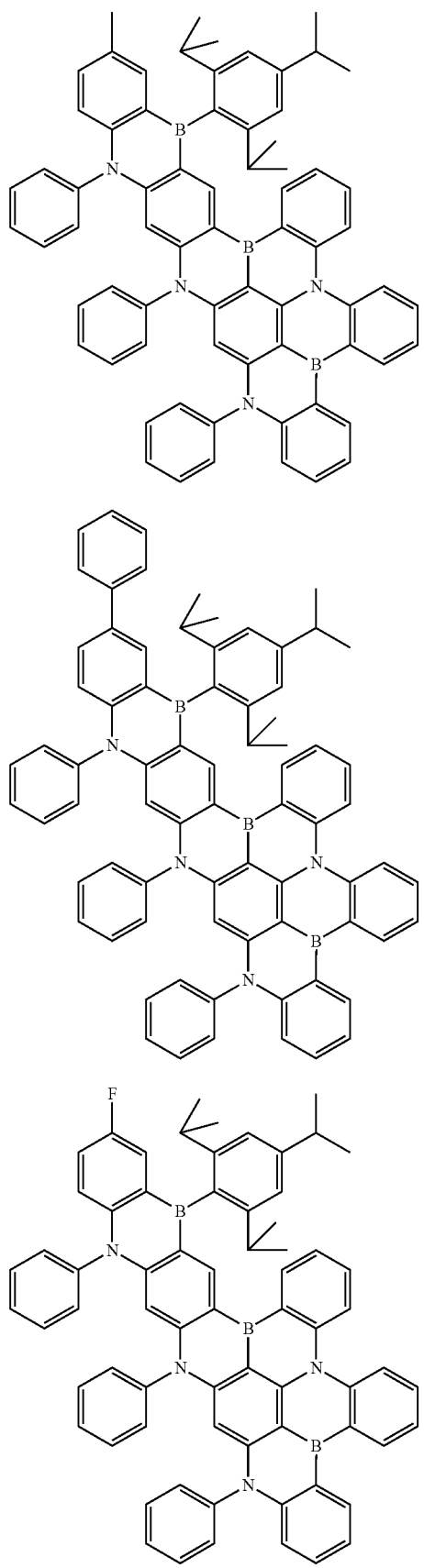
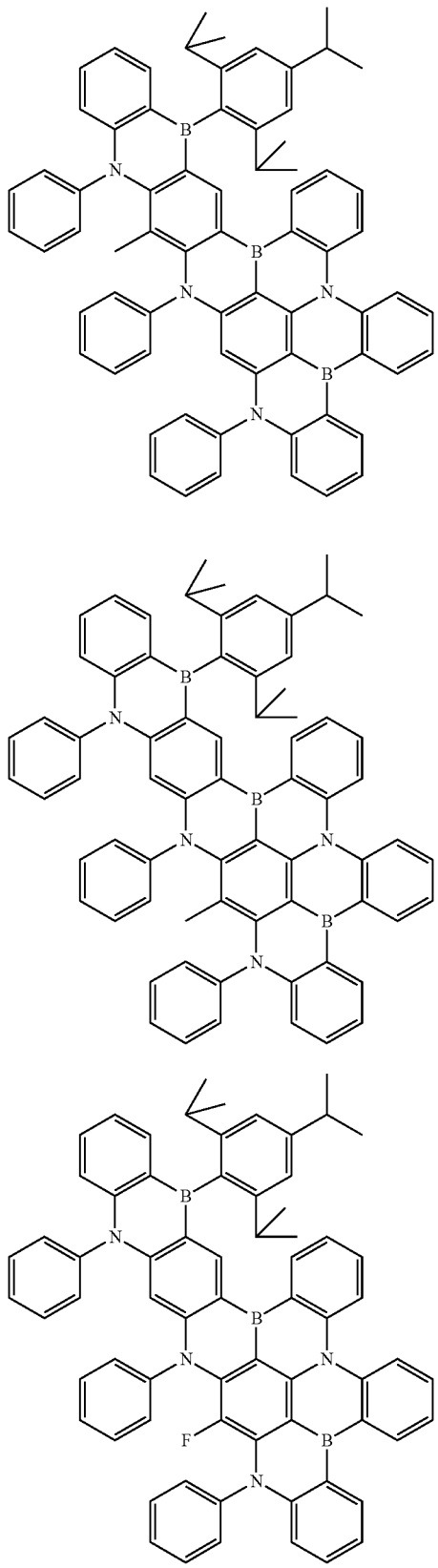

65
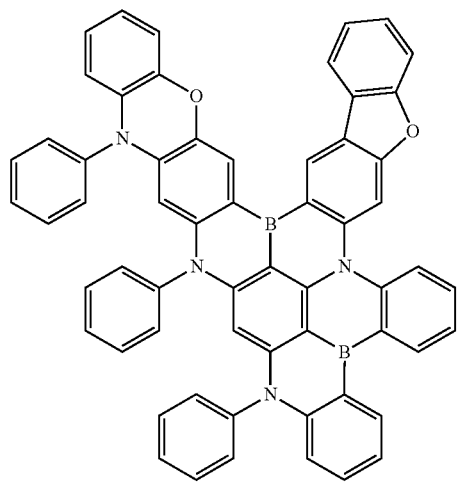
66
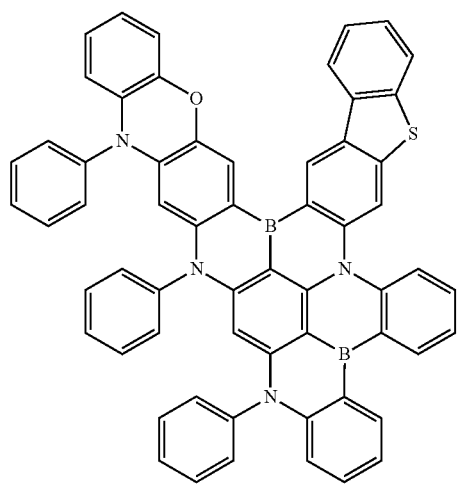
67
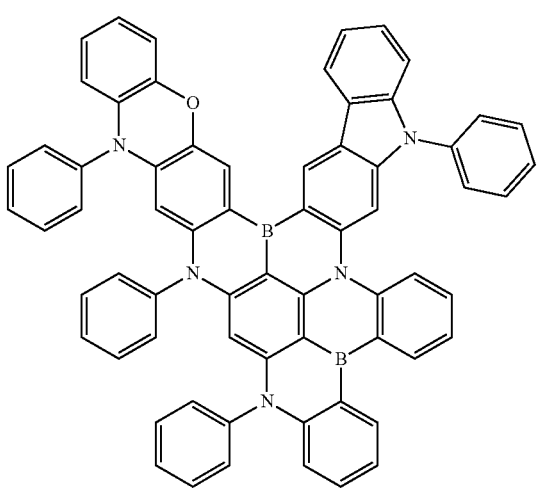
68
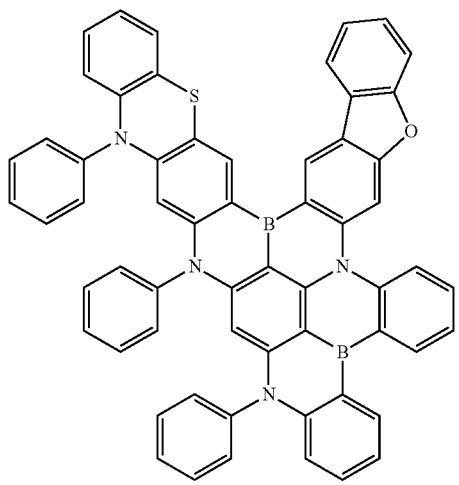
69
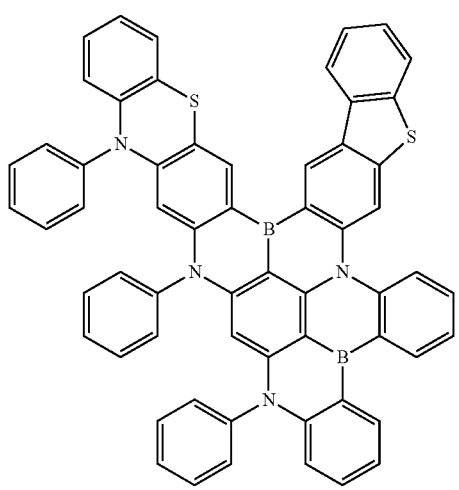
70
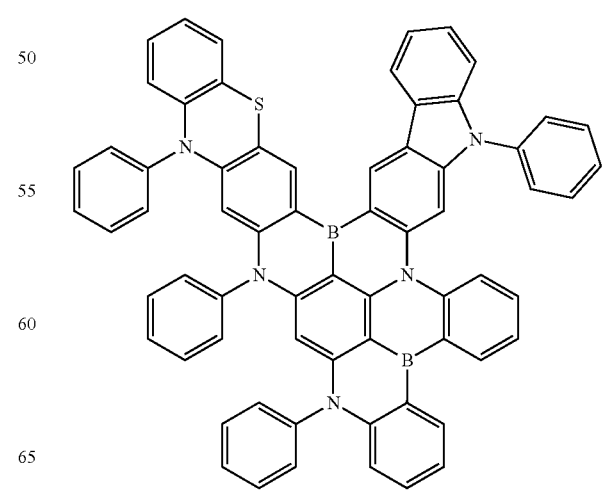

71
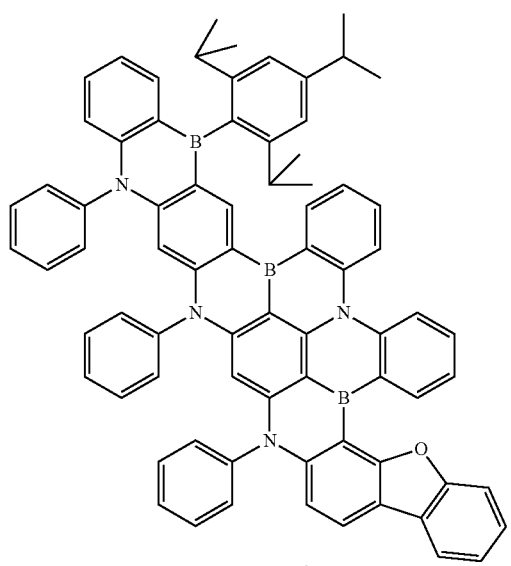
72
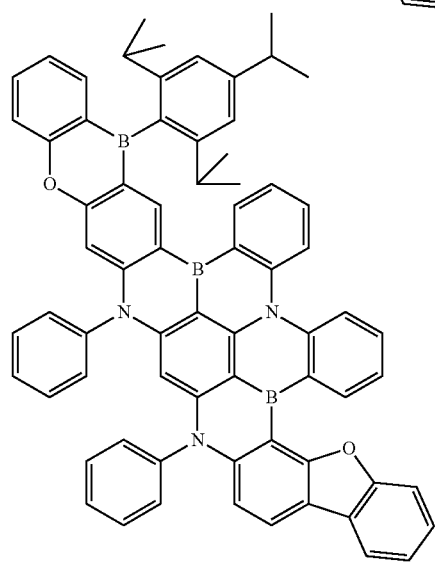
73
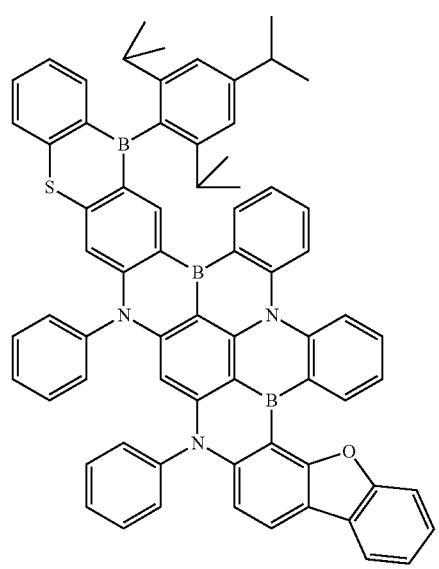
74
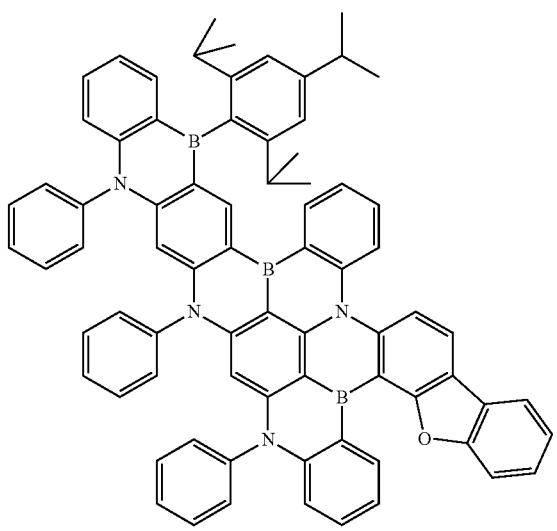
75
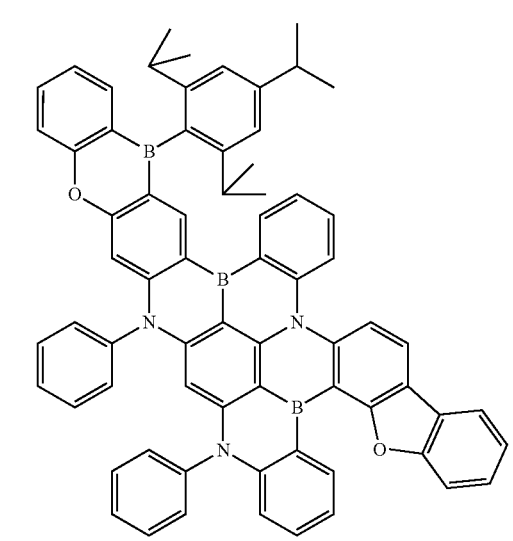
76
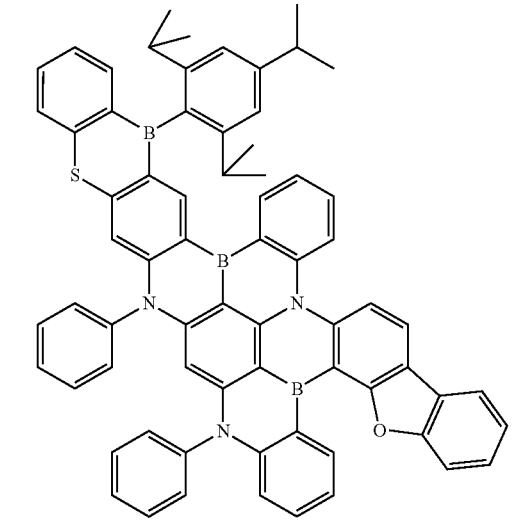

77
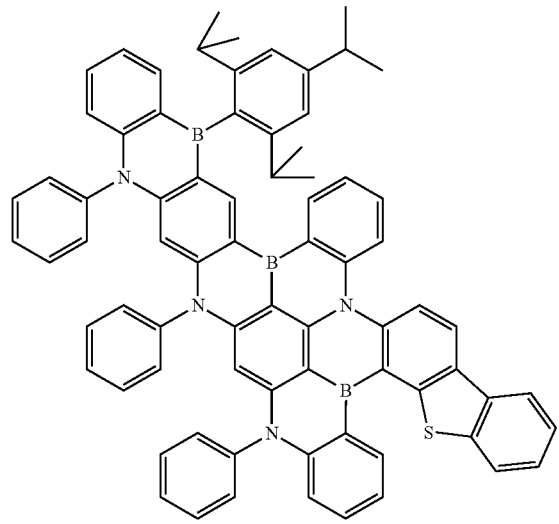
78
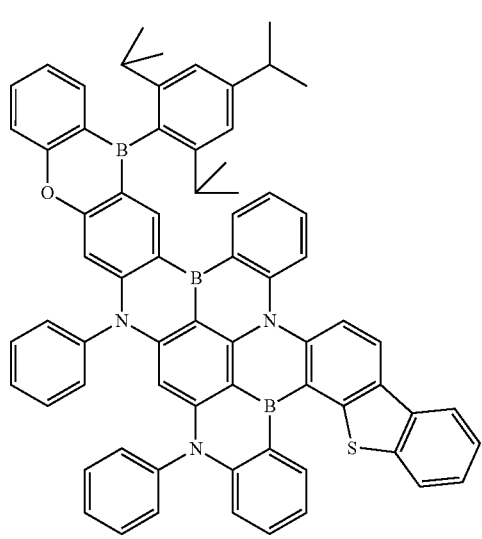
79
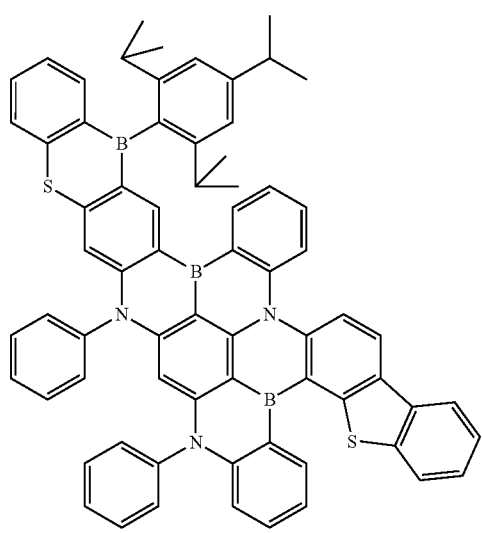
80
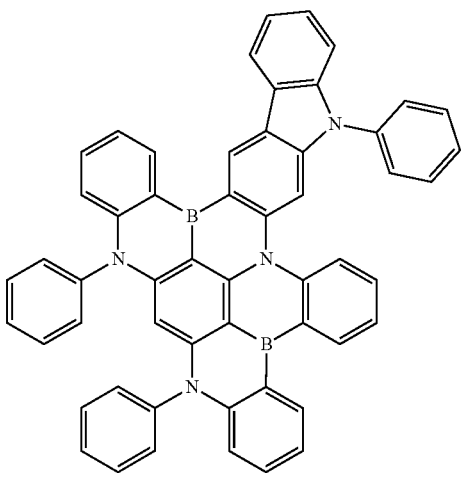
81
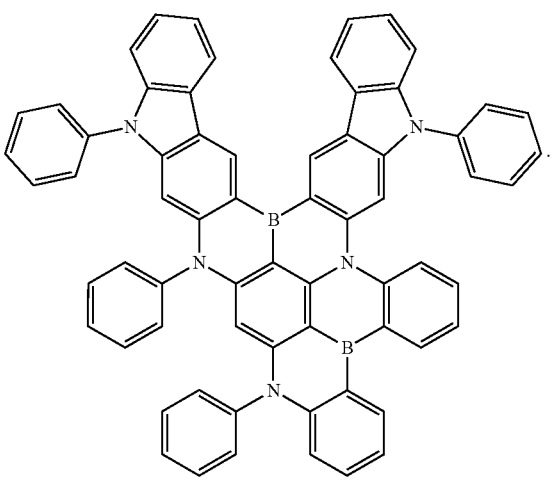
10. A condensed cyclic compound represented by Formula 1:
Formula 1
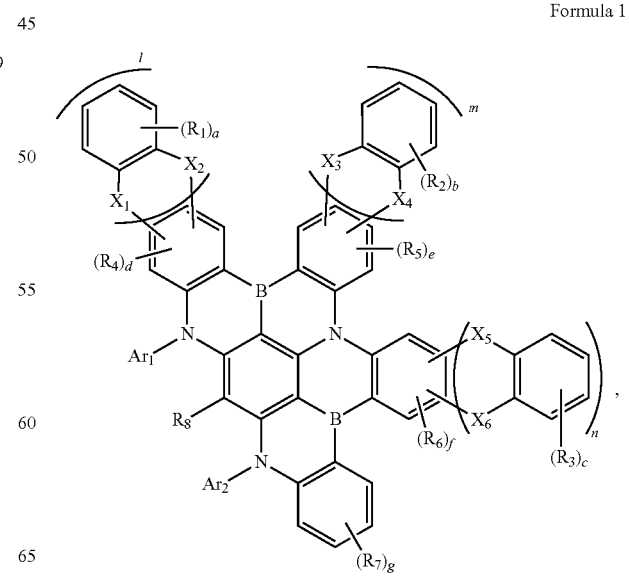

wherein in Formula 1,

X$_1$ to X$_6$ are each independently a direct linkage, BAr$_3$, NAr$_4$, O, or S, Ar$_1$ to Ar$_4$ are each independently a substituted or unsubstituted aryl group having 6 to 30 ring-forming carbon atoms, or a substituted or unsubstituted heteroaryl group having 2 to 30 ring-forming carbon atoms, l, m, and n are each independently 0 or 1, at least one of l, m, or n is 1, a to g are each independently an integer of 0 to 4, and R$_1$ to R$_8$ are each independently a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring.

11. The condensed cyclic compound of claim 10, wherein Formula 1 is represented by any one selected from Formula 1-1 to Formula 1-3:

Formula 1-1

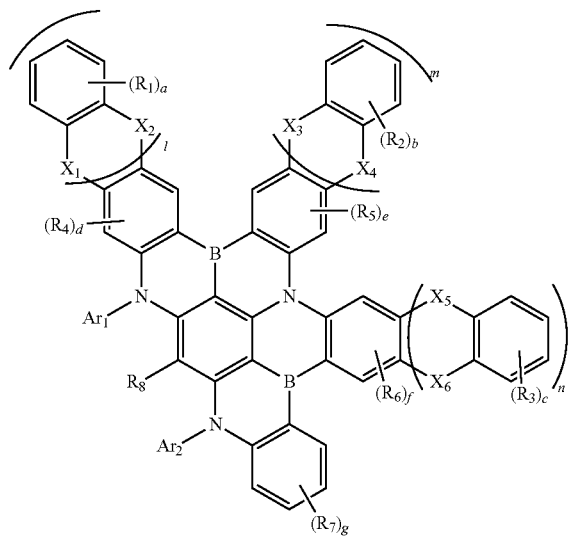

Formula 1-2

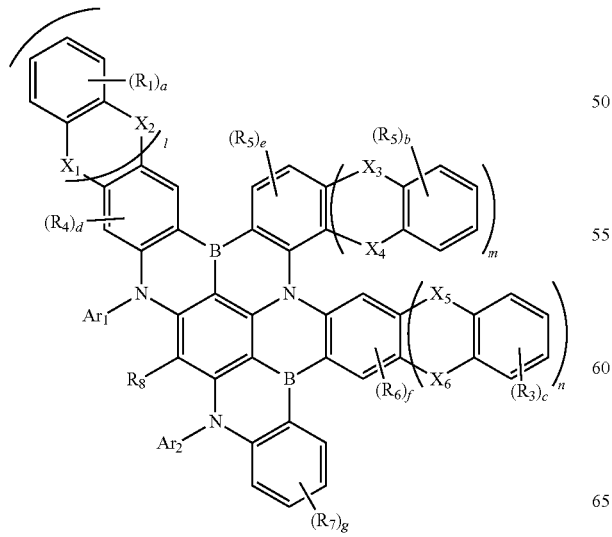

Formula 1-3

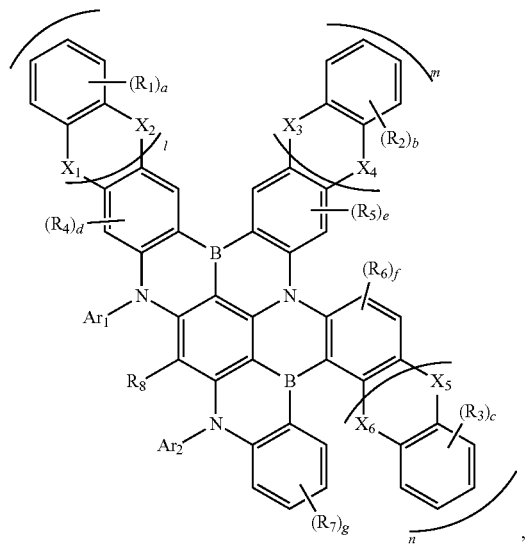

and wherein in Formula 1-1 to Formula 1-3, X$_1$ to X$_6$, Ar$_1$, Ar$_2$, l, m, n, a to g, and R$_1$ to R$_8$ are each independently the same as defined in Formula 1.

12. The condensed cyclic compound of claim 10, wherein Formula 1 is represented by any one selected from Formula 1-A to Formula 1-E:

Formula 1-A

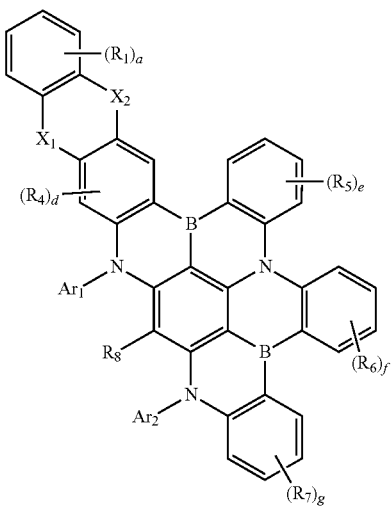

Formula 1-B

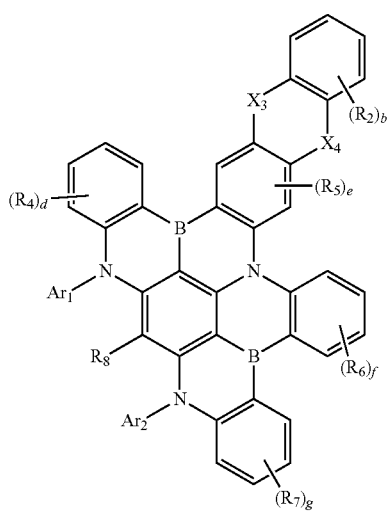

Formula 1-C

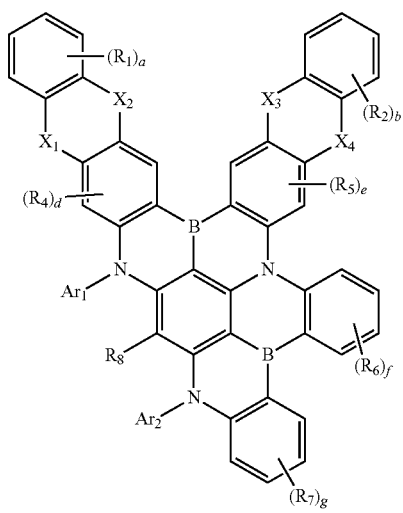

Formula 1-D

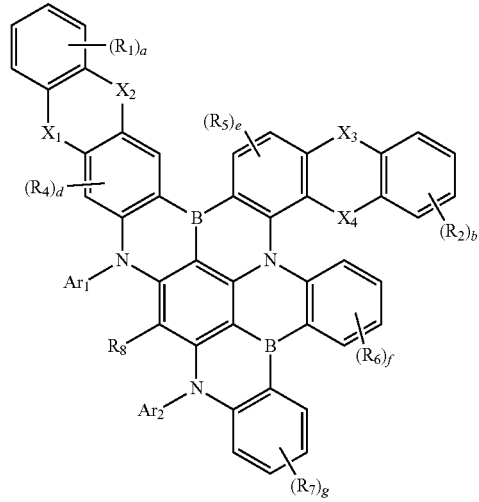

Formula 1-E

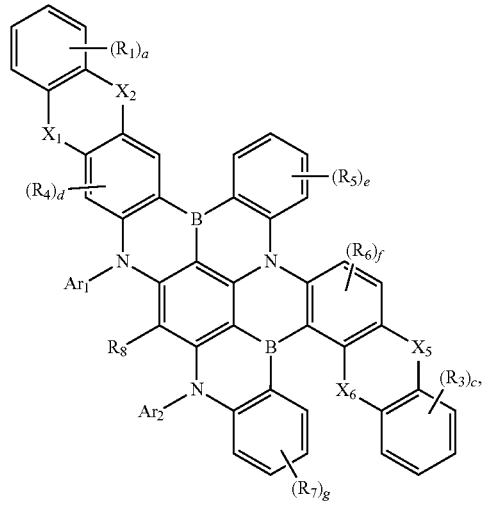

and wherein in Formula 1-A to Formula 1-E, $X_1$ to $X_6$, $Ar_1$, $Ar_2$, a to g, and $R_1$ to $R_8$ are each independently the same as defined in Formula 1.

13. The condensed cyclic compound of claim 10, wherein $Ar_1$ to $Ar_4$ are each independently an unsubstituted phenyl group, a phenyl group substituted with a substituted or unsubstituted alkyl group having 1 to 10 carbon atoms, or a phenyl group substituted with a deuterium atom.

14. The condensed cyclic compound of claim 10, wherein $R_1$ to $R_8$ are each a deuterium atom.

15. The condensed cyclic compound of claim 10, wherein Formula 1 is any one selected from the compounds represented by Compound Group 1:

Compound Group 1

1

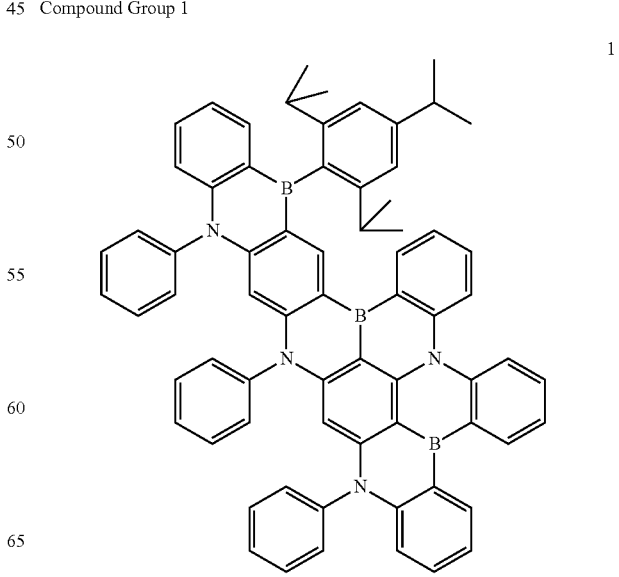

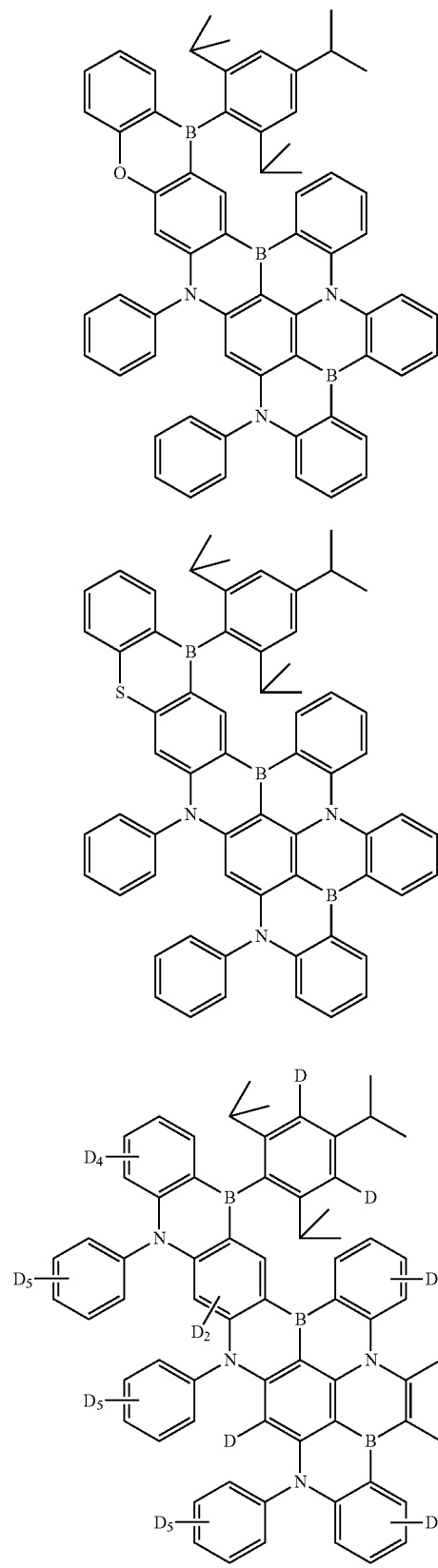
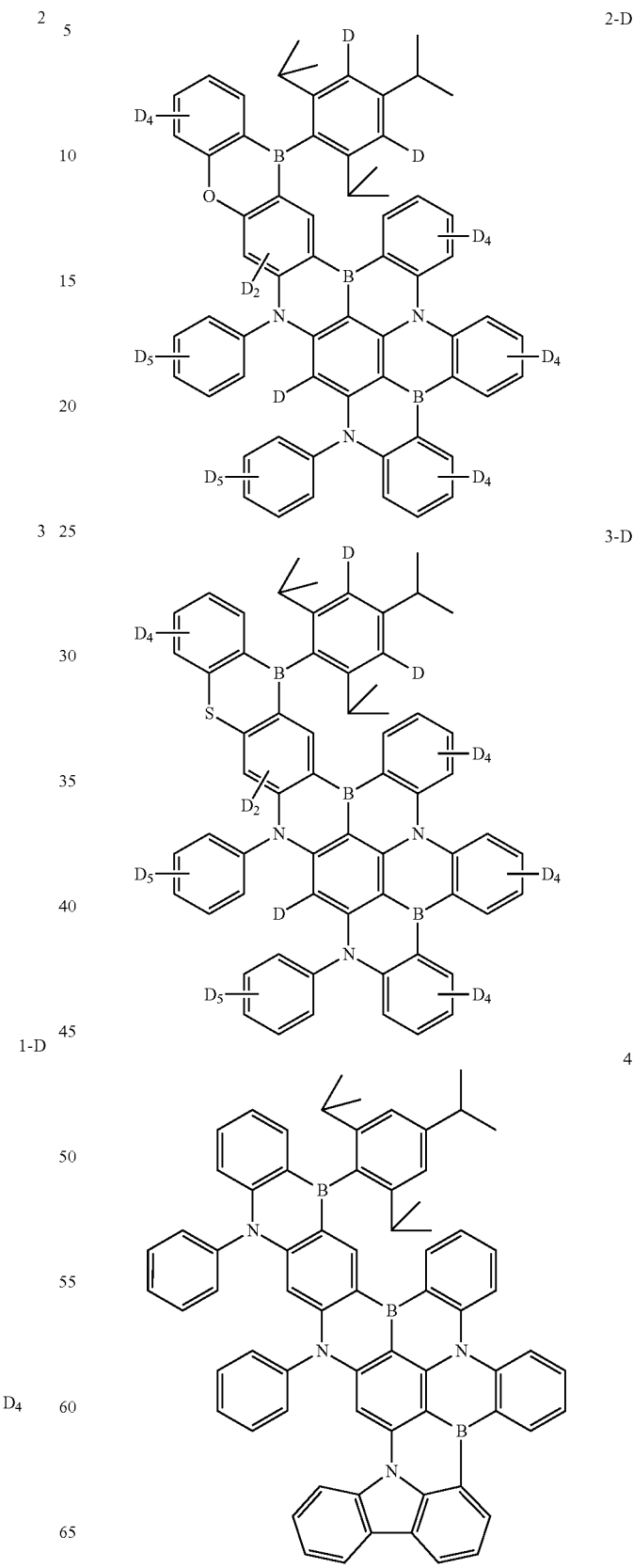

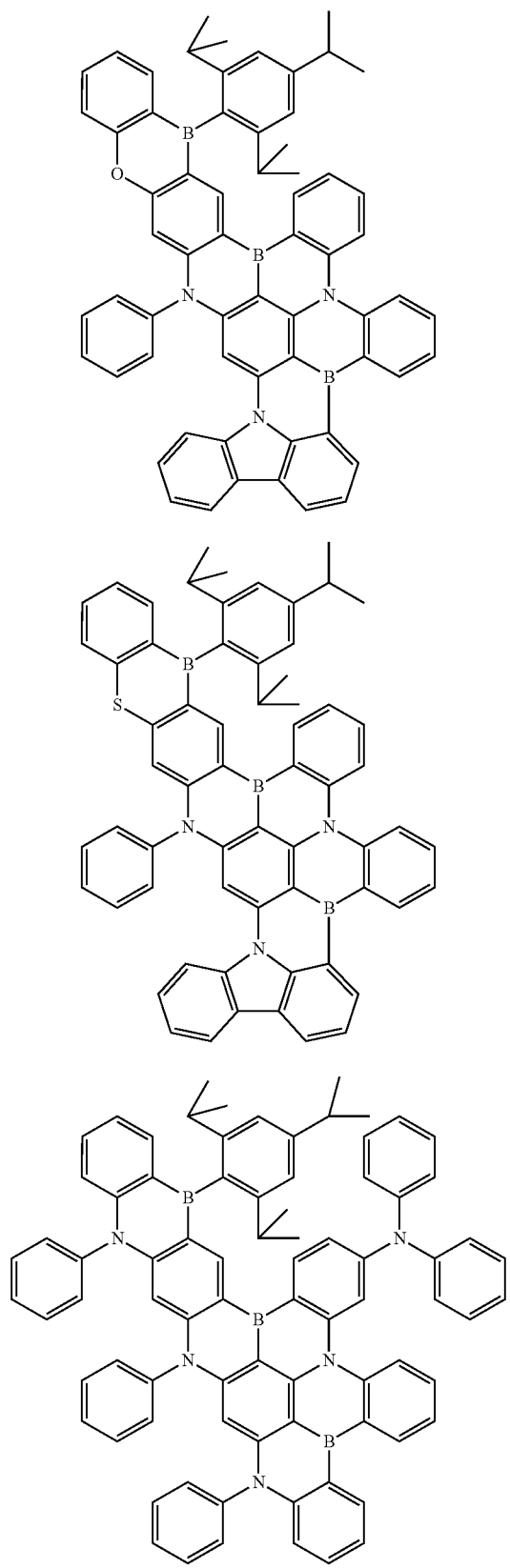
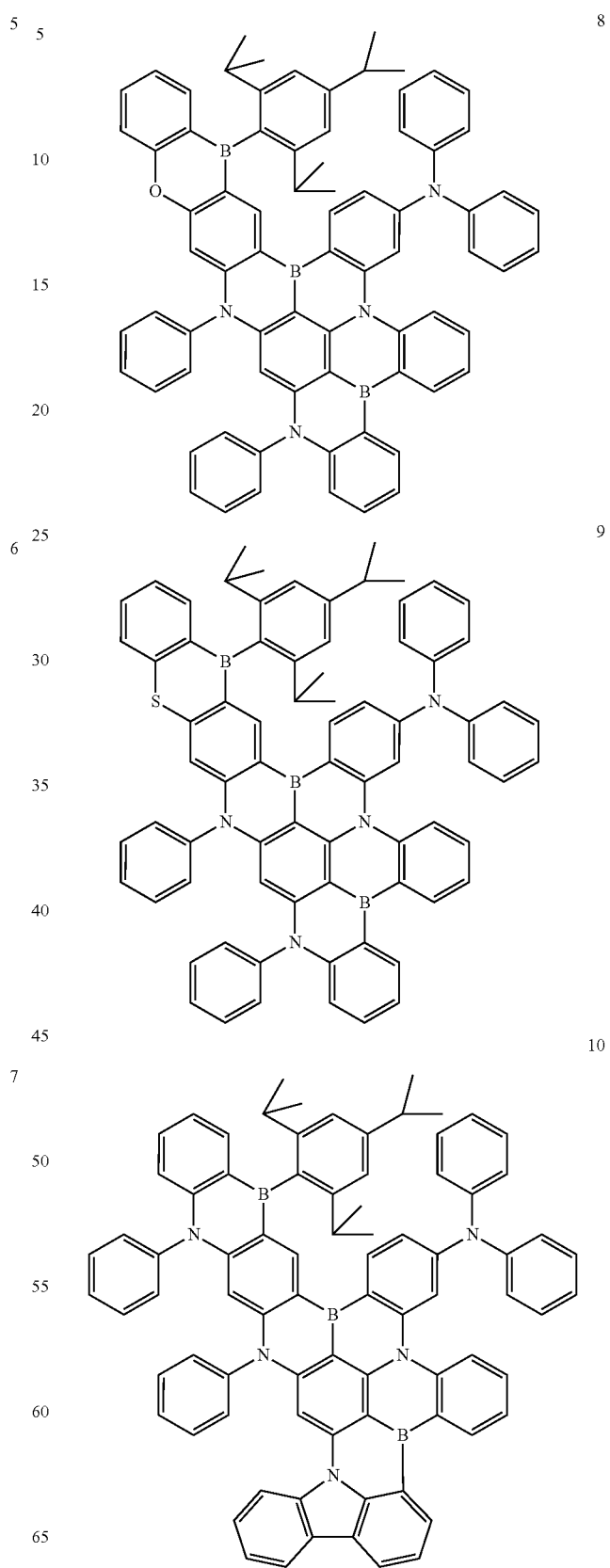

127
-continued
11
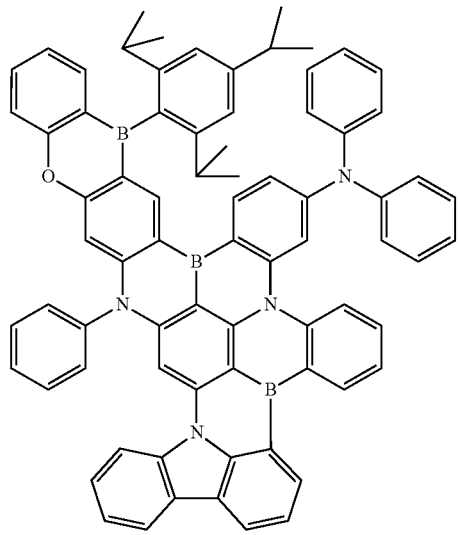
12
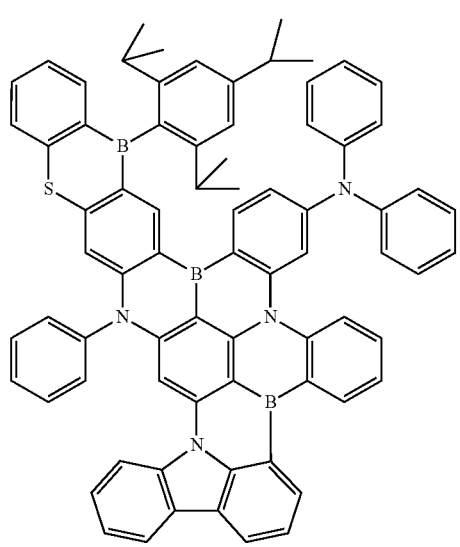
13
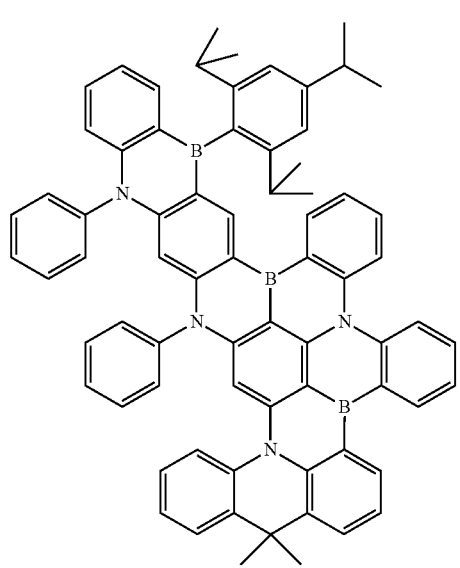
128
-continued
14
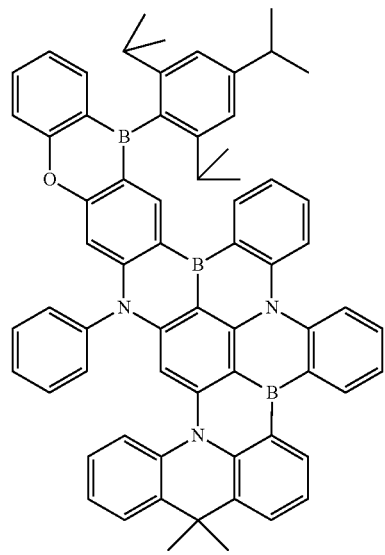
15
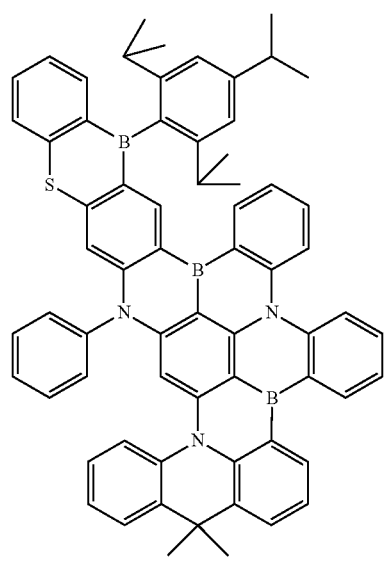
16
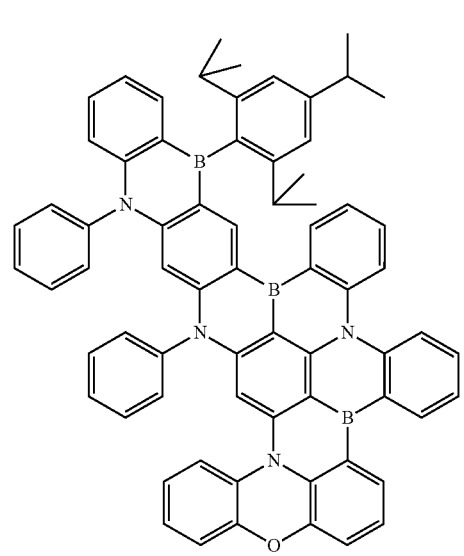

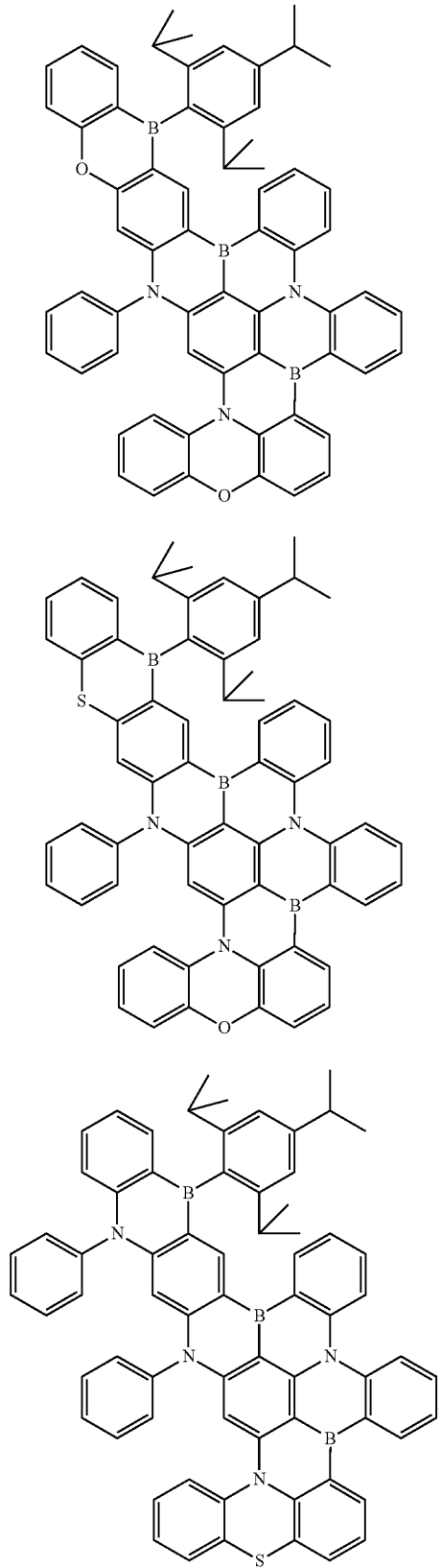
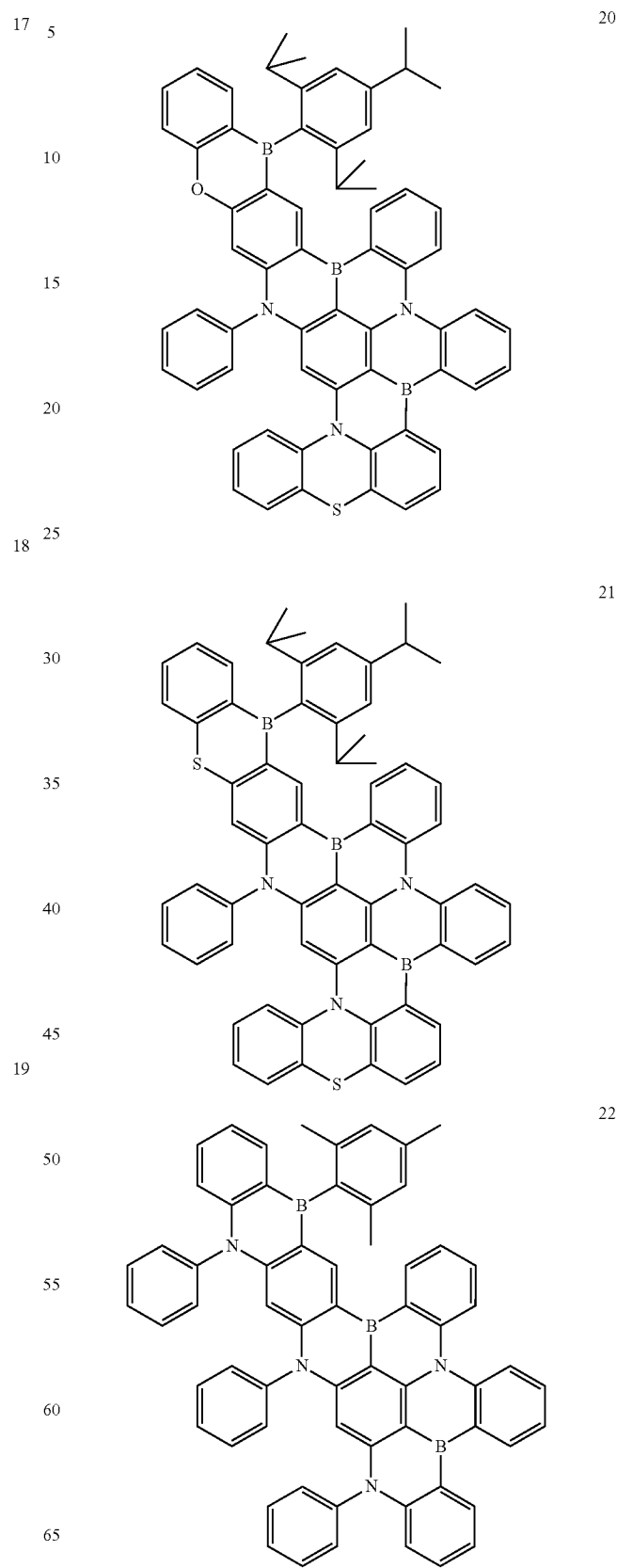

131
-continued
23
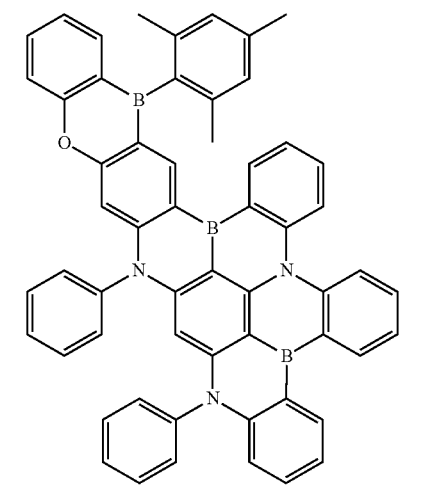
24
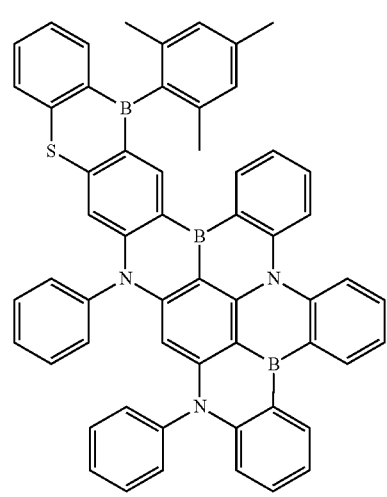
25
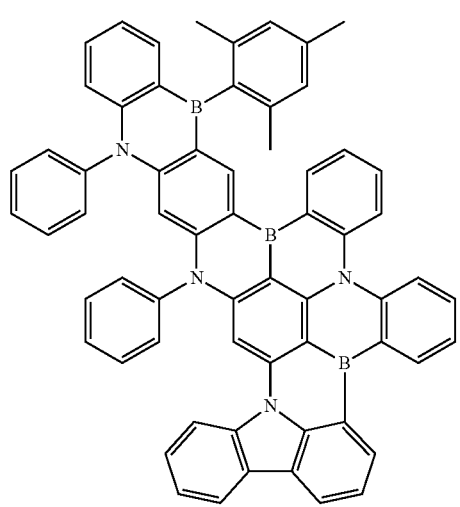
132
-continued
26
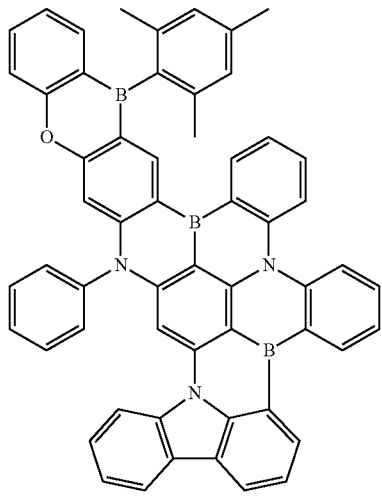
27
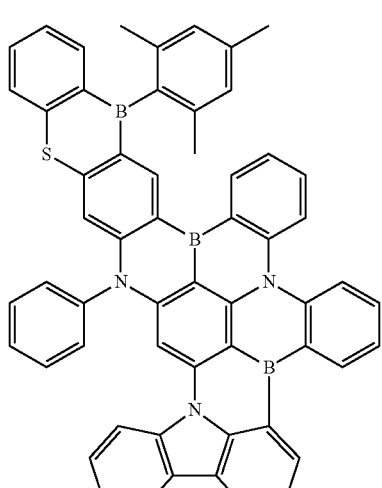
28
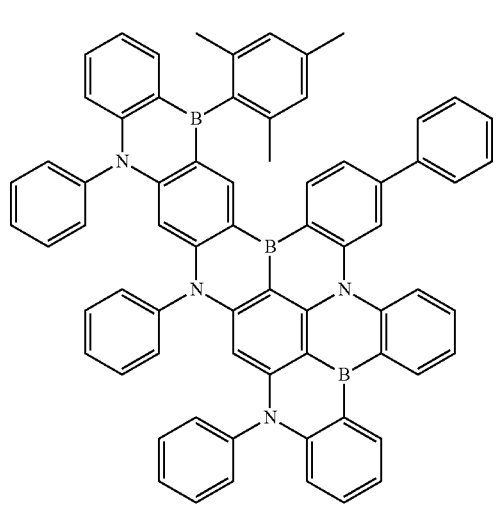

133
-continued
29
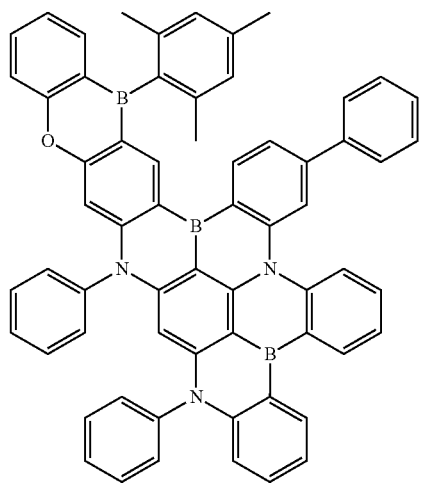
30
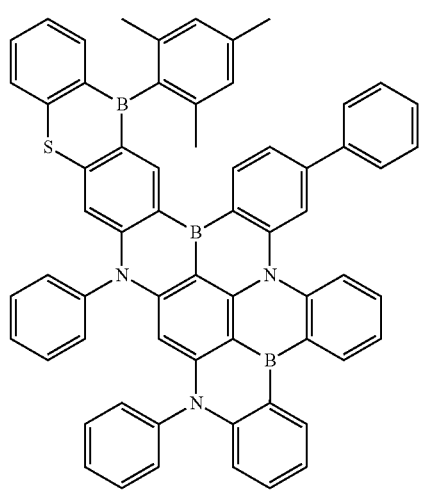
31
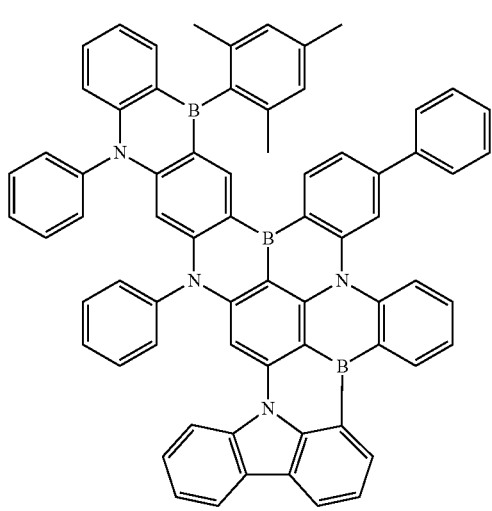
134
-continued
32
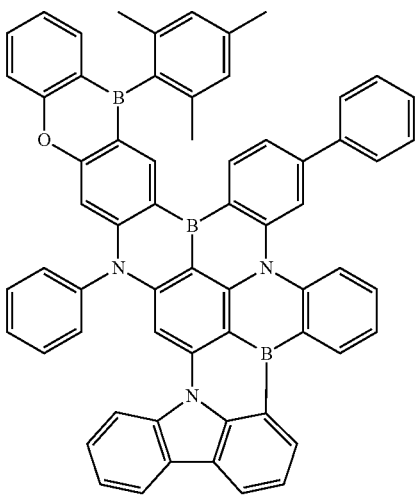
33
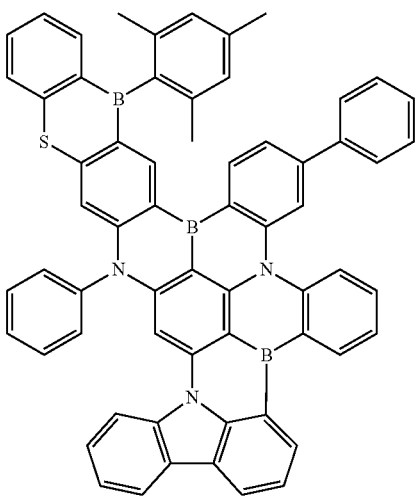
34
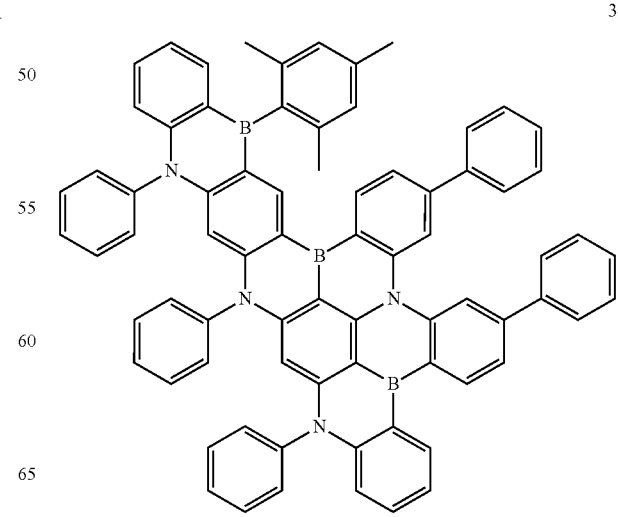

35
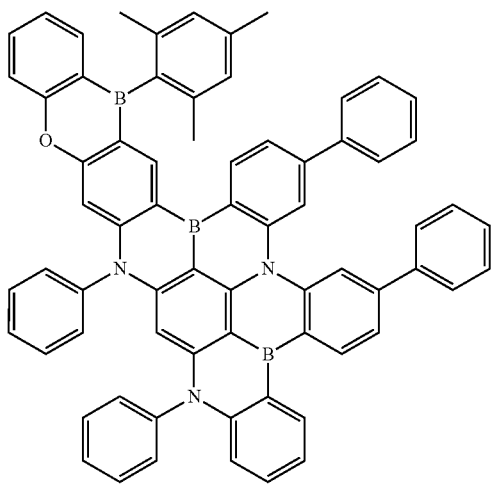
36
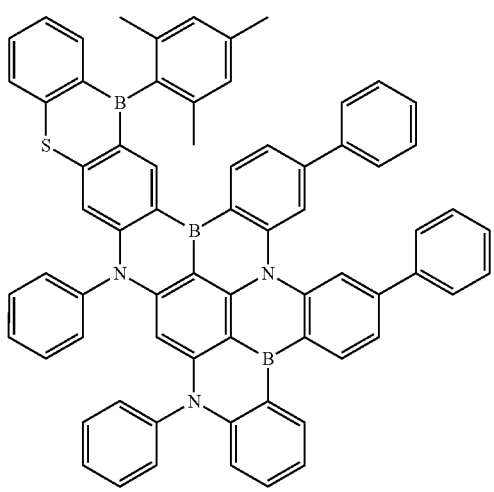
37
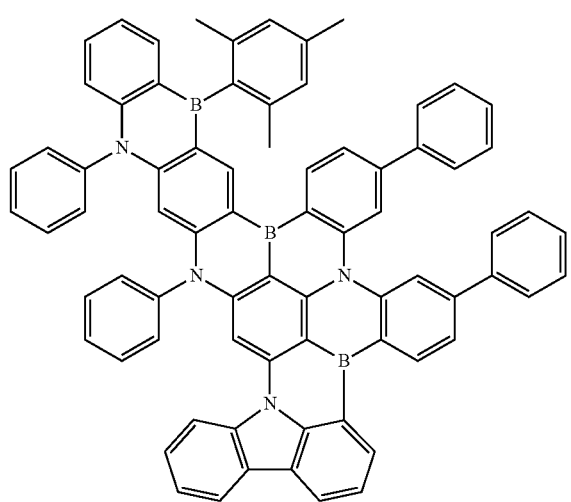
38
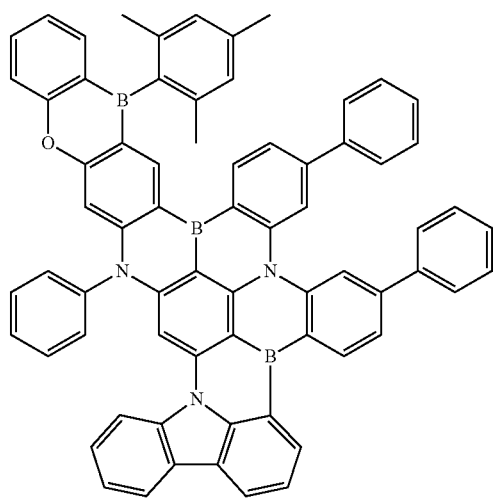
39
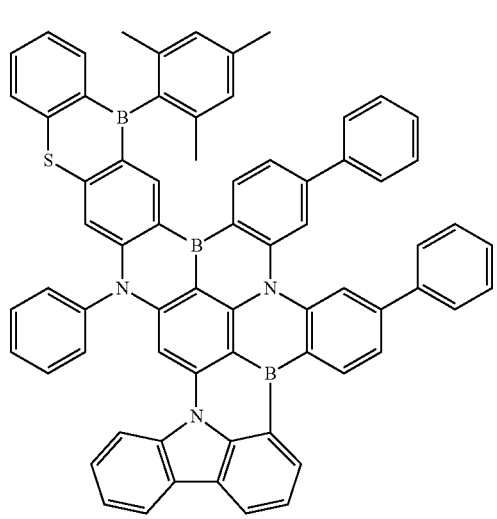
40
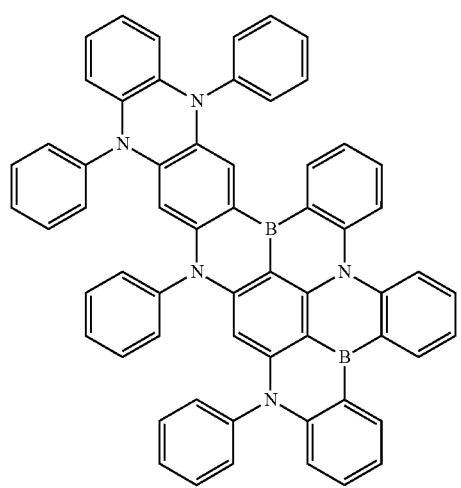

41
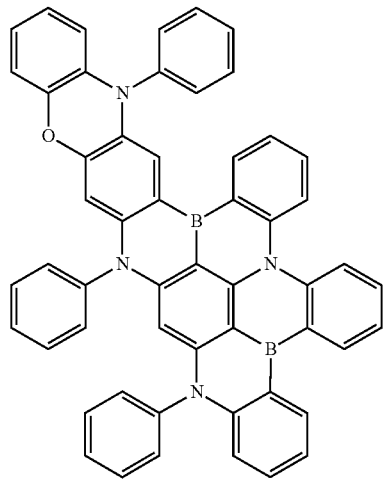
41-D
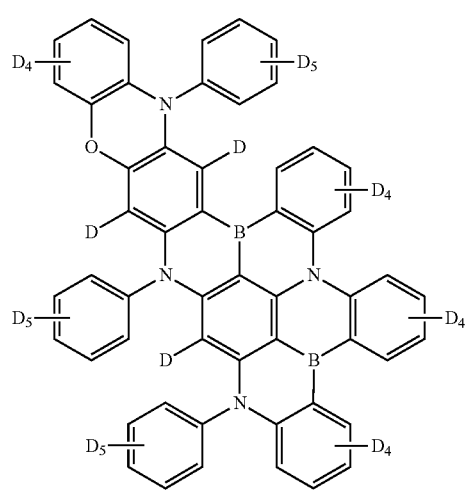
42
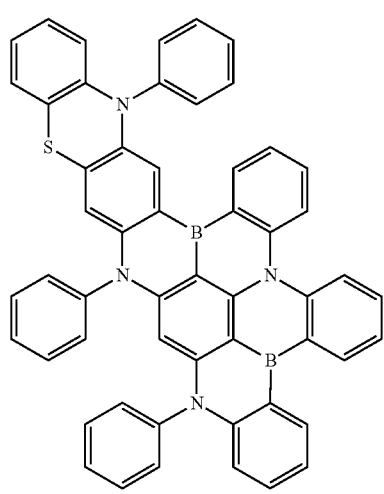
43
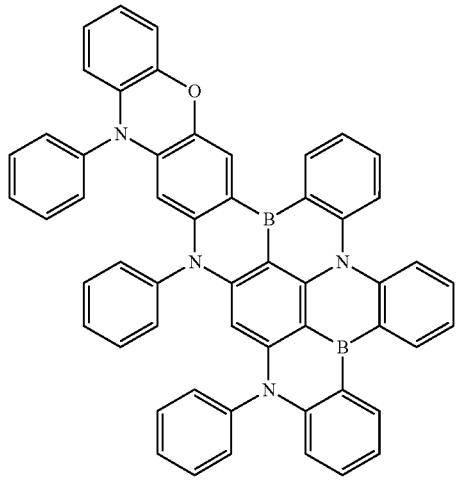
44
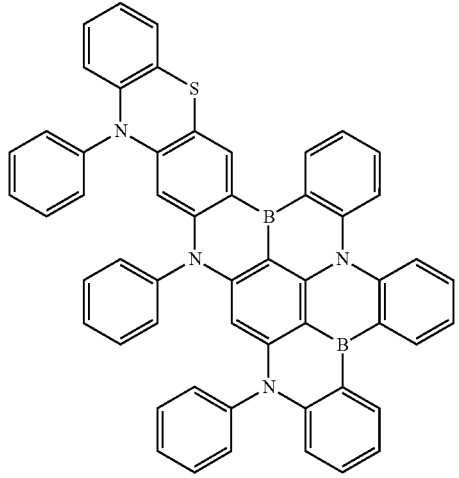
45
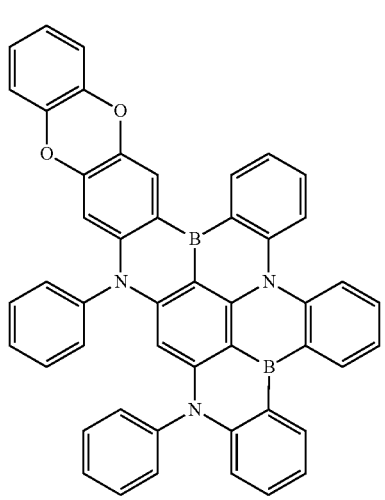

139  
-continued
46
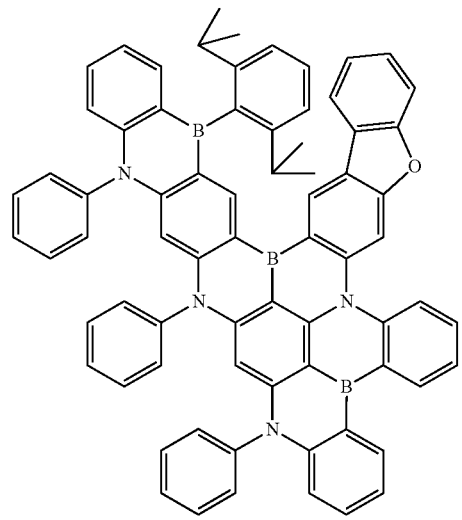
47
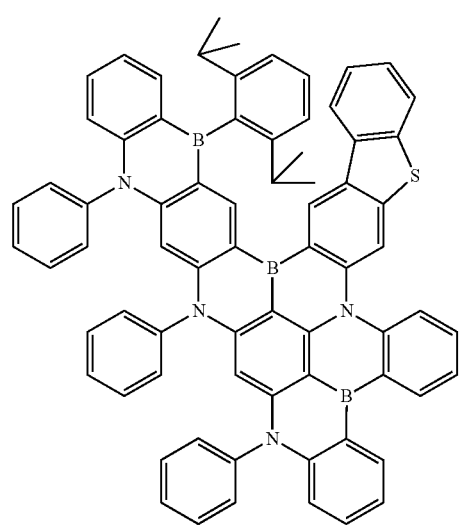
48
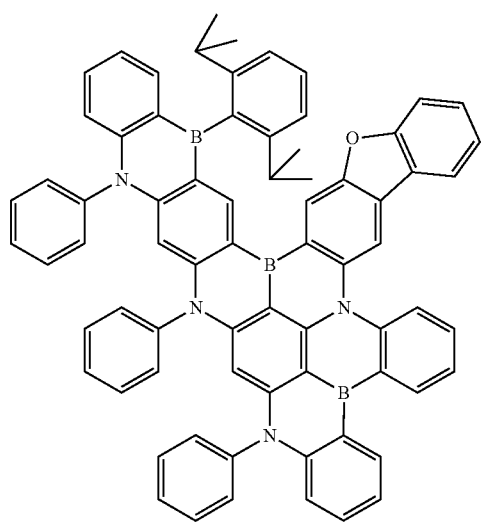
140  
-continued
49
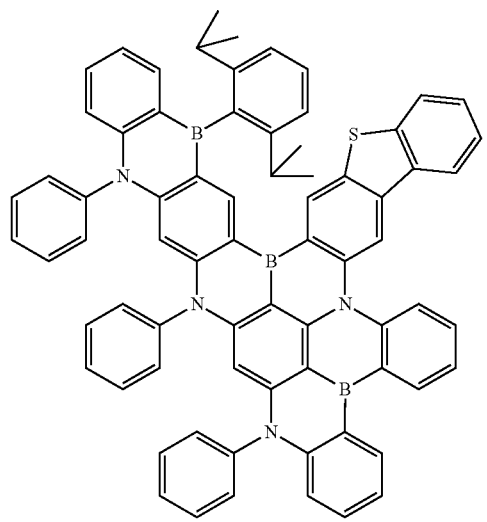
50
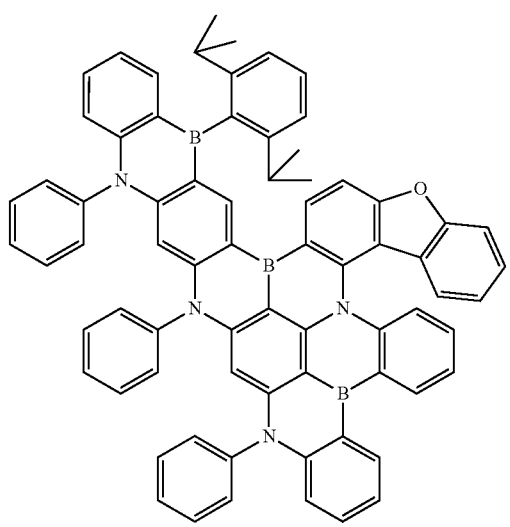
51
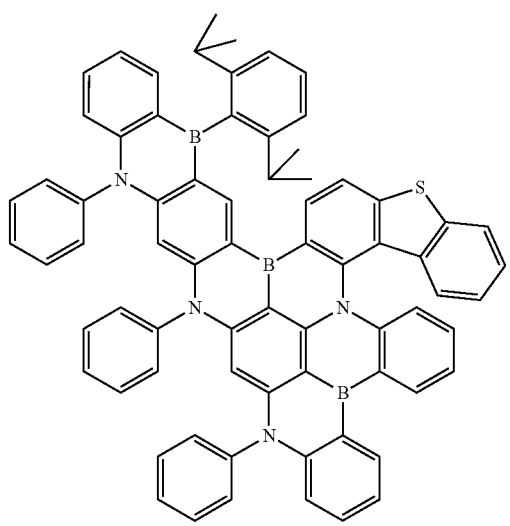

52
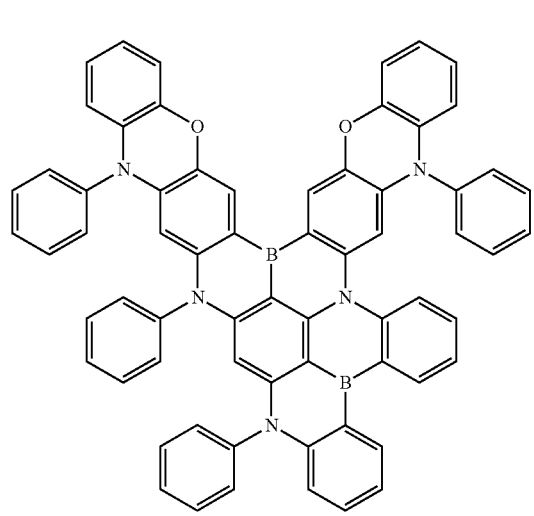
52-D
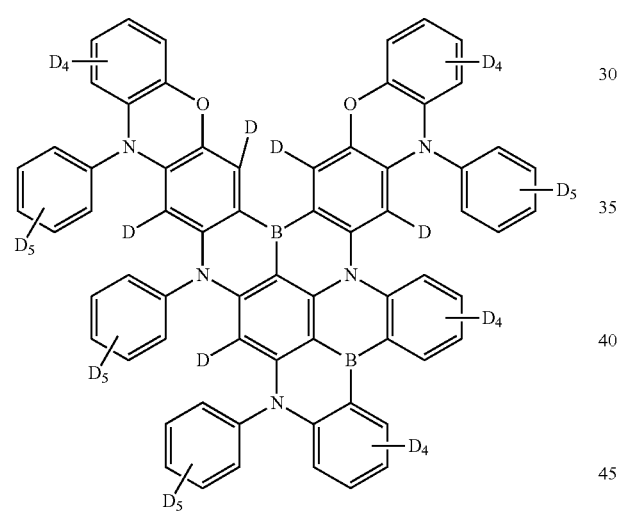
53
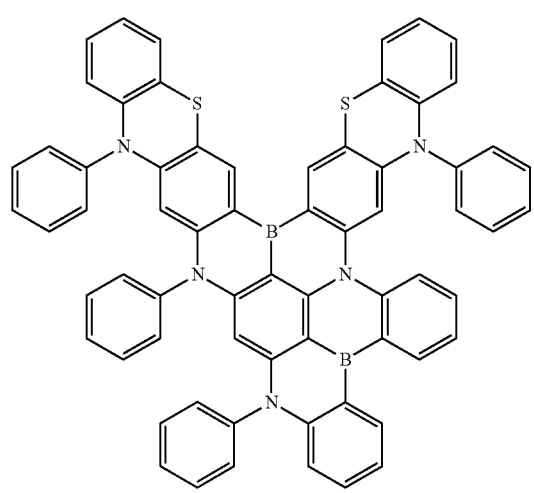
54
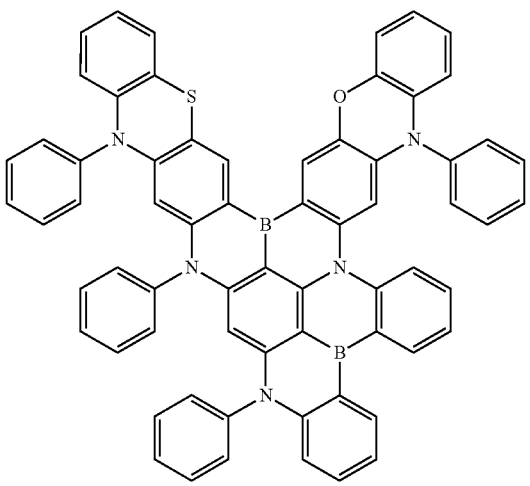
55
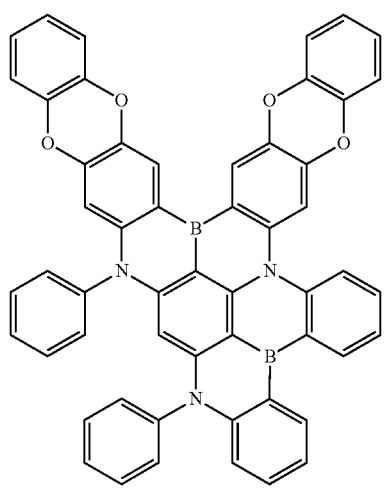
56
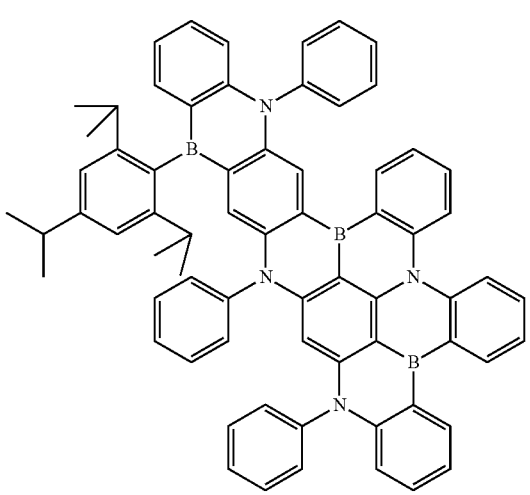

57
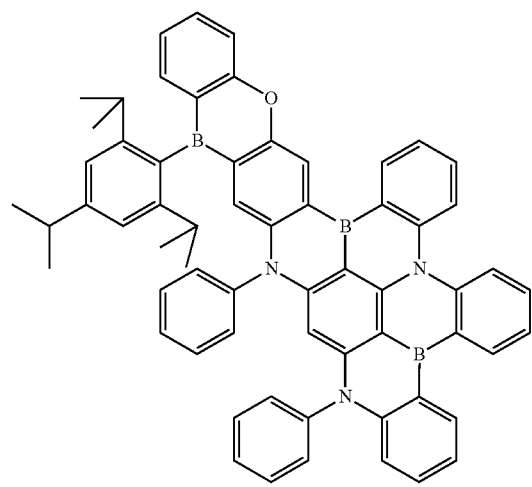
58
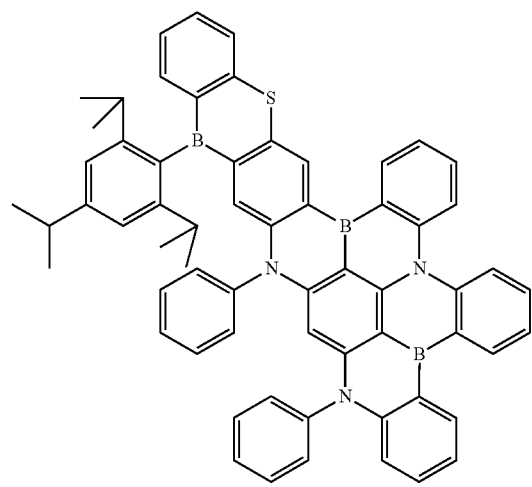
59
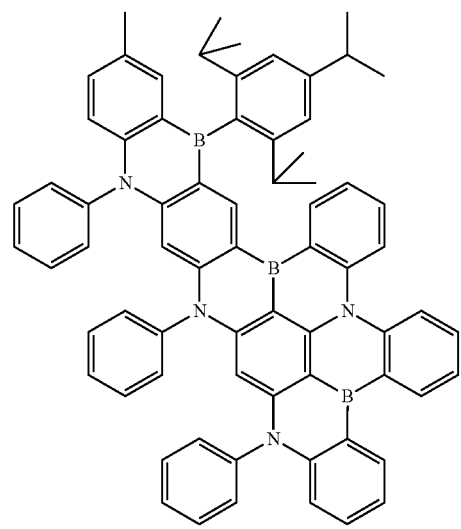
60
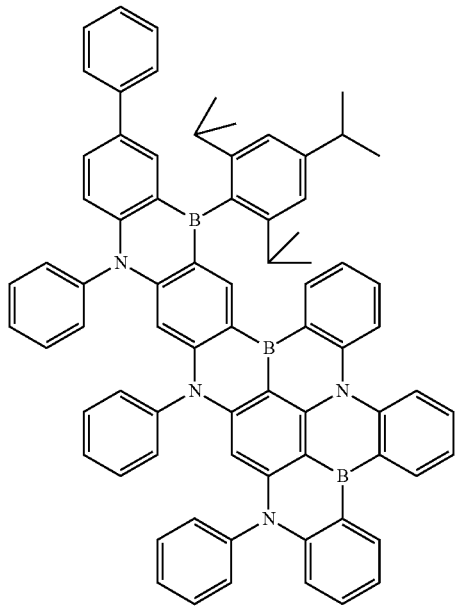
61
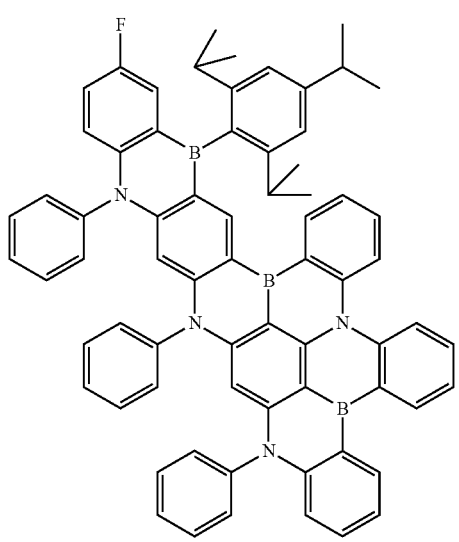
62
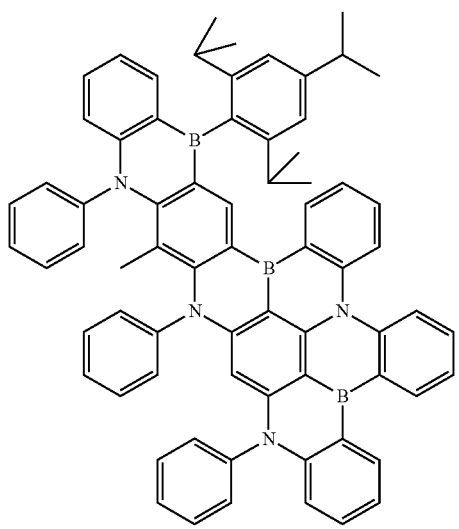

63
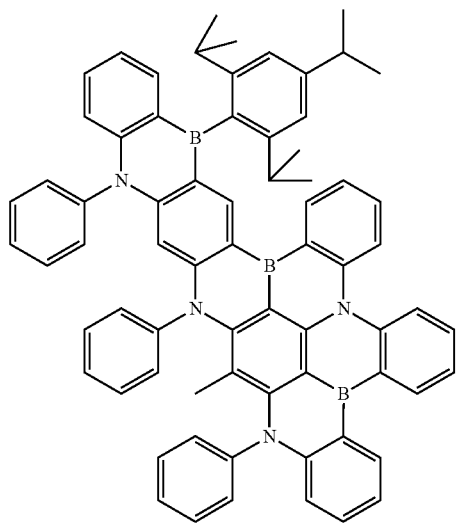
64
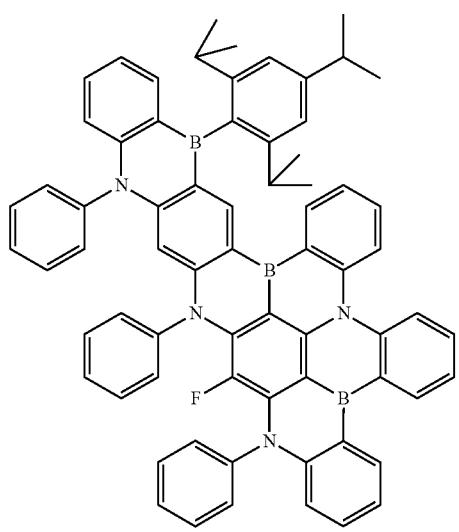
65
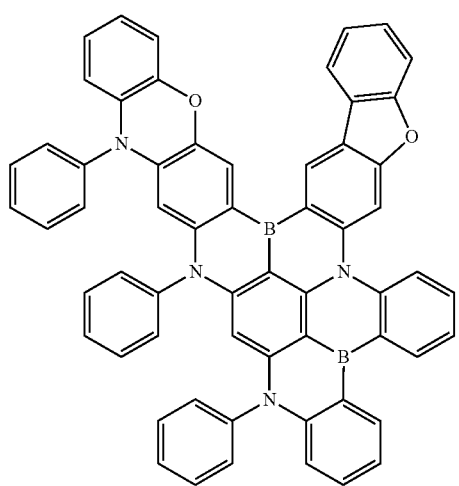
66
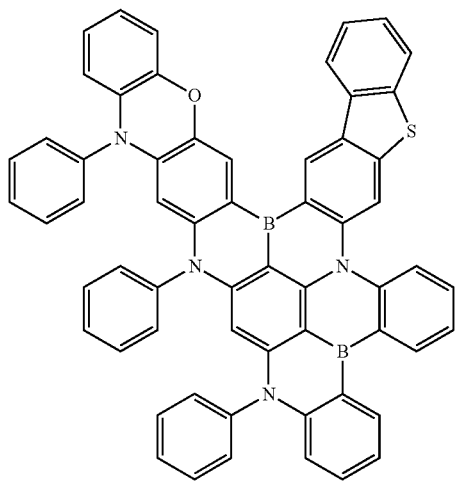
67
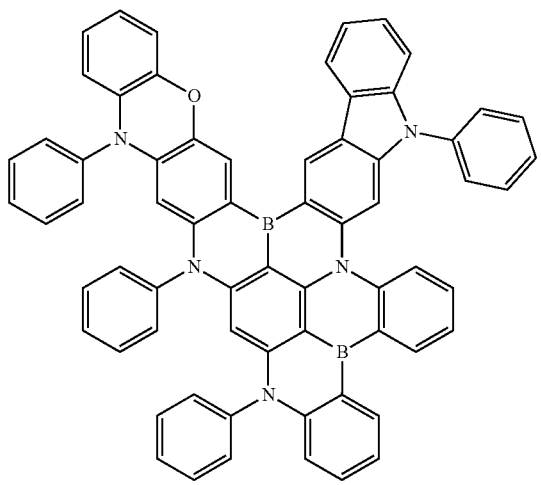
68
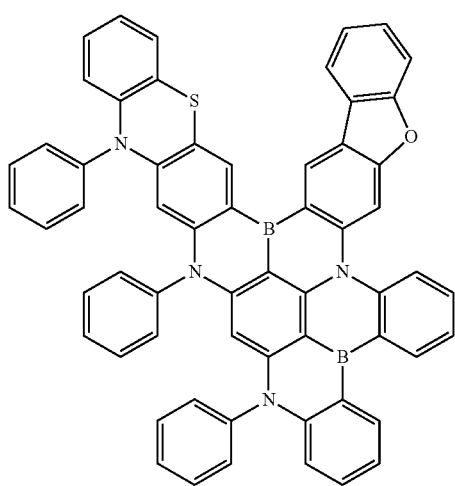

147
-continued
69
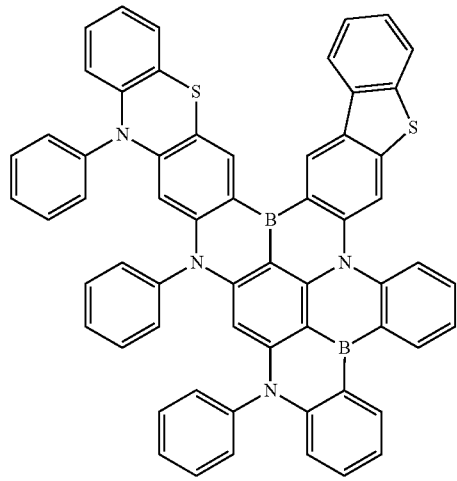
70
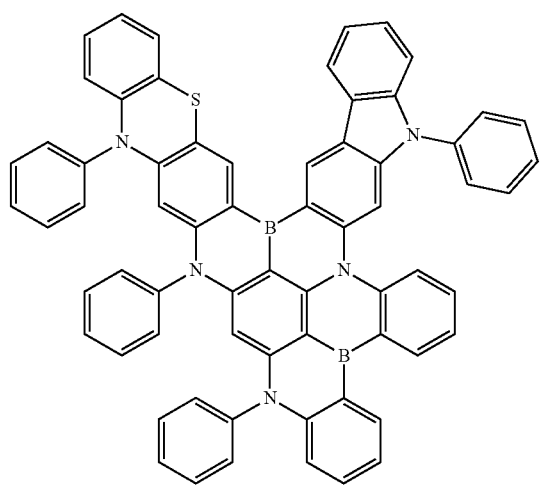
71
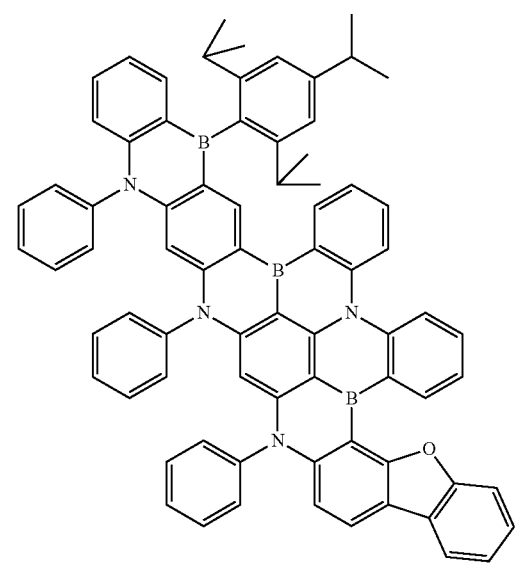
148
-continued
72
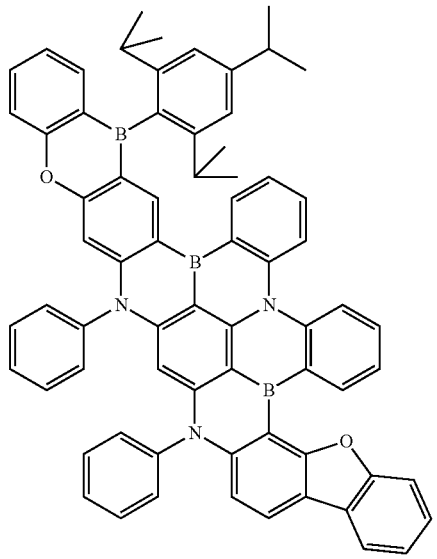
73
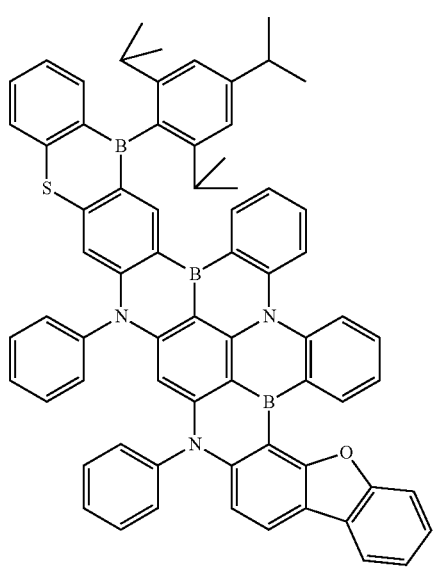
74
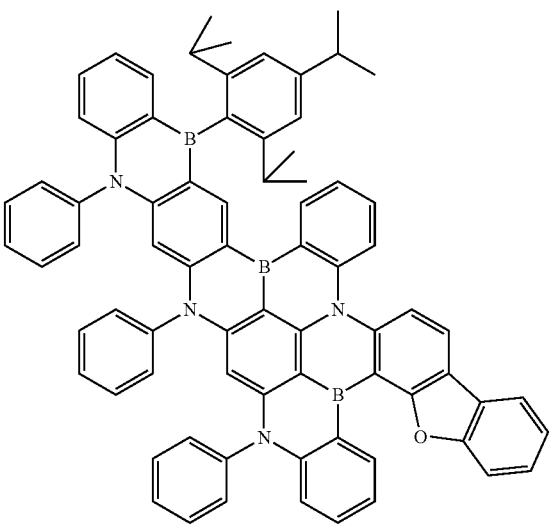

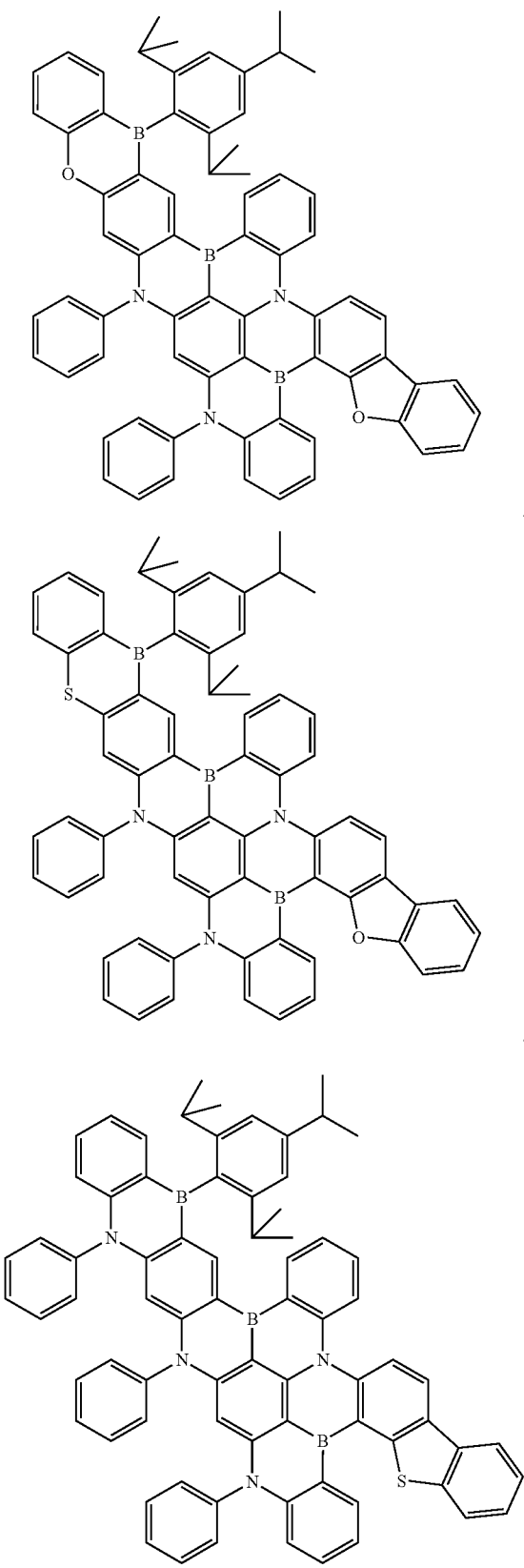
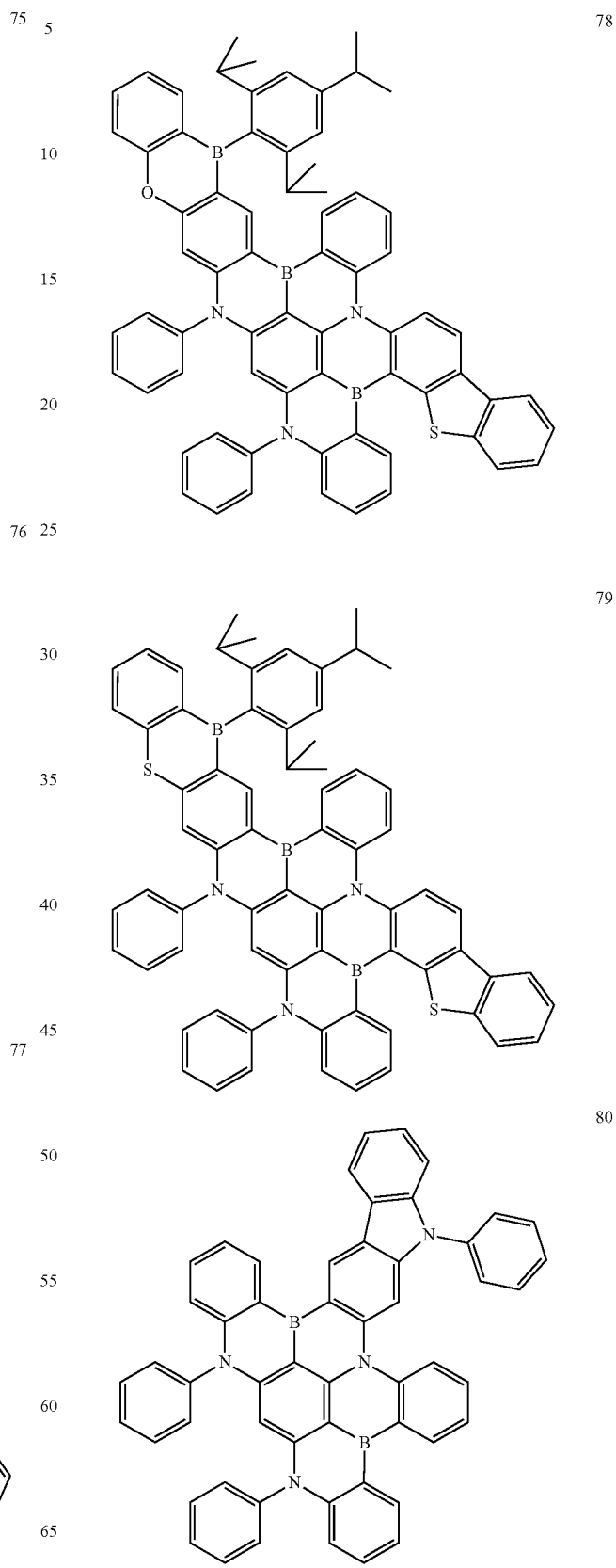

81

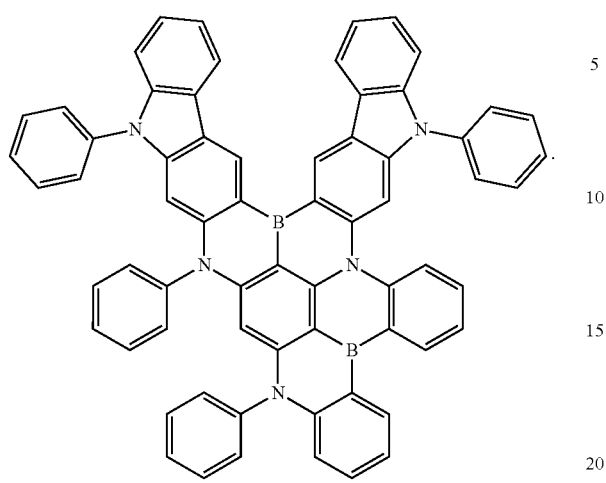

16. A condensed cyclic compound represented by Formula 1A:

Formula 1A

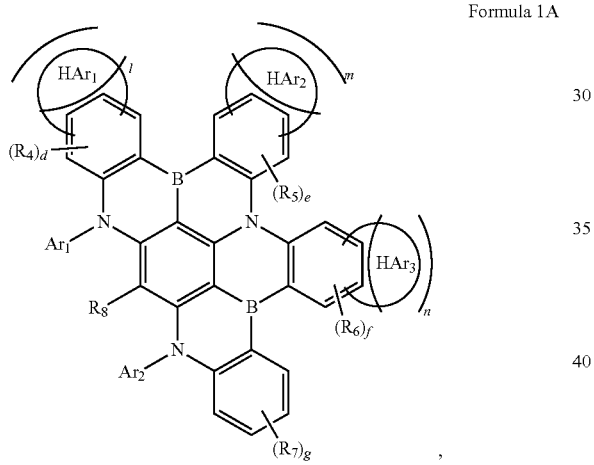

wherein in Formula 1A,

Ar₁ and Ar₂ are each independently a substituted or unsubstituted aryl group having 6 to 30 ring-forming carbon atoms, or a substituted or unsubstituted heteroaryl group having 2 to 30 ring-forming carbon atoms, l, m, and n are each independently 0 or 1, at least one of l, m, or n is 1, d to g are each independently an integer of 0 to 4, $R_1$ to $R_8$ are each independently a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and $HAr_1$ to $HAr_3$ are each independently represented by any one selected from 2-A to 2-J:

2-A
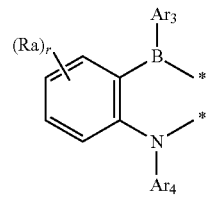

2-B
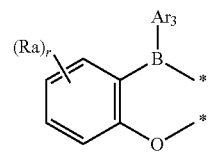

2-C
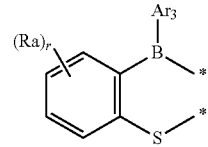

2-D
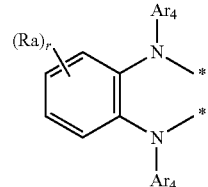

2-E
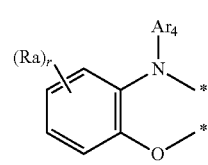

2-F
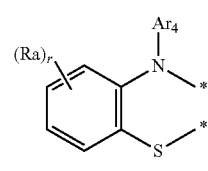

2-G
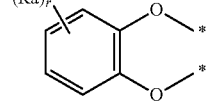

2-H
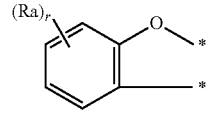

2-I
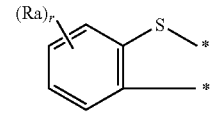

2-J
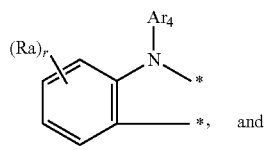

and

Ar$_3$ and Ar$_4$ are each independently a substituted or unsubstituted aryl group having 6 to 30 ring-forming carbon atoms, or a substituted or unsubstituted heteroaryl group having 2 to 30 ring-forming carbon atoms, r is an integer of 0 to 4, R$_a$ is a hydrogen atom, a deuterium atom, a halogen atom, a substituted or unsubstituted amino group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, and "—*" is a part bonded to Formula 1.

17. The condensed cyclic compound of claim 16, wherein Formula 1A is represented by any one selected from Formula 1A-1 to Formula 1A-5:

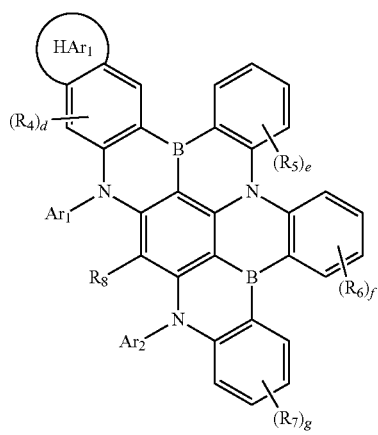

Formula 1A-1

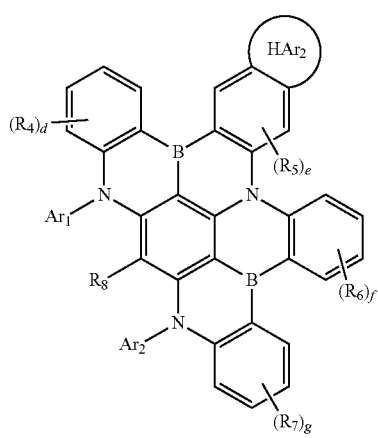

Formula 1A-2

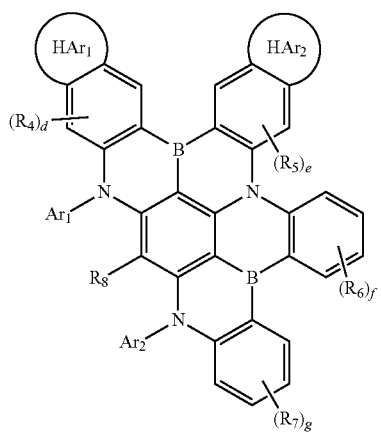

Formula 1A-3

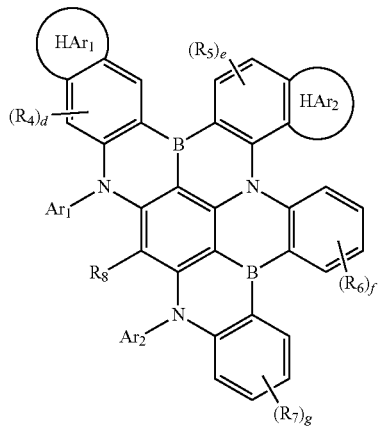

Formula 1A-4

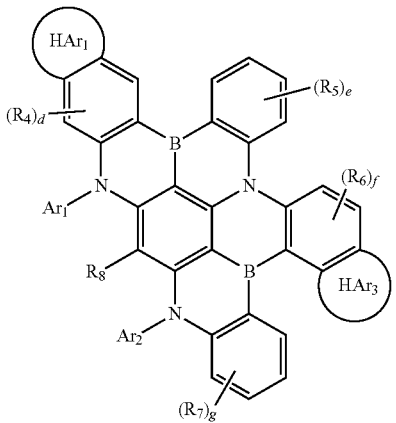

Formula 1A-5 and wherein in Formulae 1A-1 to 1A-5,
Ar$_1$, Ar$_2$, d to g, and R$_4$ to R$_8$ are each independently the same as defined in Formula 1A, and HAr$_1$ to HAr$_3$ are each independently the same as defined in 2-A to 2-J.

18. The condensed cyclic compound of claim 16, wherein Ar$_1$ to Ar$_4$ are each independently an unsubstituted phenyl group, a phenyl group substituted with a substituted or unsubstituted alkyl group having 1 to 10 carbon atoms, or a phenyl group substituted with a deuterium atom.

* * * * *